United States Patent [19]
Sakurai et al.

[11] Patent Number: 5,459,339
[45] Date of Patent: Oct. 17, 1995

[54] DOUBLE GATE SEMICONDUCTOR DEVICE AND CONTROL DEVICE THEREOF

[75] Inventors: Ken'ya Sakurai; Masahito Otsuki; Noriho Terasawa; Tadashi Miyasaka; Akira Nishiura; Masaharu Nishiura, all of Kawasaki, Japan

[73] Assignee: Fuji Electric Co., Ltd., Kanagawa, Japan

[21] Appl. No.: 53,650

[22] Filed: Apr. 29, 1993

Related U.S. Application Data

[63] Continuation-in-part of Ser. No. 14,454, Feb. 2, 1993, abandoned.

[30] Foreign Application Priority Data

| Feb. 3, 1992 | [JP] | Japan | 4-017575 |
| May 1, 1992 | [JP] | Japan | 4-112763 |
| Aug. 26, 1992 | [JP] | Japan | 4-226793 |

[51] Int. Cl.$^6$ .................... H01L 29/74; H01L 31/111
[52] U.S. Cl. .................... 257/167; 257/133; 257/147; 257/153; 257/172
[58] Field of Search .................... 257/147, 139, 257/153, 167, 172, 212, 337, 341, 130, 132, 133

[56] References Cited

U.S. PATENT DOCUMENTS

| 4,604,638 | 8/1986 | Matsuda | 257/167 |
| 4,958,211 | 9/1990 | Temple | 257/147 |
| 5,014,102 | 5/1991 | Adler | 257/147 |

FOREIGN PATENT DOCUMENTS

| 0159663 | 10/1985 | European Pat. Off. | 257/147 |
| 0463325 | 1/1992 | European Pat. Off. | 257/139 |
| 1-270352 | 10/1989 | Japan | 257/147 |
| 9212541 | 7/1992 | WIPO | 257/133 |

OTHER PUBLICATIONS

Elektronik, vol. 39, No. 18, Aug. 31, 1990, p. 52; "Leistungsstarke BIMOS–Bausteine in Sicht", R. Jacobsen with attached translation in English.

V. A. K. Temple, "MOS Controlled Thyristors (MCT's)", *IEEE International Electron Device Meeting Digest,* vol. 84, 1984, pp. 282–285.

Goodman et al, "Improved COMFETs with Fost Switching Speed and High–Current Capability", *IEEE, IEDM Technical Digest,* 4.3, 1983, pp. 79–82.

(List continued on next page.)

*Primary Examiner*—Steven H. Loke
*Attorney, Agent, or Firm*—Spencer, Frank & Schneider

[57] ABSTRACT

A semiconductor device thyristor structure includes a first conductive type collector region, second conductive type and first conductive type base regions, and a second conductive type emitter region. First conductive type regions and second conductive type regions have respective first and second type majority carriers. A first MOSFET injects the second type majority carriers into the second conductive type base region. A second MOSFET is opened and closed independent of the first MOSFET and extracts the first type majority carriers from the first conductive type base region. A third MOSFET has a first gate electrode which is also a gate electrode of the first MOSFET, for extracting the first type majority carriers from the first conductive type base region. First conductive type and second conductive type emitter regions are formed within the first conductive type base region and an emitter voltage can be simultaneously applied to these emitter regions. The first conductive type emitter region is formed within the second conductive type emitter region. A second gate electrode of the second MOSFET is formed on the surface of the first conductive type emitter region, the second conductive type emitter region and the first conductive type base region through a gate insulating film. The first gate electrode of the first and third MOSFET is formed on the surface of the first conductive type emitter region, the second conductive type emitter region, the first conductive type base region and the second conductive type base region through a gate insulating film.

13 Claims, 41 Drawing Sheets

OTHER PUBLICATIONS

B. J. Baliga, "Switching Speed Enhancement in Insulated Gate Transistors by Electron Irradiation", *IEEE, Trans. Electron Devices,* vol. Ed. 31, No. 12, (Dec. 84), pp. 1790–1795.

K. Sakurai et al, "New IGBT Modules with Improved Power Loss at High Frequency PWM Mode", *Electronica 90,* pp. 73–82.

THYRISTOR OPERATING

TRANSISTOR OPERATING

DOUBLE GATE SEMICONDUCTOR DEVICE AND CONTROL DEVICE THEREOF

CROSS-REFERENCE TO RELATED APPLICATION

The present application is a continuation in part application of U.S. application Ser. No. 08/014,454, filed Feb. 2, 1993 abandoned.

BACKGROUND OF THE INVENTION

1. Field of the Invention

The present invention relates to the structure of a semiconductor power device and a control device thereof. The semiconductor power device is selectable for thyristor operation or transistor operation as an IGBT (Insulated Gate Bipolar Transistor), specifically having two gate electrodes, and the control device makes the semiconductor power device having two gate electrodes operable by a single signal.

2. Description of the Prior Art

Recently, the quality of power semiconductor devices has been rapidly enhanced. With regard to, for instance, bipolar transistors, they have been designed so as to have high quality and to withstand high voltages and to be able to operate at a high current handling capability. Moreover, there have been proposed intelligent modules having various built-in protection functions. In addition, there have been proposed conductivity-modulation transistors (i) capable of responding at a high speed. These power semiconductor devices have been adopted in small-sized electric appliances which are miniaturized so as to be driven by a battery and to be easily carried about or used in electric motorcars, adoption of which has been investigated from the viewpoint of environmental protection, and a partial contribution to electric power-saving. In order to cope with the recent increasingly high demand for electric power, there has been a requirement for the development of power semiconductor devices which allow a further saving of electric power and a reduction of power loss.

For instance, there have been developed MCT's (MOS controlled thyristor) for reducing the ON-state voltage through the use of a thyristor structure, for imparting fast operability to devices and for reducing the electric power required for driving these devices. Such an MCT is a device having a structure and an equivalent circuit as shown in FIGS. 1 and 2, respectively, and is detailed in the article of V.A.K. Temple entitled "MOS controlled thyristors" (IEEE International Electron Device Meeting Digest, 1984). MCT 160 comprises an ON-FET 162a and an OFF-FET 162b controlled by a single gate electrode 161 and when an electric current is passed through ON-FET 162a and OFF-FET 162b is simultaneously shut-off, an npnp thyristor is in the turn-on state, which comprises an $n^+$ -cathode layer 164 provided thereon with a cathode electrode 163, a $p^-$ -base layer 165, an n-base layer 166 and a $p^+$ -anode layer 167 provided thereon with an anode electrode 168. On the other hand, when an electric current is passed through OFF-FET 162b and ON-FET 162a is simultaneously shut-off, n- base layer 166 and anode electrode 168 are short-circuited, a pnp transistor 169 is in the OFF state and hence this device is in the turn-OFF state. This pnp transistor 169 comprises p- -base layer 165, n-base layer 166 and $p^+$ -anode layer 167. Since MCT 160 puts the device in the ON state through the action of a MOS in such a manner, the response speed thereof is very high. Further, it also puts the thyristor in the ON state and, therefore, the ON state voltage drop of the device is very low, on the order of about 1 V. However, as shown in FIG. 3, the carrier densities of holes and electrons present within anode layer 167 and base layers 165 and 166 are high in the thyristor state. For this reason, the turn-off time of this device is quite long, on the order of 2 to 3μ sec due to such very high carrier densities, and thus the loss during this time becomes a problem. In particular, this results in a substantial increase in electric power loss when the device is used in high frequency applications.

In an IGBT (Insulated Gate Bipolar Transistor) as shown in FIG. 4, on the other hand, the collector current during the turn-off state has a typical wave form as shown in FIG. 5. As seen from FIG. 5, the wave form during the turnoff state comprises a first phase 191 and a second phase 192. First phase 191 corresponds to a phenomenon where a channel formed by the action of a gate 187 disappears, the supply of electron current from an emitter electrode 188 to an n- -base layer 182 is interrupted and correspondingly, the current is rapidly reduced instantaneously in proportion thereto. Second phase 192 corresponds to a phenomenon where the carriers remaining in $n^-$ -base layer 182 migrate through the action of a pnp transistor comprising a $p^+$ -collector layer 181, $n^-$ -base layer 182 and a p-base layer 183 and are reduced due to disappearance of the carriers through recombination within the life time τ thereof. Reduction of the turn-off time of the IGBT, therefore, can be accomplished by reducing the injection level of hole current, or by shortening the carrier life time τ. For this reason, there has been proposed a technique in which an $n^+$ -layer is formed between $p^+$ -collector layer 181 and $n^-$ -base layer 182 to control the injection level of the hole current (see IEEE, IEDM Technical Digest, 4.3 (1983), pp.79–82) and a technique in which the impurity doping concentration of collector layer 181 is controlled. In addition, as a method for shortening the carrier life time τ, there have been proposed techniques which make use of a life time control process such as irradiation with an electron beam or heavy metal diffusion (see IEEE, Trans. Electron Devices, ED-31 (1984), pp. 1790–1795). These techniques make it possible to reduce the fall time during the turn-off state to approximately 200 nsec and to thus obtain a device capable of being operated even at a high frequency. Incidentally, techniques concerning this IGBT are detailed in an article by the inventors of this invention ("New IGBT Modules with Improved Power Loss at High Frequency PWM Model", Electronics, '90 Munchen).

As has been discussed above in detail, an IGBT has an advantage in that it has a short turn-off time, but is a device which has a high ON-state voltage drop in the order of about 2 V and in which it is difficult to reduce the ON-state loss. This is because the density of p-base layer 183 cannot be sufficiently increased to prevent the occurrence of a latch-up state due to operation of a parasitic thyristor. In an IGBT, the emitter current $I_E$ is equal to $I_h+I_{MOS}$ as shown in FIG. 4 and if the gain of the pnp transistor comprising p-base region 183, an $n^-$ -drift region 182 and $p^+$ -collector region 181 is assumed to be ($\alpha_{PNP}$, the following relation can be obtained:

$$I_h=(\alpha_{PNP}/(1-\alpha_{PNP}))\times I_{MOS}$$

Therefore, the following equation can be obtained:

$$I_E(1/(1-\alpha_{PNP}))\times I_{MOS}$$

$I_h$ (hole current) and hence the current of the IGBT vary depending on the value of $\alpha_{PNP}$. In the foregoing relations, Imos means an electron current.

One of the most important key technologies for solving the problem of improvement of quality, miniaturization and cost-saving in the field of power electronics, is to reduce the power loss of power devices. This requires the development of a power device having a short turn-off time and simultaneously having a low ON-state voltage drop. However, if the same means used in an IGBT, i.e., the reduction of carrier life time and formation of an $n^+$-buffer layer, are adopted to reduce the turn-off time in, for instance, the MCT discussed above, the ON state voltage drop increases as in the case of an IGBT. For this reason, it is not possible to make use of the advantage of an MCT, i.e., a low ON-state voltage drop. Moreover, it is necessary to instantaneously extract the carriers accumulated in an MCT in order to reduce the turn-off time. However this requires the formation of an additional MOS gate for extracting the current, and the driving power must be increased to extract the carriers. Further, an instantaneous extraction of a large current requires the use of a MOS gate having a low ON-state resistance. It is presently possible to make the most use of the properties of each device such as low ON-state voltage drop or short turn-off time separately, but the development of a device having these properties in combination is very difficult.

Accordingly, in light of the foregoing problems, an object of the present invention is to provide a new power device which makes the most use of the characteristic peculiar to an MCT, i.e., a low ON-state voltage drop, and the characteristic peculiar to an IGBT, i.e, a short turn-off time.

A problem with the double gate semiconductor device when used in inverters or the like is that the control terminals have to be individually driven. That is, whereas a prior art power device has only a single control terminal connecting the gate electrode, and the power device can be controlled only by supplying a signal to drive the control terminal, in the double gate semiconductor device, two signals meeting the two control terminals connecting to the two gate electrodes have to be prepared. Furthermore, unless the two control signals are appropriately controlled, since the device does not positively transfer from the thyristor condition to the transistor condition, nor can it be turned off, for inverters and the like, this tends to cause generation of an arm short-circuit.

Furthermore, since the double gate semiconductor device cannot be turned off unless it is transferred from the thyristor condition to the transistor condition, even when trouble occurs at the initial state where the device becomes conductive, it is necessary to first transfer the device to the thyristor condition, and there is the possibility of the occurrence of unrestorable damage during the transition. Furthermore, since, even if trouble occurs during operation, immediate shut-down is difficult, it is necessary to find the trouble during operation as early as possible and take measures to transfer to the transistor condition.

Therefore, it is another object of the present invention to provide a control device applied to a double gate semiconductor device having advantageous characteristics such as high speed and reduced power, which is possible to be handled as conventional power devices and protect the double gate semiconductor device from troubles such as an abnormal current and the like.

SUMMARY OF THE INVENTION

To accomplish the foregoing first object, the inventors of this invention have developed a new device which serves as a thyristor during an ON state like an MCT and as a transistor during an OFF state like an IGBT. Thus, according to the present invention, there is provided a semiconductor device having a thyristor structure which comprises a first conductive type collector region, a second conductive type base region, a first conductive type base region and a second conductive type emitter region, and comprising; a first MISFET which can inject majority carriers into the second conductive type base region; and a second MISFET which can be opened and closed independent of the first MISFET and capable of extracting majority carriers from the first conductive type base region.

This semiconductor device may be provided with, in addition to the second MISFET, a third MISFET having a gate electrode common to the first MISFET and capable of extracting majority carriers from the first conductive type base region. In an integrated structure for semiconductor which can realize such an equivalent circuit structure, a first conductive type emitter region is formed within the first conductive type base region in addition to the foregoing second conductive type emitter region, in switch an emitter voltage is simultaneously applied to the first and second conductive type emitter regions. More specifically, the first conductive type emitter region is formed within the second conductive type emitter region. A second gate electrode of the second MISFET is formed on the surface of the first conductive type emitter region, the second conductive type emitter region and the first conductive type base region through a gate insulating film in which the second conductive type emitter region serves as a channel region. Moreover, the first chat electrode common to the first and third MISFET's is formed on the surface of the first conductive type emitter region, the second conductive type emitter region, the first conductive type base region and the second conductive type base region through a gate insulating film in which the first conductive type base region serves as a channel region for the first MISFET and the second conductive type emitter region serves as a channel region for the third MISFET In such case, it is preferred that the first conductive type base region be doped at a dose of not less than $2\times10^{13}$ $CM^{-2}$ and not more than $1\times10^{14}$ $CM^{-2}$ and that the second conductive type emitter region be doped at a dose of equal to or more than that for the first conductive type base region and not more than $1\times10^{14}$ $CM^{-2}$.

Moreover, the first conductive type base region may comprise a first conductive type well having a high dose and a first conductive type peripheral portion shallower than the depth of the well. In this case, if the first conductive type well of high dose is formed by surface-diffusion, the dose of the well is preferably not less than $1\times10^{13}$ $CM^{-2}$ and not more than $5\times10^{15}$ $CM^{-2}$. Alternatively, if the first conductive type well of high dose is formed as a buried layer, the dose thereof is preferably not less than $1\times10^{12}$ $CM^{-2}$ and not more than $3\times10^{14}$ $CM^{-2}$. Moreover, if the first conductive type well of high dose is formed as a buried layer, the edge of a diffusion window of the first conductive type well of a high dose is positioned within a region near the inner edge of the first conductive type emitter region and on the side of the second electrode of the second MISFET.

The second conductive type emitter region may likewise comprise a second conductive type well having a high dose and a second conductive type peripheral portion shallower than the well. In this case, the surface concentration of the second conductive type well having a high dose is preferably not less than $5\times10^{17}$ $CM^{-3}$ and not more than $5\times10^{20}$ $CM^{-3}$. In addition, the diffusion depth of the second conductive type well of high dose is preferably not less than the diffusion depth of the second conductive type peripheral portion and not more than 1.9 µm. Moreover, it is preferred that the length of the first gate electrode be not less than 20 μm and not more than 30 μm, that the length of the second gate be not less than 1 μm and not more than 8 μm and that the contact length of an emitter electrode which conductively comes in contact with the first conductive type emitter region and the second conductive type emitter region be not less than 1 μm and not more than 6 μm.

Moreover, a shallow second conductive type counter-doping region may be formed on the surface of the first conductive type base region concerning the first MISFET. Further, a first conductive type doping region of a high dose may be formed on the surface of the foregoing first conductive type base region concerning the second MISFET.

In the foregoing semiconductor device, majority carriers in the second conductive type emitter region are injected into the second conductive type base region when the first MISFET is put in operation and, in response thereto, minority carriers in the first conductive type collector region are injected into the second conductive type base region. Therefore, the transistor comprising the first conductive type collector region, the second conductive type base region and the first conductive type base region is in ON state. Thus, majority carriers are injected into the first conductive type base region and simultaneously, the transistor comprising the second conductive type base region, the first conductive type base region and the second conductive type emitter region is in the ON state. The thyristor comprising the first conductive type collector region, the second conductive type base region, the first conductive type base region and the second conductive type emitter region is accordingly in the ON state. Consequently, the ON-state voltage drop can be reduced.

On the other hand, if the second MISFET for mode-switching is put in operation while the first MISFET is in the ON state, majority carriers in the first conductive type base region flow out of the first conductive type emitter region through the second MISFET and as a result, the transistor comprising the second conductive type base region, the first conductive type base region and the second conductive type emitter region is in the OFF state. For this reason, the device is transferred to a transistor state like IGBT through the thyristor state and this results in a decrease of the carrier density in the device. This allows the reduction of the turn-off time observed when the first MISFET is thereafter in the OFF state and this semiconductor device is in the OFF state.

In this respect, if the device comprises a third MISFET, the device is enhanced in the effect of extracting excess carriers from the first conductive type emitter region when the second MISFET is put in operation.

If the first gate electrode of the first MISFET is formed in such a manner that it covers the first emitter layer formed within the second conductive type emitter region and that it extends over the second conductive type emitter region, the first conductive type base region and the second conductive type base region, majority carriers present in the second conductive type emitter region can be injected into the second conductive type base region during the ON state, while minority carriers are extracted from the first conductive type base region and injected into the first emitter layer during the OFF state to thus further reduce the turn-off time. Since the third MISFET and the first MISFET have a common gate electrode, the third MISFET is in the ON state when the first MISFET is in the OFF state. Separately, the ON-state voltage drop can be controlled to a low level and the controllable can be increased if the first controllable type base region comprises a first conductive type well of high dose and a first conductive type peripheral portion shallower than the well. Alternatively, if the second conducted type emitter region comprises a second conductive type well of high dose and a second conductive type peripheral portion shallower than the well, the ON state voltage drop can be further reduced and the controllable current can further be increased. In addition, the formation of the shallow second conductive type counter-doping region on the surface of the first conductive type base region permits the reduction of realize such an equivalent circuit structure, a first conductive type emitter region is formed within the first conductive type base region in addition to the foregoing second conductive type emitter region, in which an emitter voltage is simultaneously applied to the first and second conductive type emitter regions. More specifically, the first conductive type emitter region is formed within the second conductive type emitter region. a second gate electrode of the second MISFET is formed on the surface of the first conductive type emitter region, the second conductive type emitter region and the first conductive type base region though a gate insulating film in which the second conductive type emitter region serves as a channel region. Moreover, the first gate electrode common to the first and third MISFET's is formed on the surface of the first conductive type emitter region, the second conductive type emitter region, the first conductive type base region and the second conductive type base region through a gate insulating film in which the first conductive type base region serves as a channel for the first MISFET and the second conductive type emitter region serves as a channel region for the third MISFET. In such case, it is preferred that the first conductive type base region be doped at a dose of not less than $1 \times 10^{14}$ $CM^{-2}$ and that the second conductive type emitter region be doped at a dose of equal to or more than that for the first conductive type base region and not more than $1 \times 10^{14}$ $CM^{-2}$.

In the present invention, in order to solve the foregoing problems in a control device for controlling the double gate semiconductor device, first, delay means is used to make the double gate semiconductor device possible to be turned off by a single turn-off signal. Specifically, in accordance with the present invention, there is provided a control device for controlling the double gate semiconductor device having a second gate electrode capable of controlling the transition from a thyristor operation to a transistor operation, and a first gate electrode capable of controlling the transition from the transistor operation to an ON/OFF operation, and capable of controlling a passing current from a collector electrode to an emitter electrode, the control device comprises first gate control means for delaying a turn-off signal to the double gate semiconductor device and applying the turn-off signal to the first gate electrode.

As first gate control means, it is effective to use timer delay means for applying a delayed turn-off signal to the first electrode for a predetermined time. It is also effective to use operation determination delay means comprising an operation determination circuit unit for determining an operating voltage applied to the collector electrode and a turn-off signal application circuit unit for applying a turn-off signal to the first gate electrode according to the determination result of the operation determination circuit unit.

Furthermore, to prevent a trouble due to an abnormality at turning on the double gate semiconductor device, it is preferable to use second gate control means for applying a delayed turn-on signal to the second gate electrode. As the second gate control means, it is effective to use abnormality detection delay means comprising a current determination circuit unit capable of determining a passing current, a turn-on signal application circuit unit for applying a turn-on signal to the second gate electrode according to the determination result of the current determination circuit unit, and a turn-off signal application circuit unit for applying a turn-off signal to the first gate electrode according to the determination result of the current determination circuit unit. As the current determination circuit unit, it is also possible to use a voltage determination circuit unit capable of determining an operating voltage applied to the collector electrode to determine the current value.

To protect the double gate semiconductor device in operation, it is effective to provide passing current determination means capable of determining a passing current value and turn-off signal output means capable of outputting a turn-off signal according to the determination result of the passing current determination means.

Further, the device comprises first gate control means and second gate control means, and the second gate control means may be abnormality detection delay means having a turn-off signal application circuit unit for applying a turn-off signal to the first gate control means according to the determination result of the current determination circuit unit.

When the first gate control means is timer delay means for delaying the turn-off signal for a predetermined time and applying it to the first gate, it is desirable to connect the timer delay means in series with first and second time constant determination units, and it is effective to input a turn-off signal from the turn-off signal application circuit unit to the second time constant determination unit. The first time constant determination unit and the second time constant determination unit can be first and second resistor means constituting the timer delay means, or first and second capacitors.

It is also desirable to provide rectification means allowing current to pass only in a direction from the second gate electrode to the first gate electrode and, in this case, it is effective that the first gate electrode, the second gate electrode, and the rectification means are formed of polycrystalline silicon formed on the surface of the double gate semiconductor device. When the first gate electrode is of an $n^-$ type and the second gate electrode is of a $p^-$ type, the $n^-$ type portion of the rectification means having a pn junction may be connected to the first gate electrode, and the p-type portion may be connected to the second gate electrode. Also, it is effective to connect the n-type portion of the rectification means to the first gate electrode by aluminum deposition wiring, and the $p^-$ type portion to the second gate electrode by aluminum deposition wiring.

In the control device of the above arrangement, when a turn-off signal to the double gate semiconductor device is delayed by the first gate control means capable delaying a turn-off signal and applied to the first gate electrode, after the double gate semiconductor device is transferred to the transistor condition by a turn-off signal applied to the second gate electrode, the first gate electrode can be applied with a turn-off signal, and it is possible to positively turn off the double gate semiconductor device. Therefore, it is possible to control the double gate semiconductor device by a single turn-off signal, and it is sufficient that an external device using the double gate semiconductor device may have a single control signal as in the prior art. When timer delay means is used as the first gate control means, the transistor condition can be turned off after a predetermined time for the transition from the thyristor condition to the transistor condition. it is also possible to determine the transition from the thyristor condition to the transistor condition according to an operating voltage applied to the collector electrode using the operation determination circuit unit. Therefore, after the transition to the transistor condition is confirmed using the turn-off signal application circuit unit, the transition from the transistor condition to a turn-off condition can also be positively achieved by applying a turn-off signal to the first gate electrode.

When the second gate control means which is capable of delaying the turn-on signal is used, first a turn-on signal can be applied to the first gate electrode to turn on the double gate semiconductor device from the transistor condition. Therefore, when there is an abnormality during an ON state, a turn-off signal can be applied to the first gate electrode to immediately turn off the double gate semiconductor device. When the double gate semiconductor device normally operates in the transistor condition, a turn-on signal can be applied from the second gate control means to the second gate electrode to transfer the device to the thyristor condition. As such second gate control means, an overcurrent in the transistor condition is detected by the current determination circuit unit, when it is an overcurrent, no turn-on signal is applied from the turn-on signal application circuit to the second gate electrode, but on the contrary, a turn-off signal is applied from the turn-off signal application circuit unit to the first gate electrode to set the double gate semiconductor device to an OFF state, thereby preventing the double gate semiconductor device from a trouble such as burning.

Furthermore, a passing current of the double gate semiconductor device is monitored by the passing current determination means, and a turn-off signal can be outputted depending on the value of passing current to protect the double gate semiconductor device earlier than other protective circuits. The turn-off signal can be a single signal when the first gate control means is used and, as the passing current determination means, it is possible to use a circuit for detecting the passing current, a circuit for determining from the operating current, or the like.

In the timer delay means of the first gate control means, the delay time of turn-off signal generation during occurrence of an abnormality is reduced by connecting the first and second time constant determination units in series and inputting a turn-off signal to the second time constant determination unit. Therefore, when an abnormality occurs, it is possible to reduce the time from the transistor condition to turning off to prevent the double gate semiconductor device from being damaged.

Furthermore, when the rectification means is provided, occurrence of an inhibited mode such that the potential of the second gate electrode is higher than the first gate electrode can be prevented in any cases. Therefore, the double gate semiconductor device can be prevented from being latched up uncontrollably.

The above and other objects, effects, features and advantages of the present invention will become more apparent from the following description of embodiments thereof taken in conjunction with the accompanying drawings.

BRIEF DESCRIPTION OF THE DRAWINGS

FIG. 3 is a graph illustrating the carrier density of the

Figure 4:
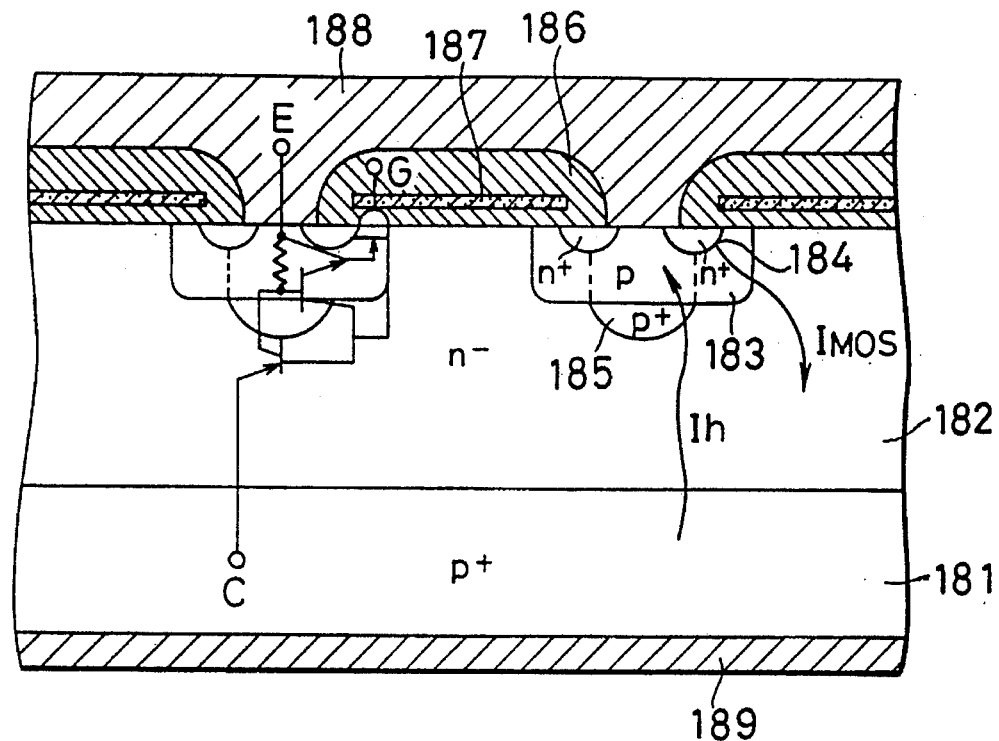
Figure 5:
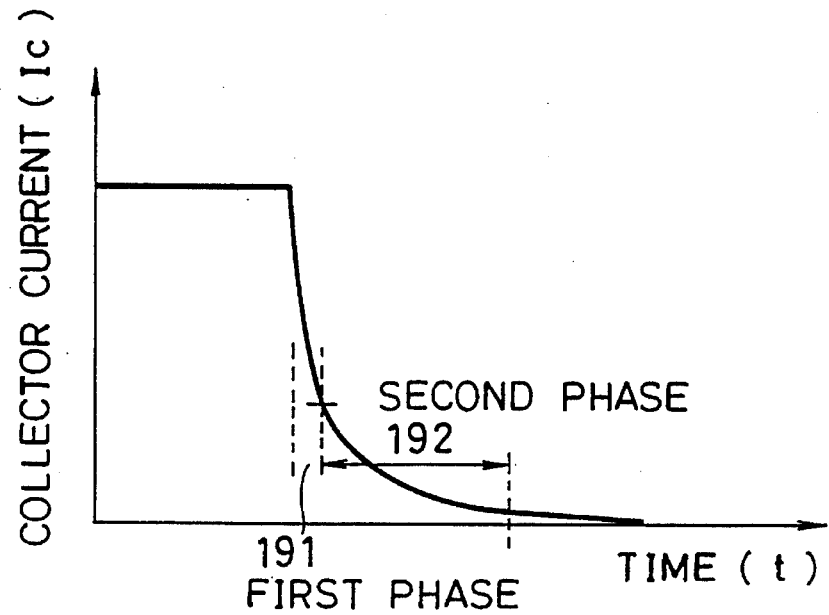
Figure 6:
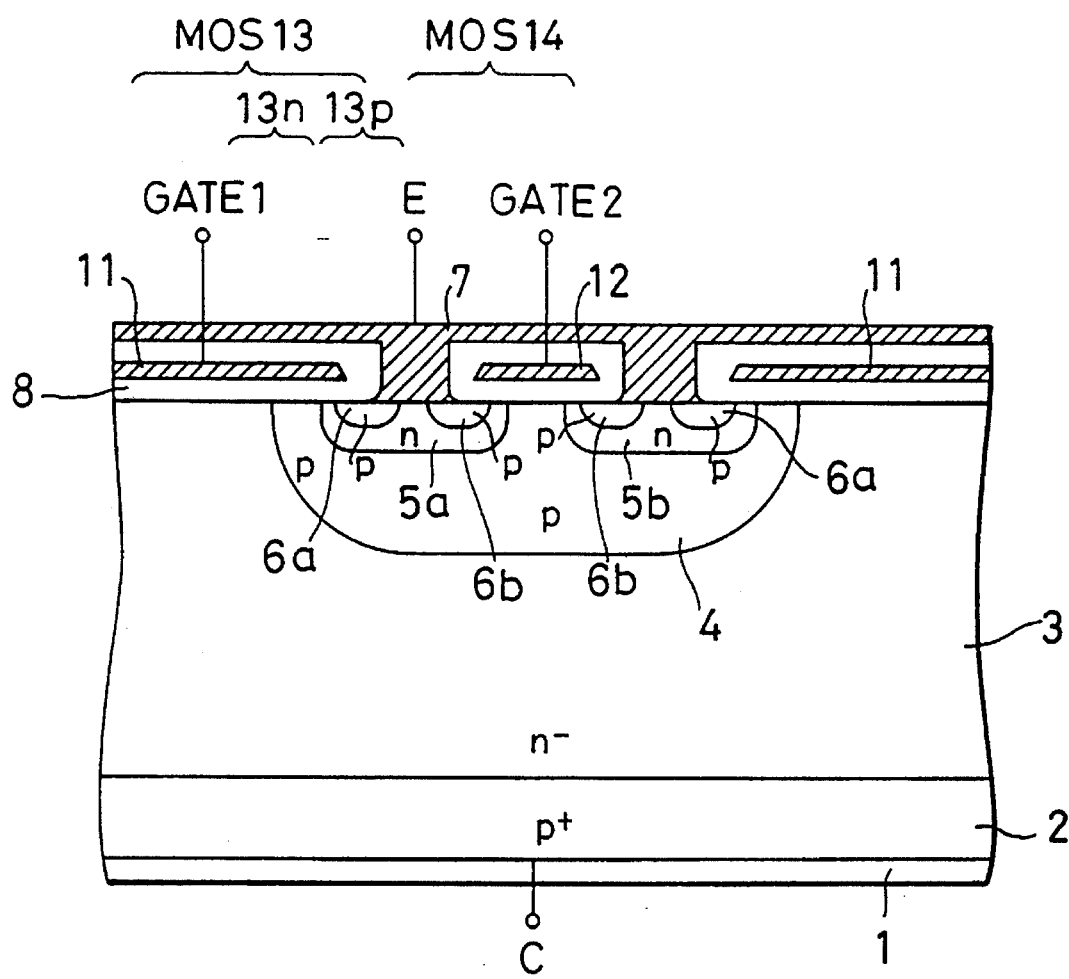
Figure 7:
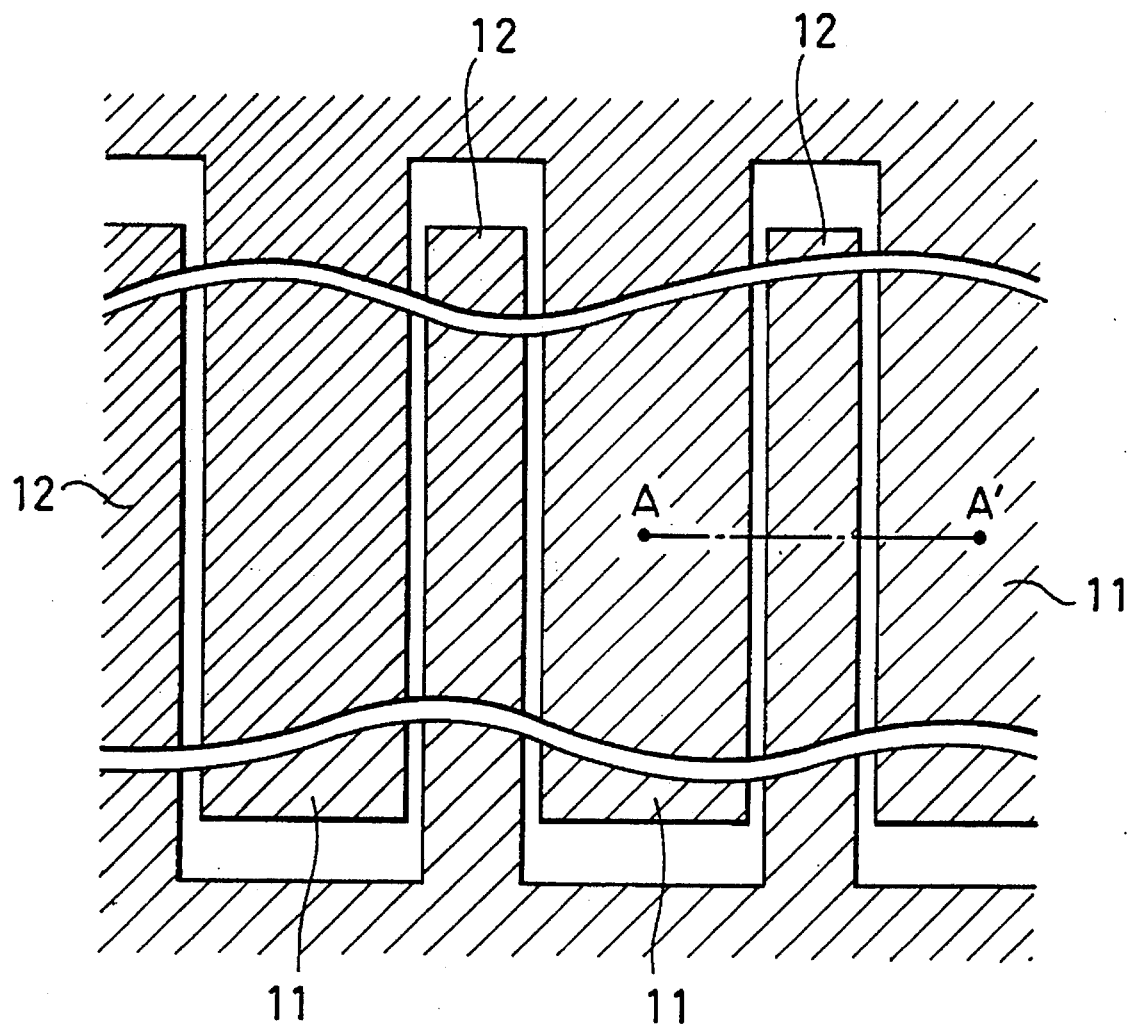
Figure 8:
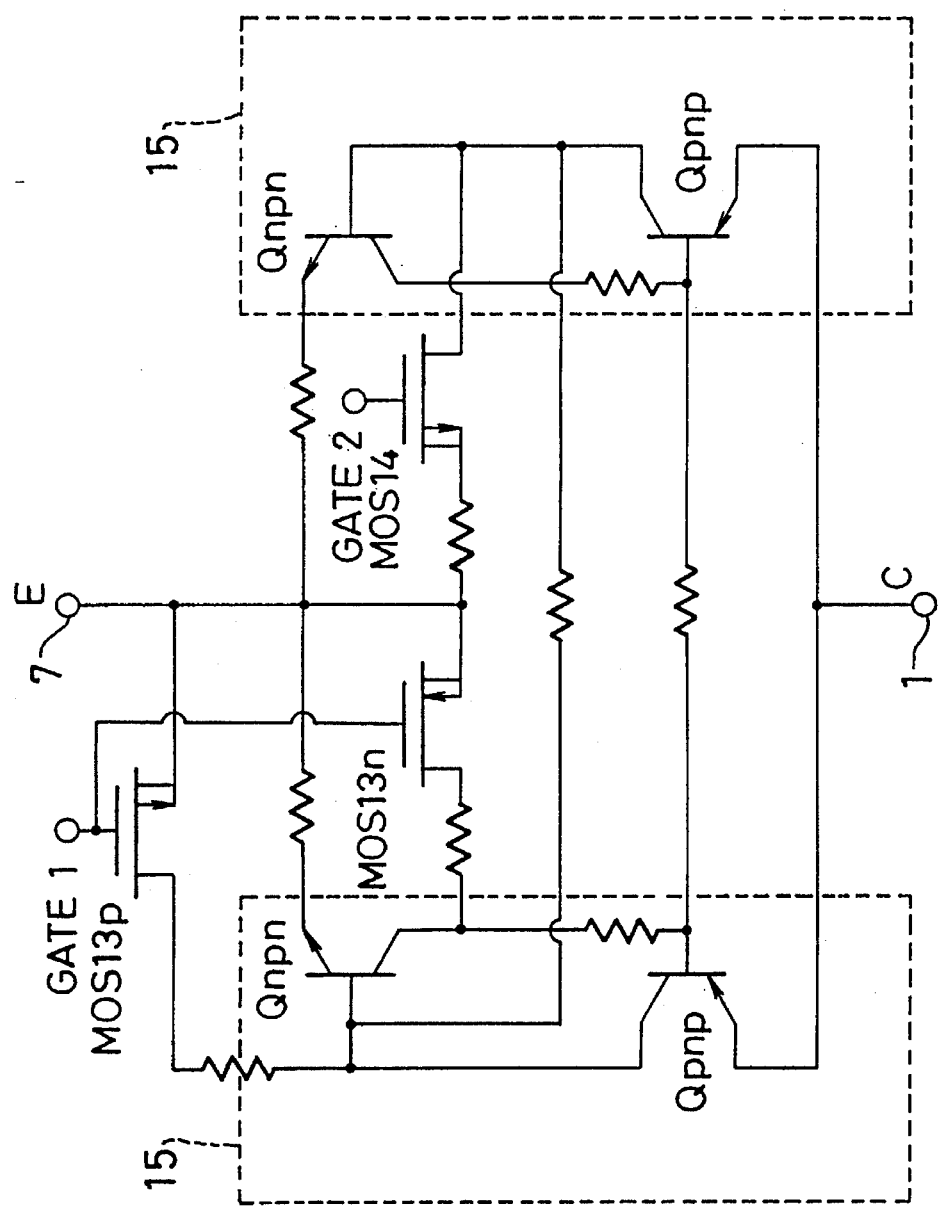
Figure 9:
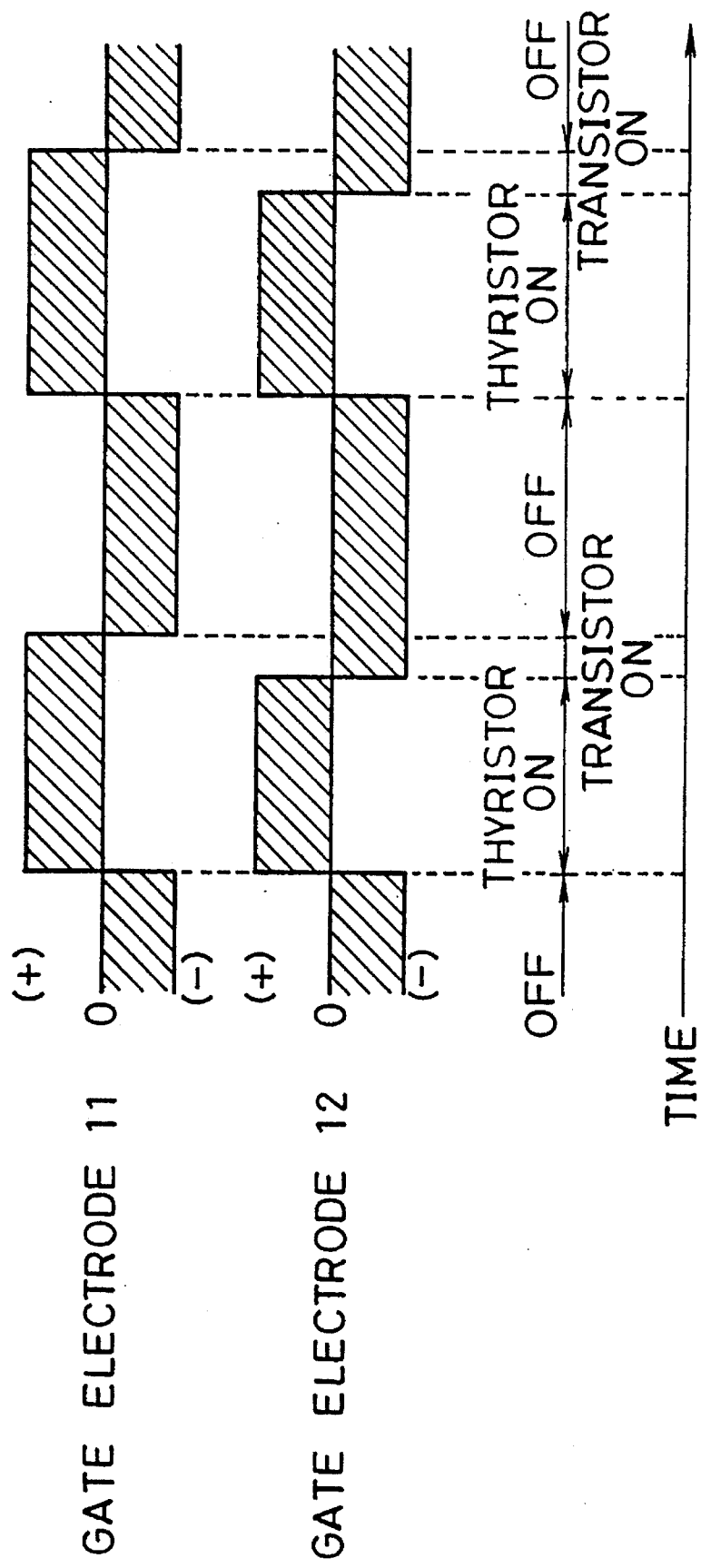
Figure 10A:
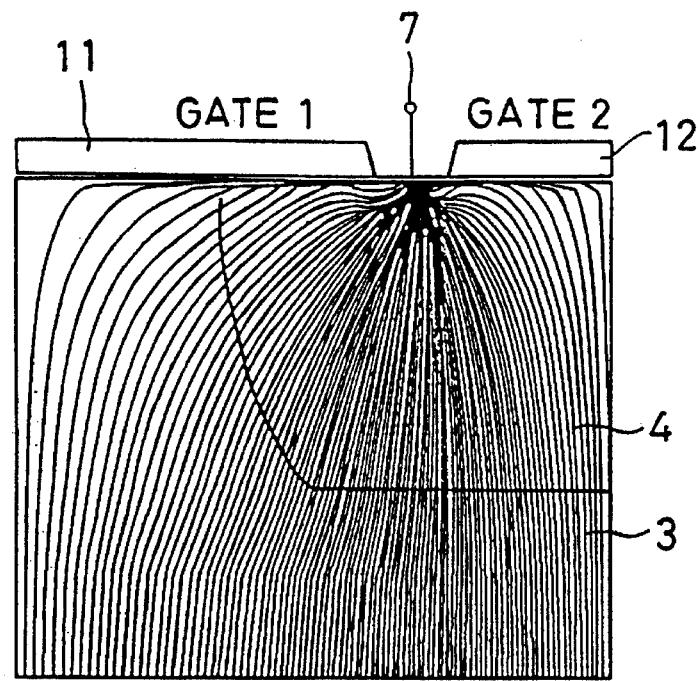
Figure 10B:
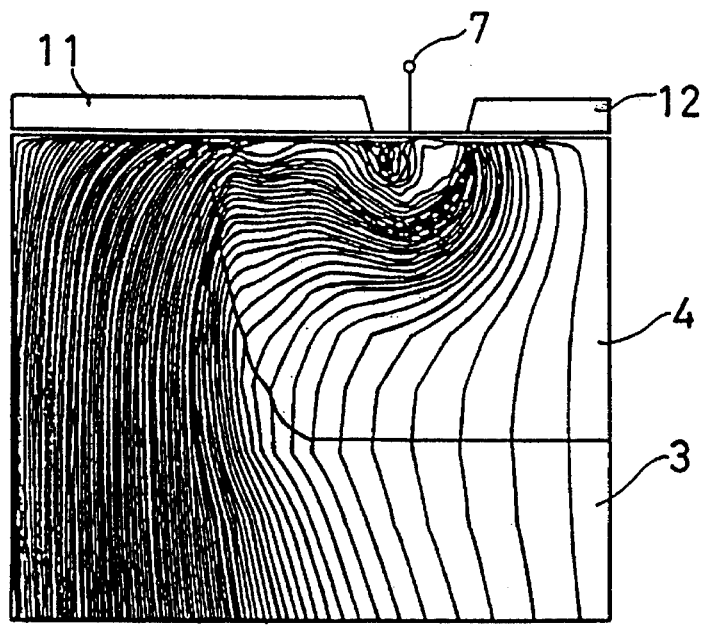
Figure 11B:
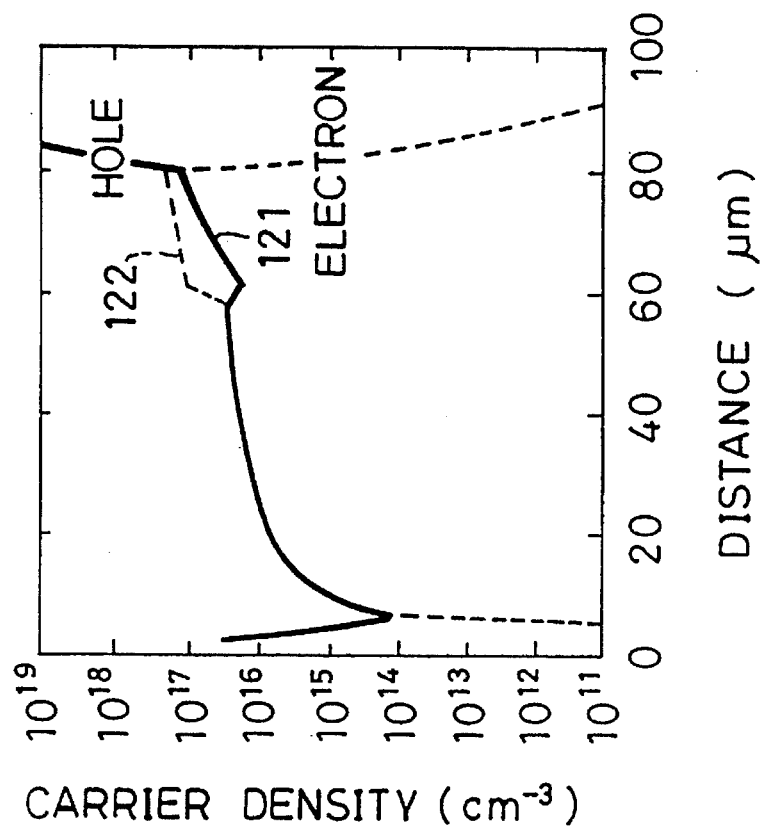
Figure 11A:
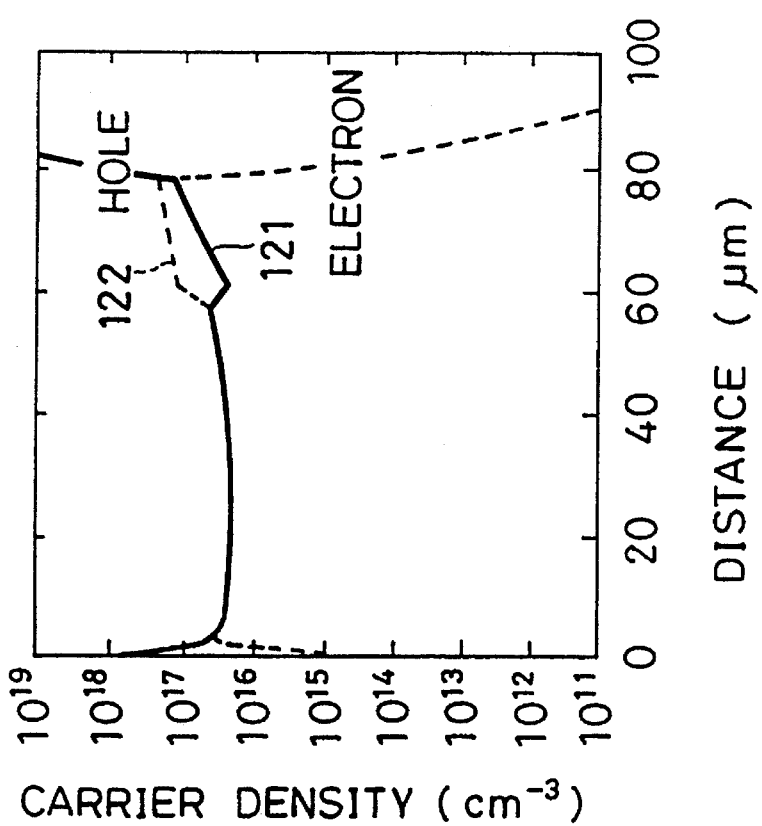
Figure 12:
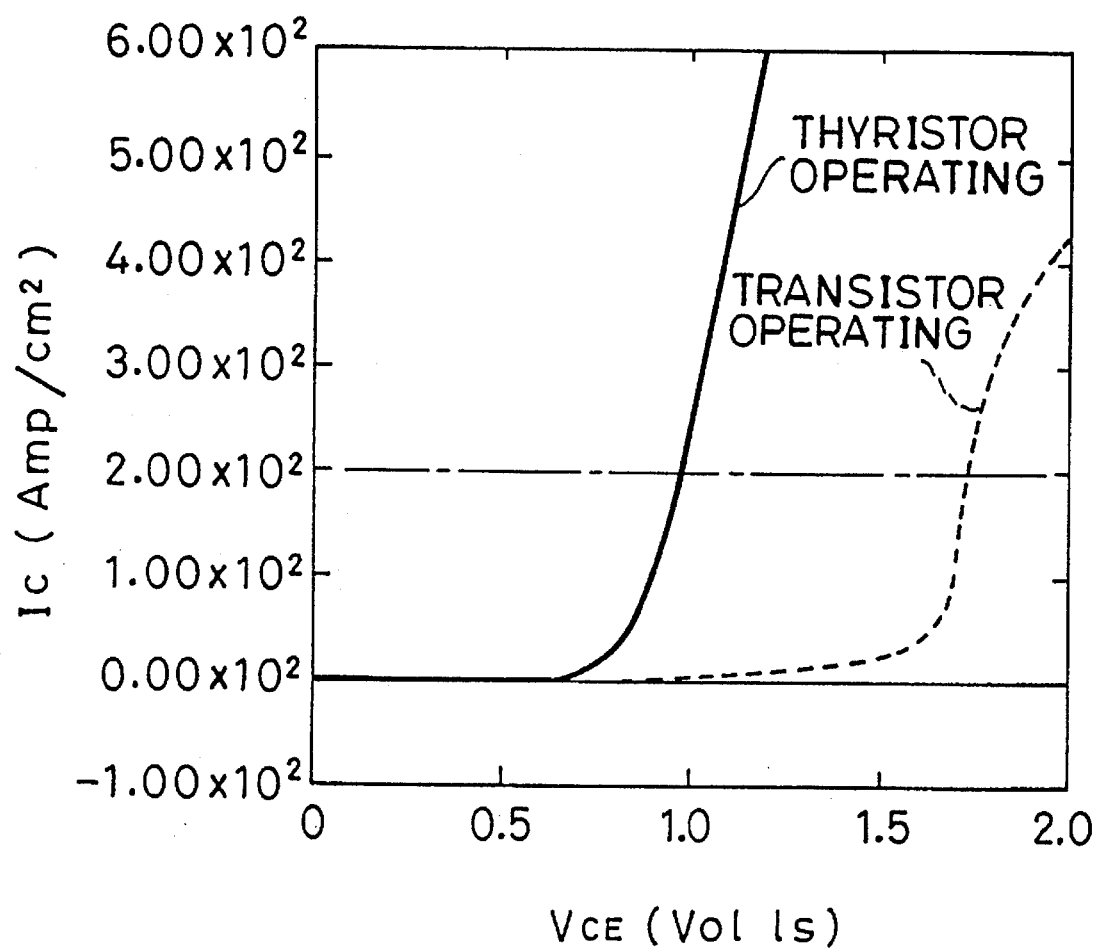
Figure 13:
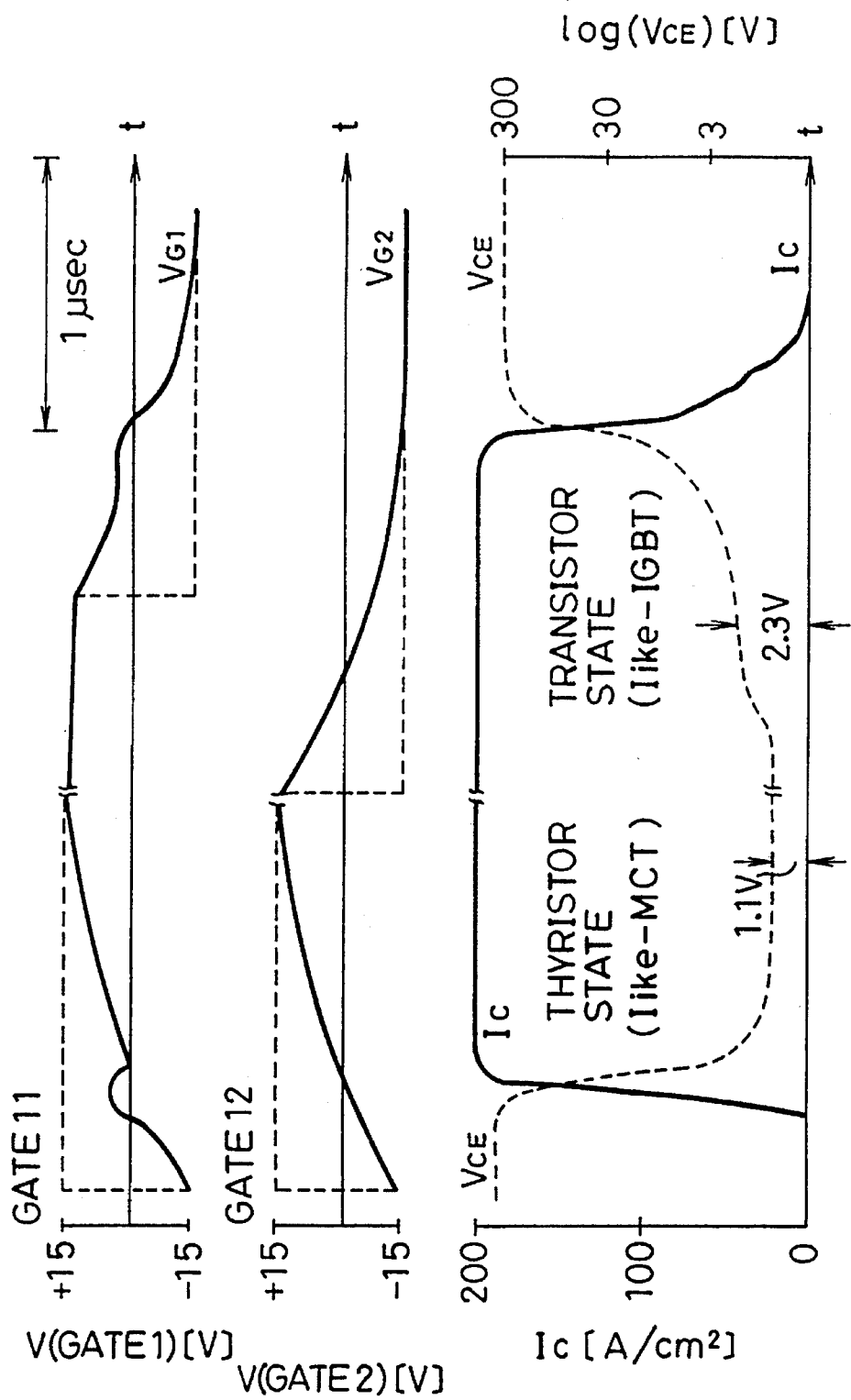
Figure 14:
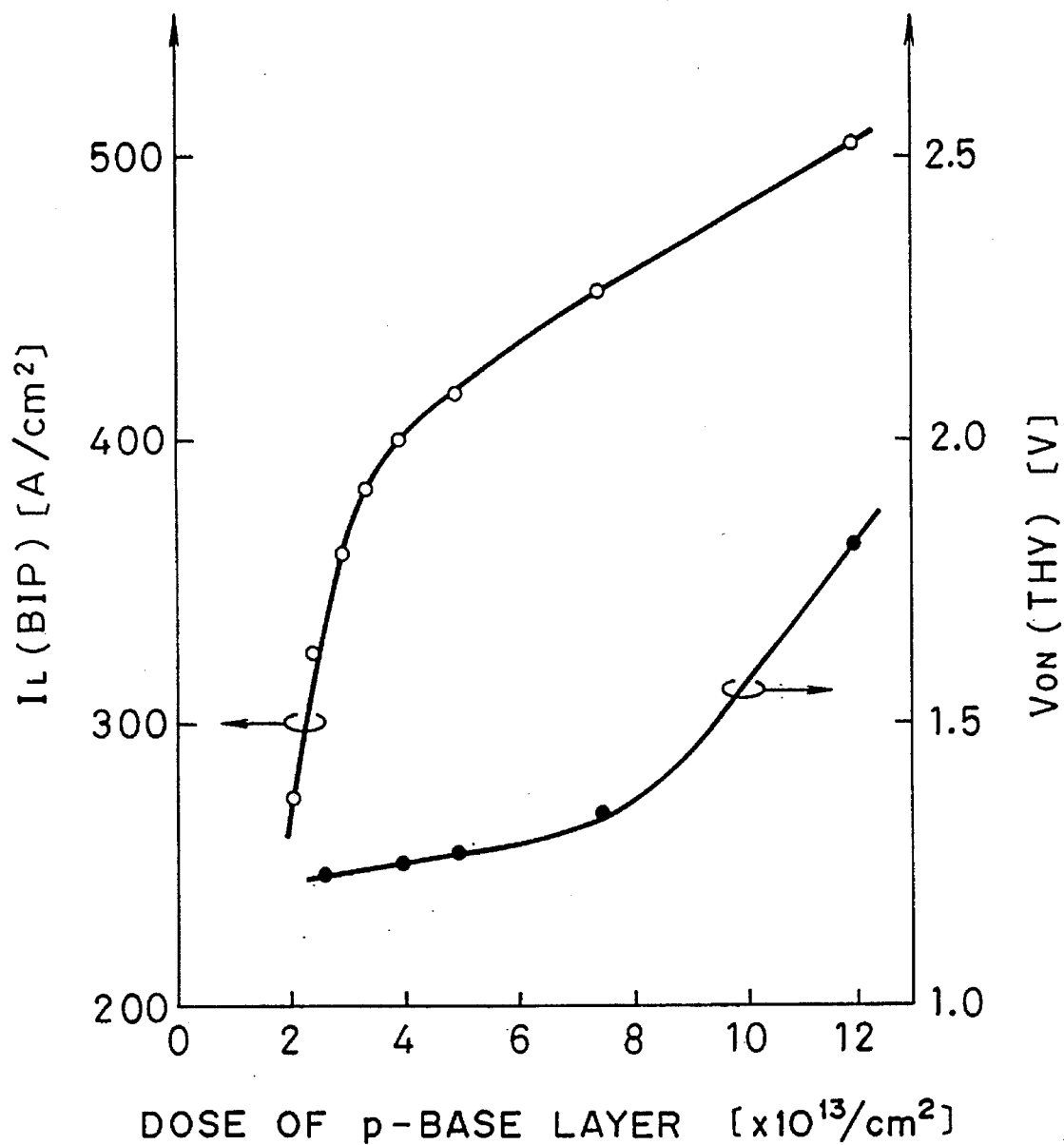
Figure 15:
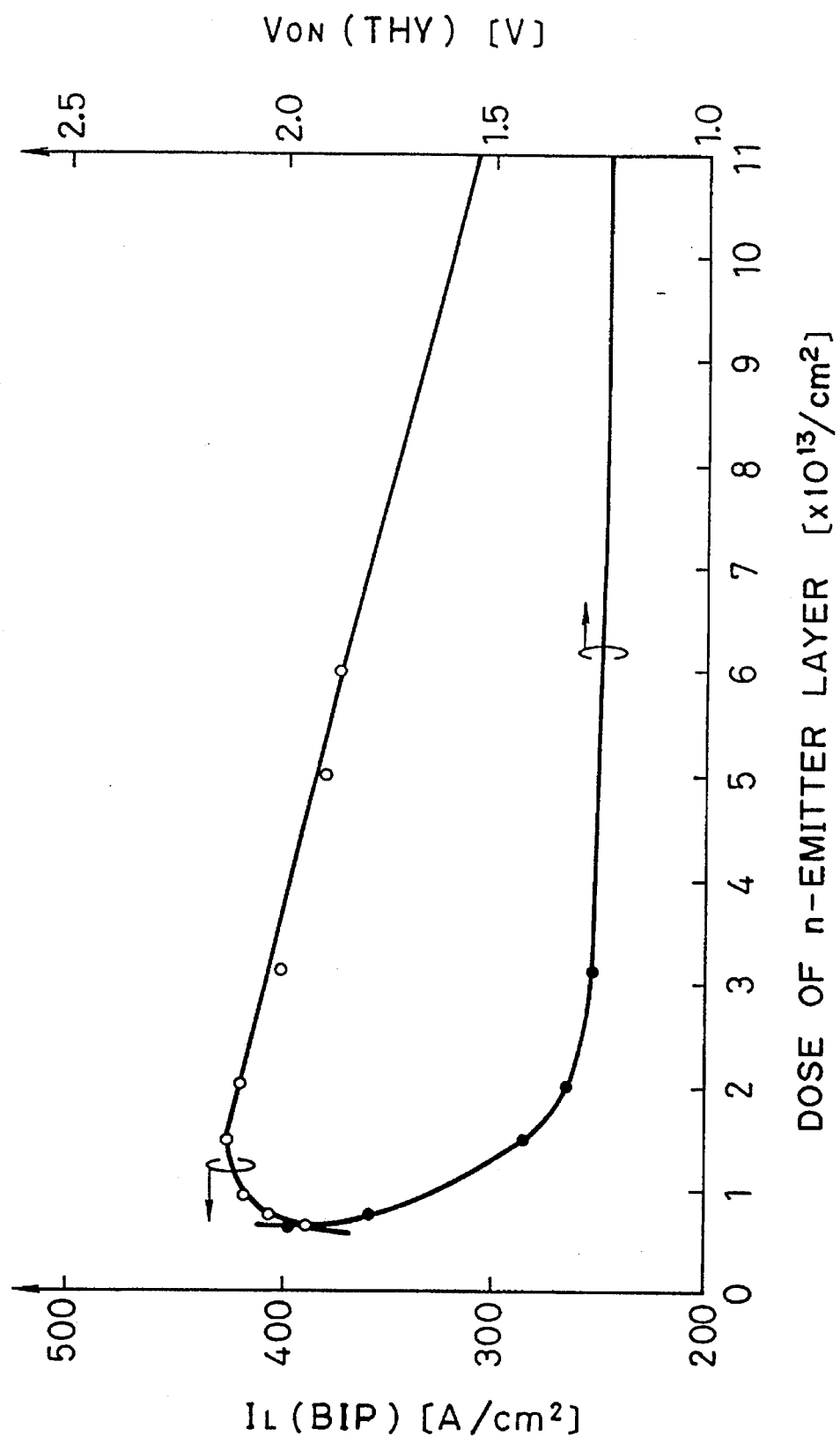
Figure 16:
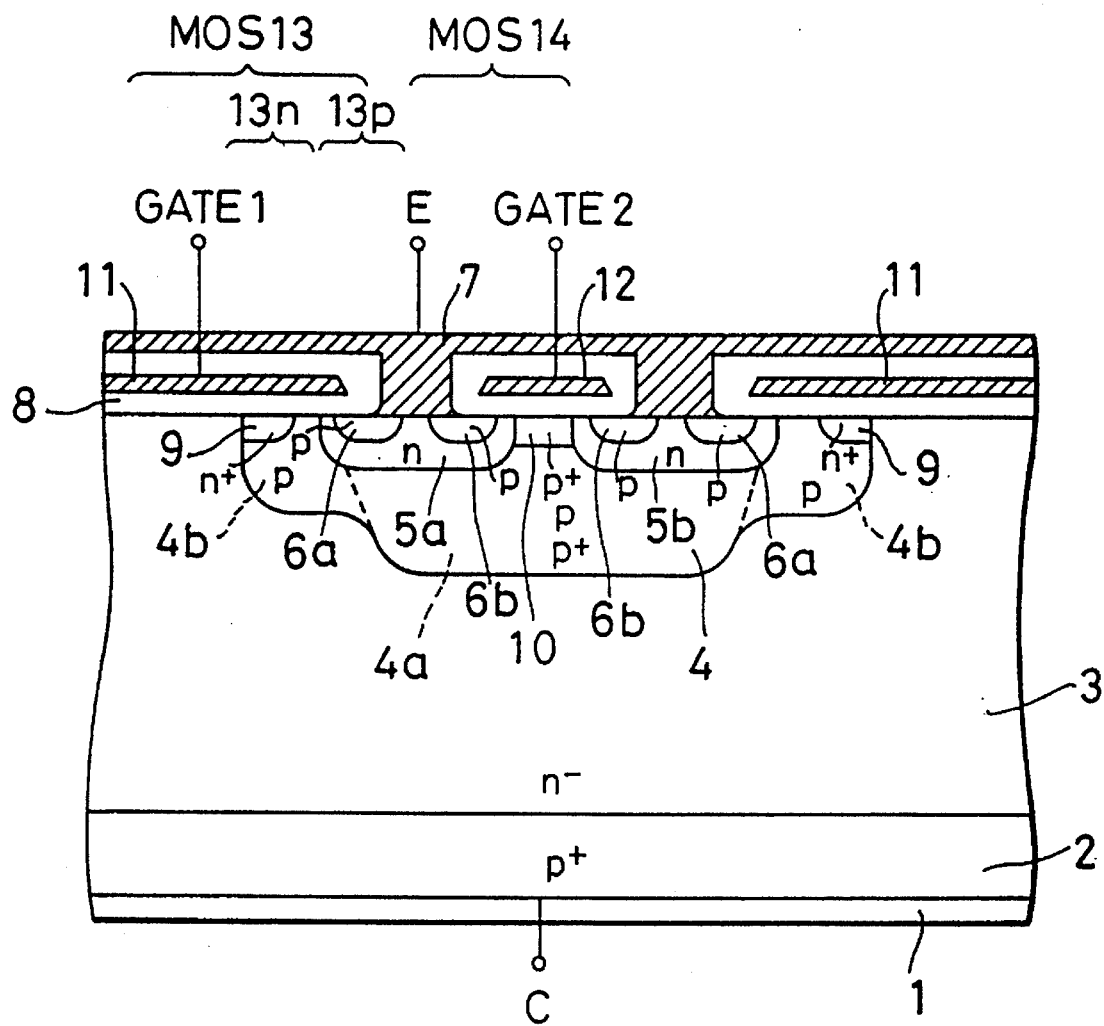
Figure 17:
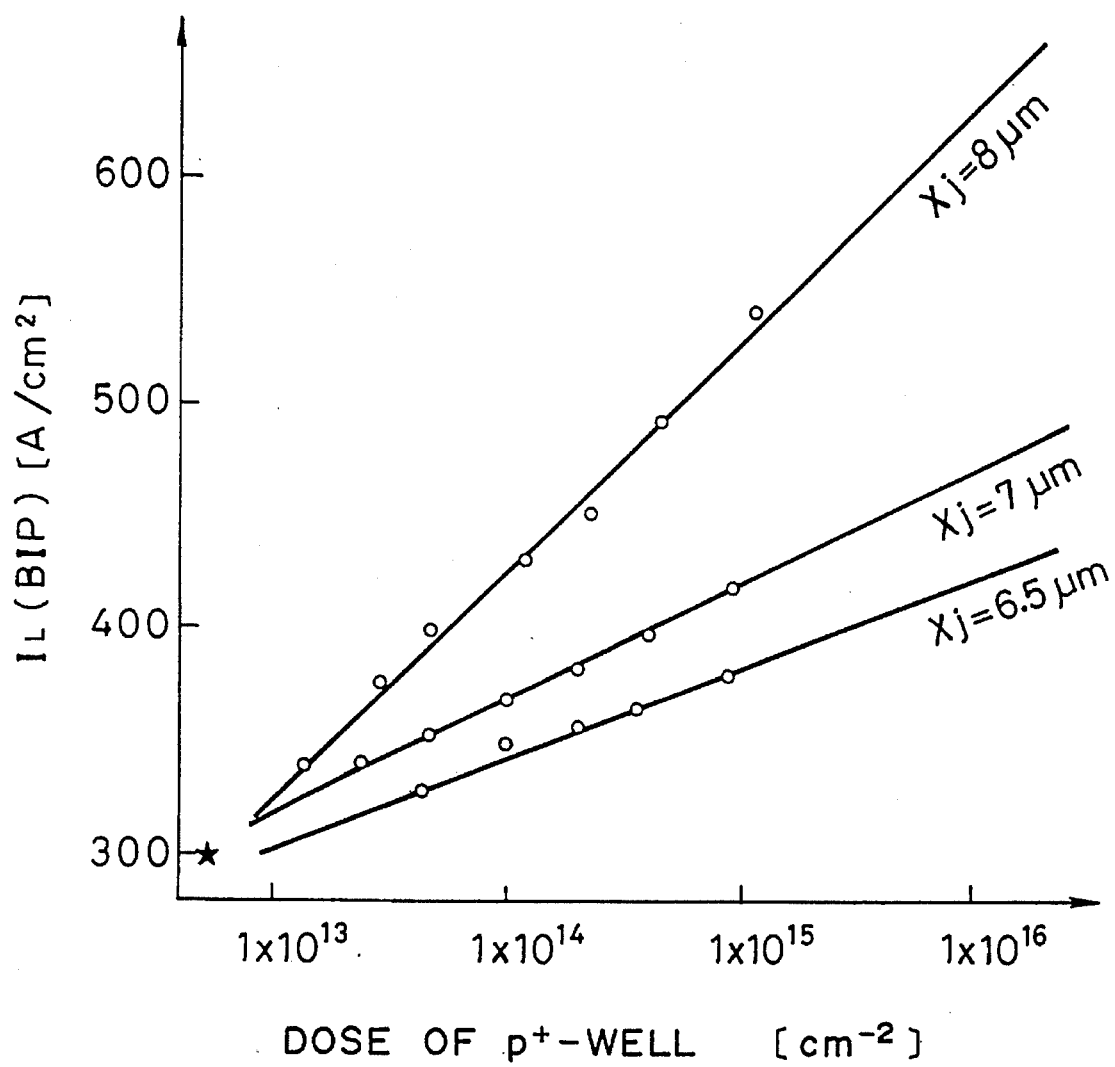
Figure 18:
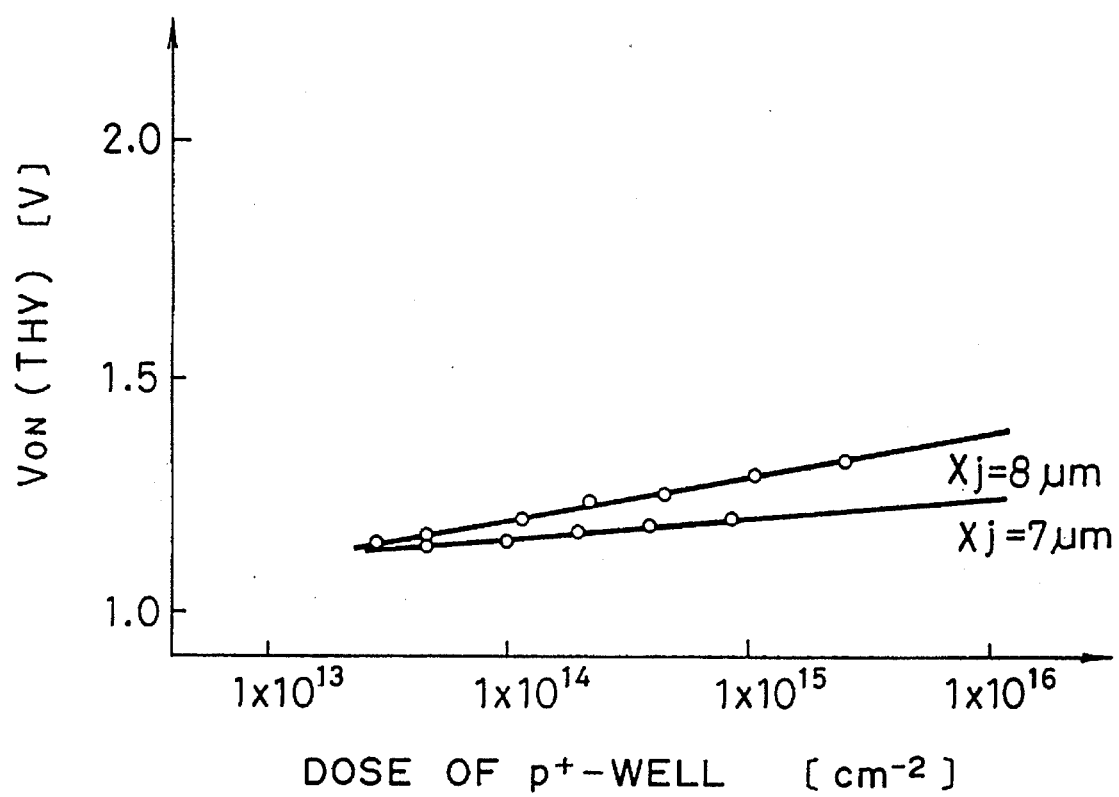
Figure 19:
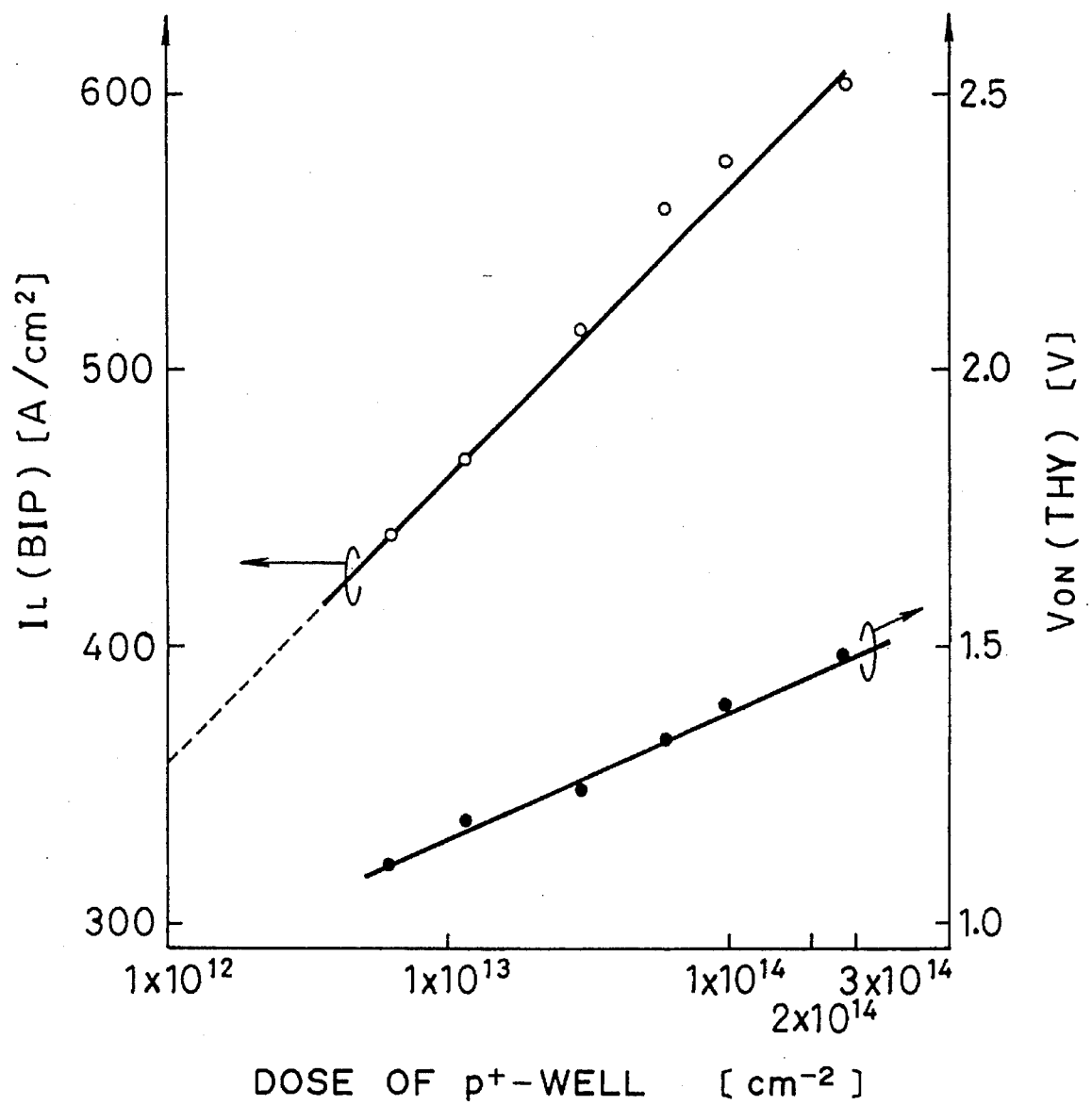
Figure 20:
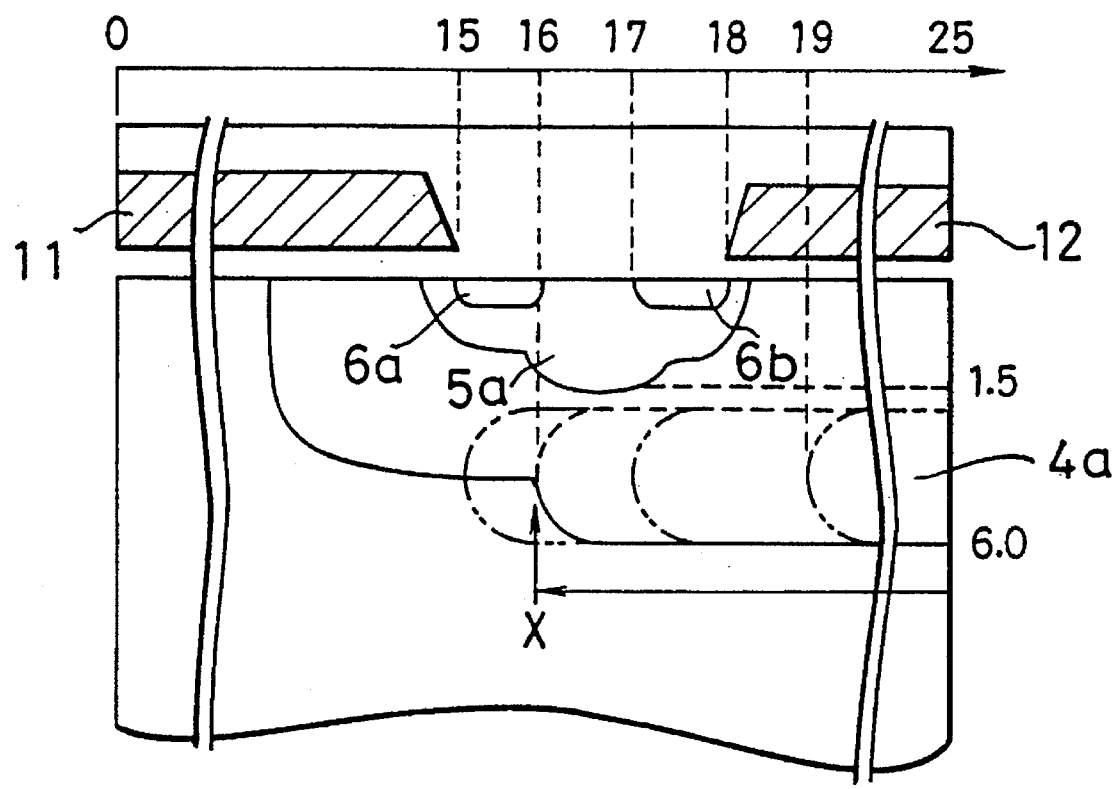
Figure 21:
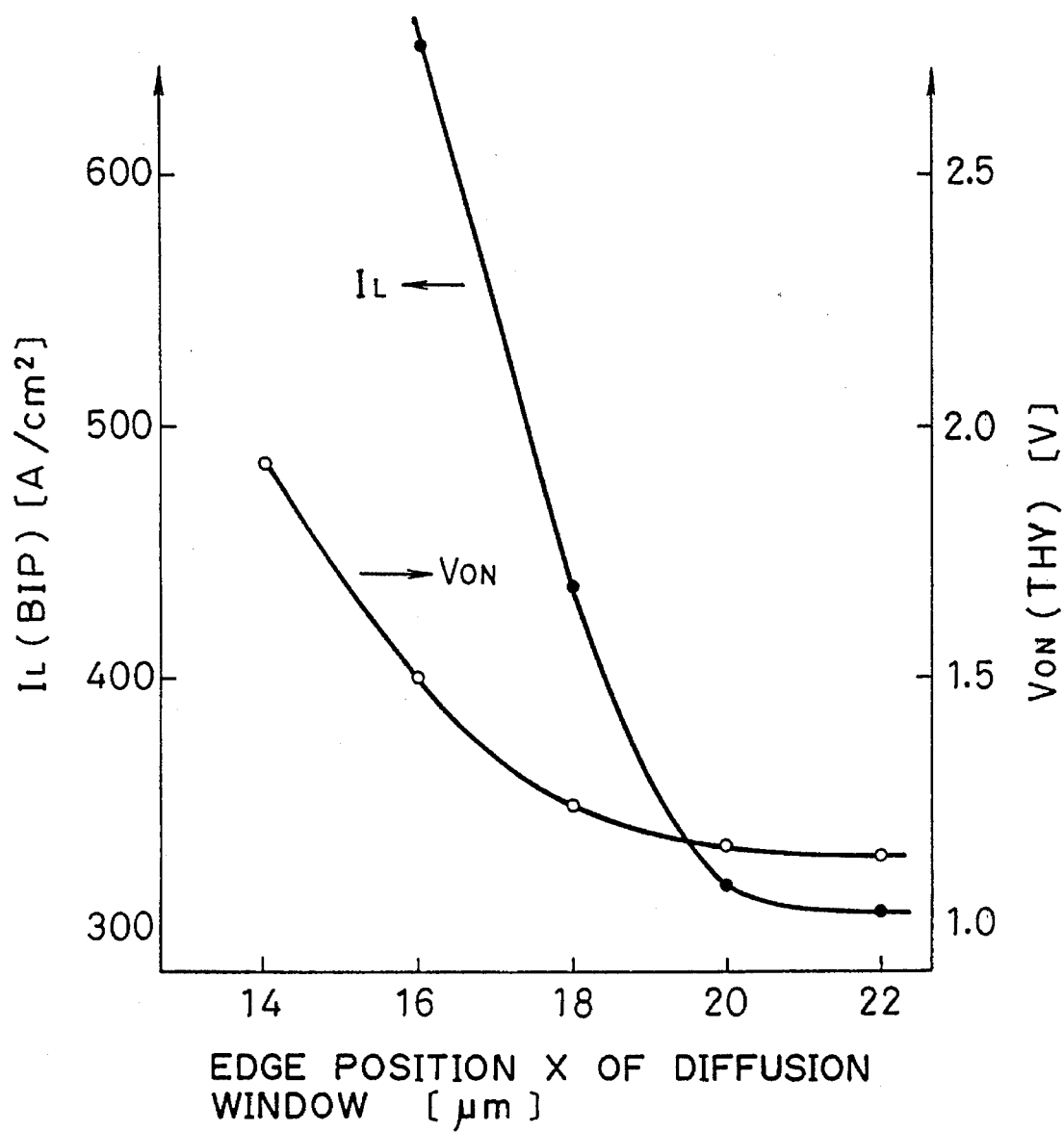
Figure 22:
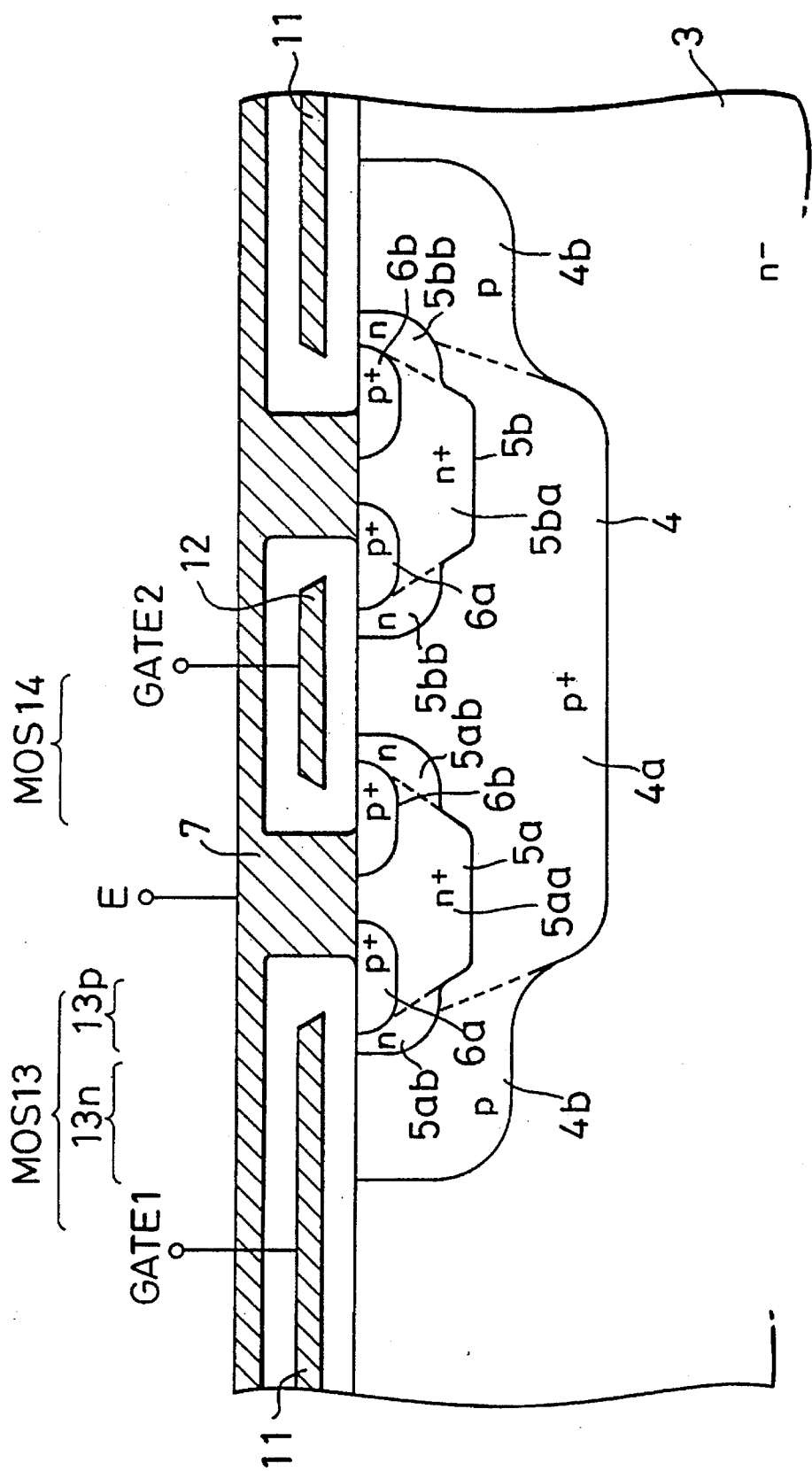
Figure 23:
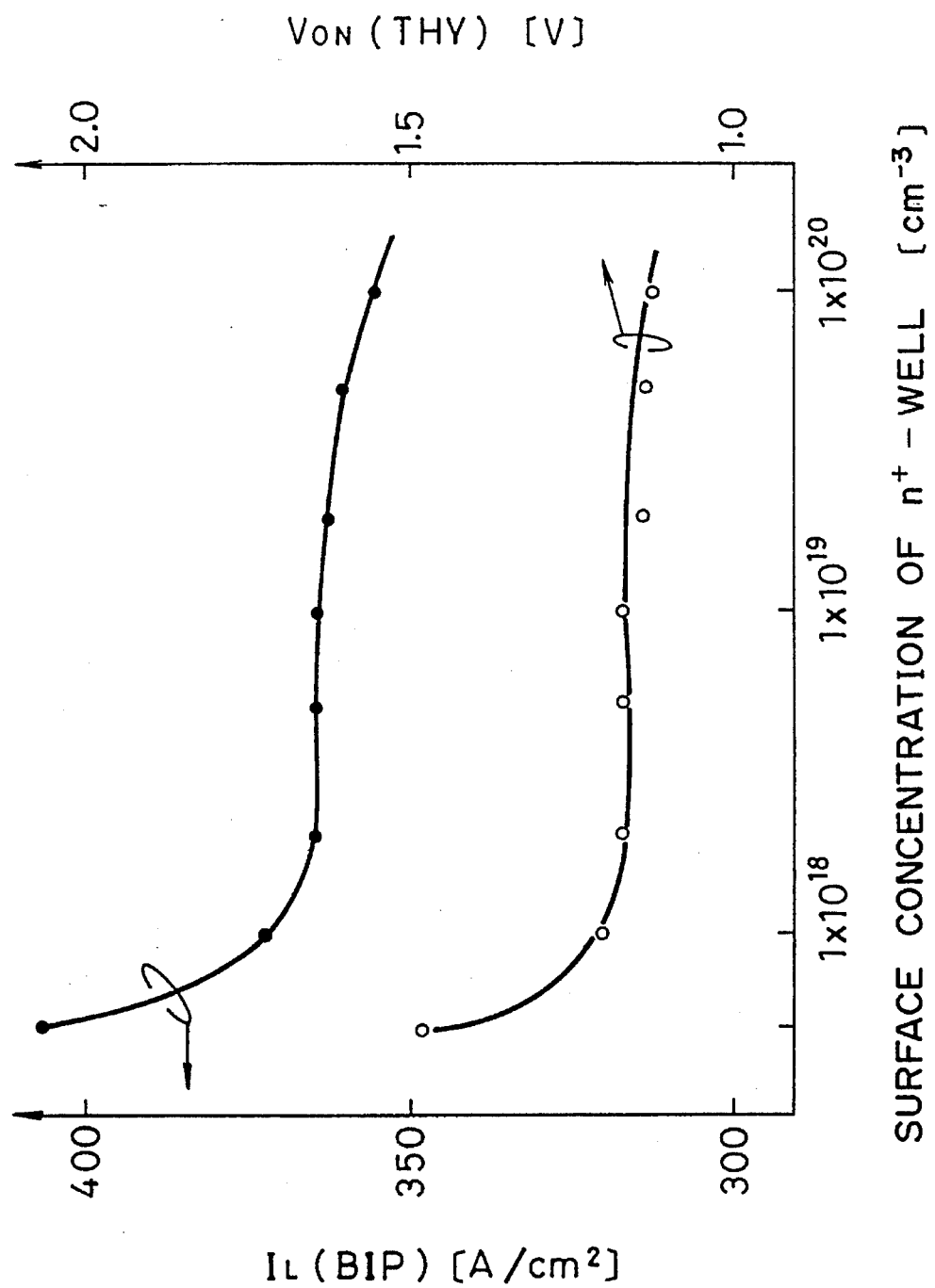
Figure 24:
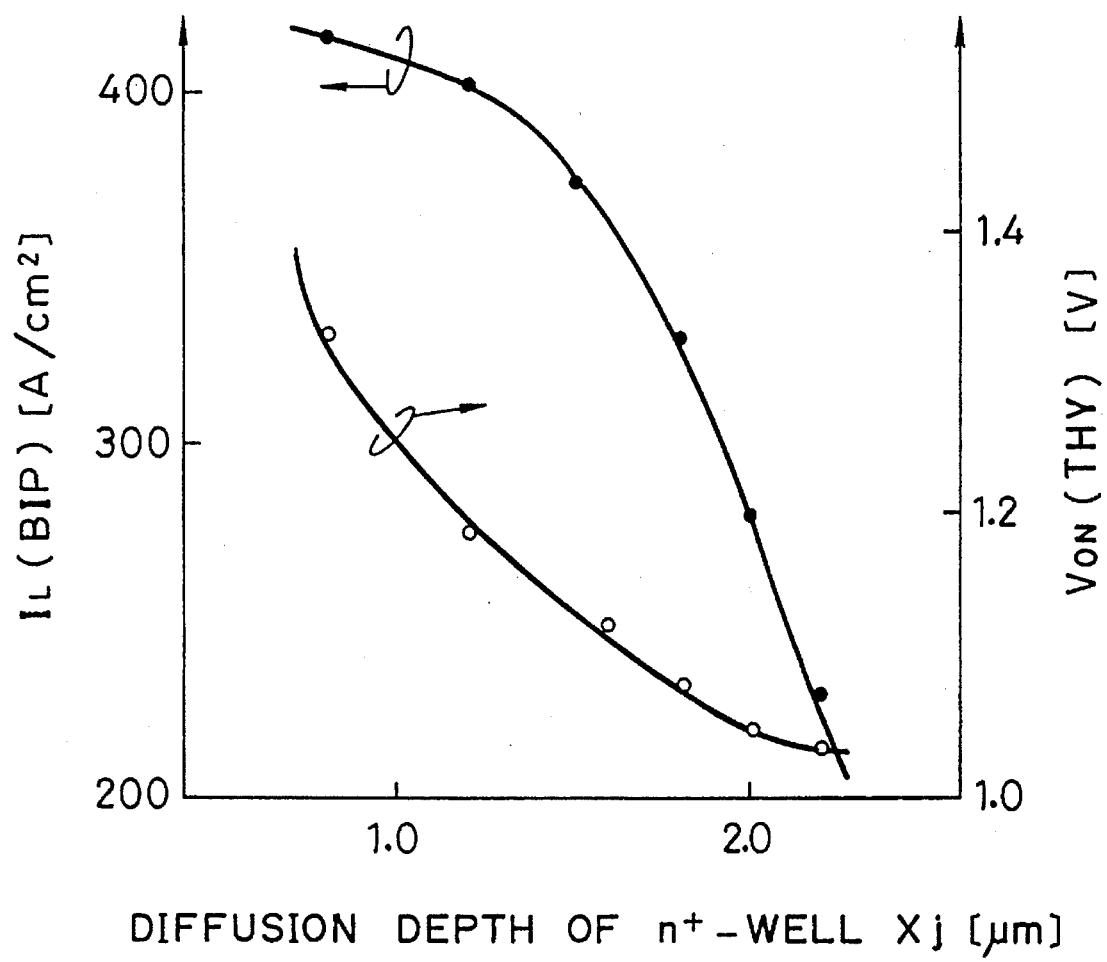
Figure 25:
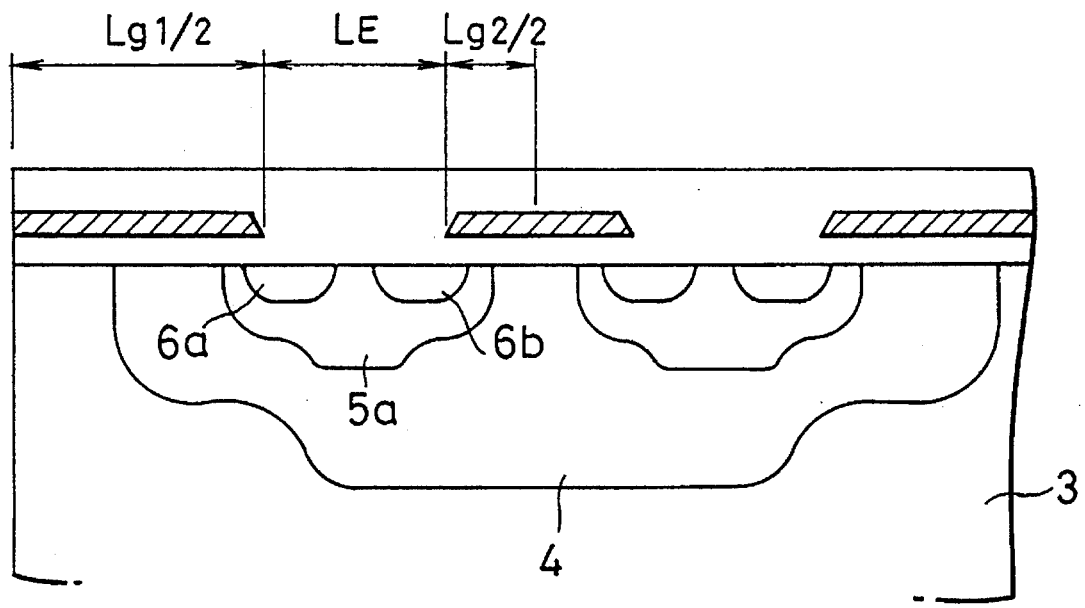
Figure 26:
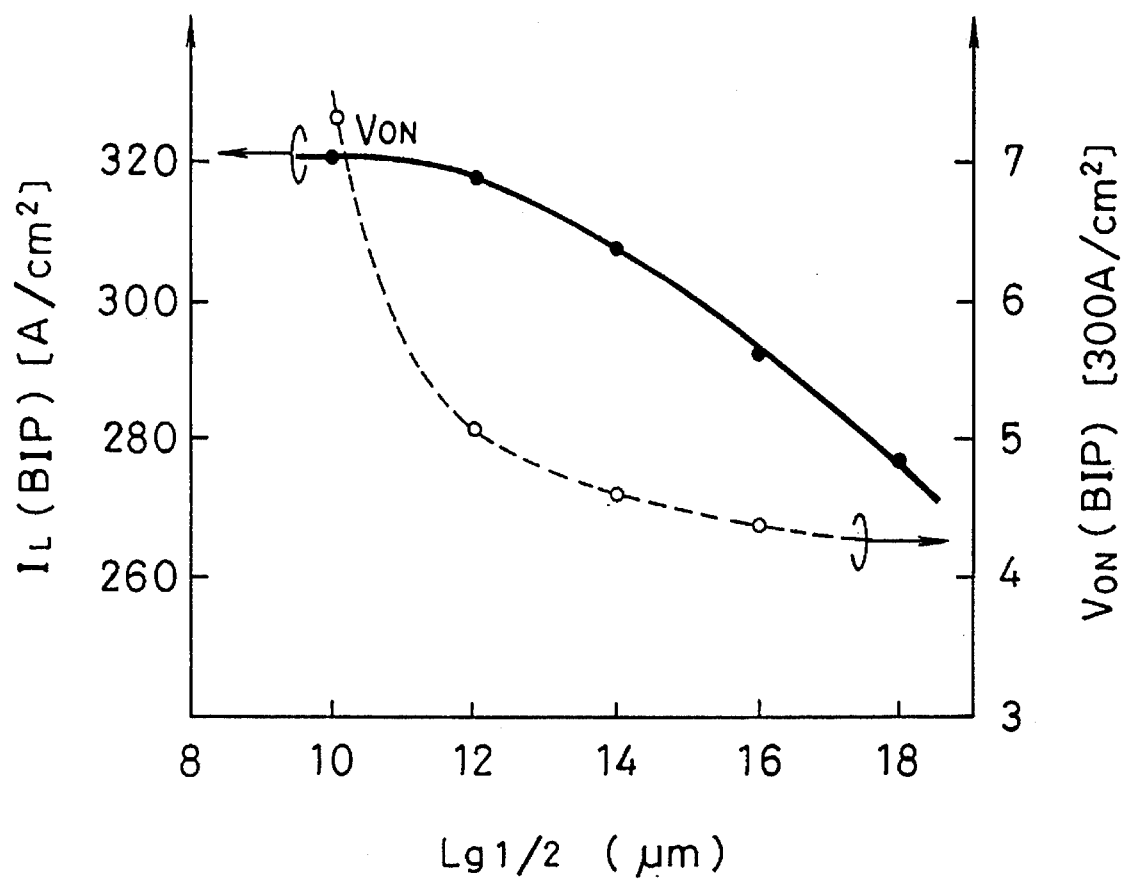
Figure 27:
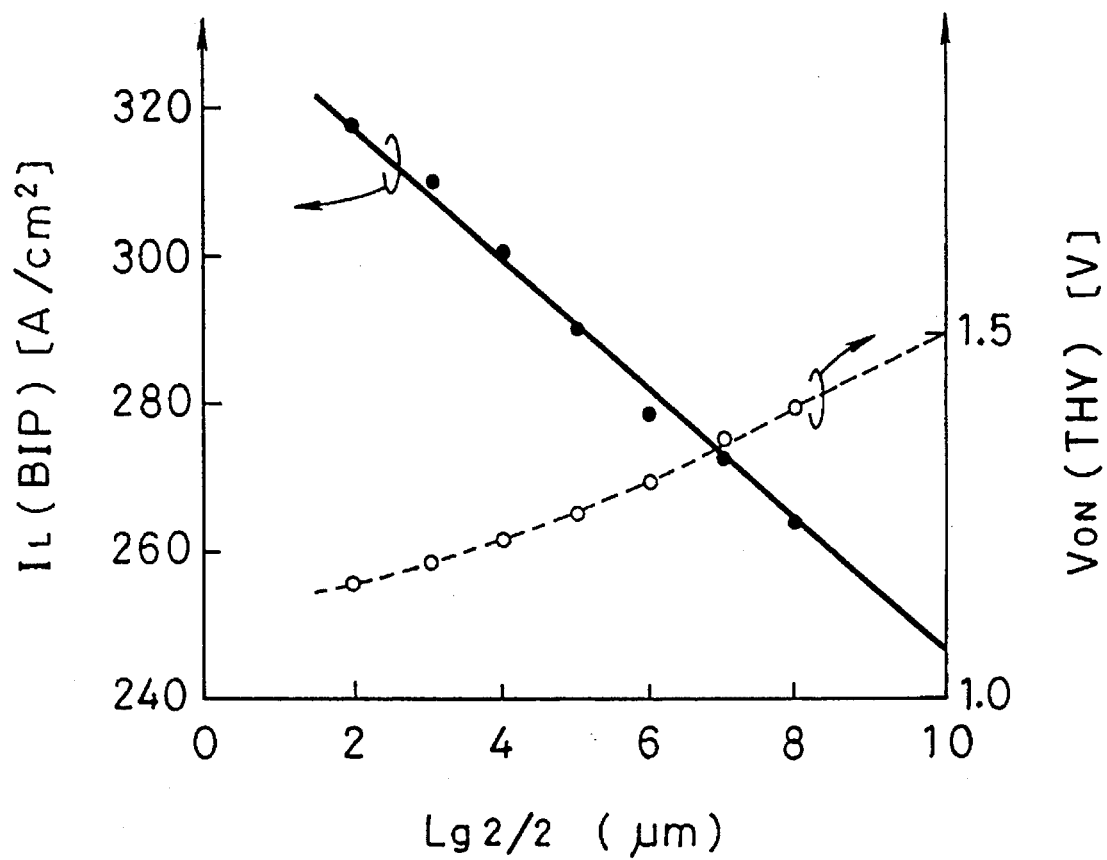
Figure 28:
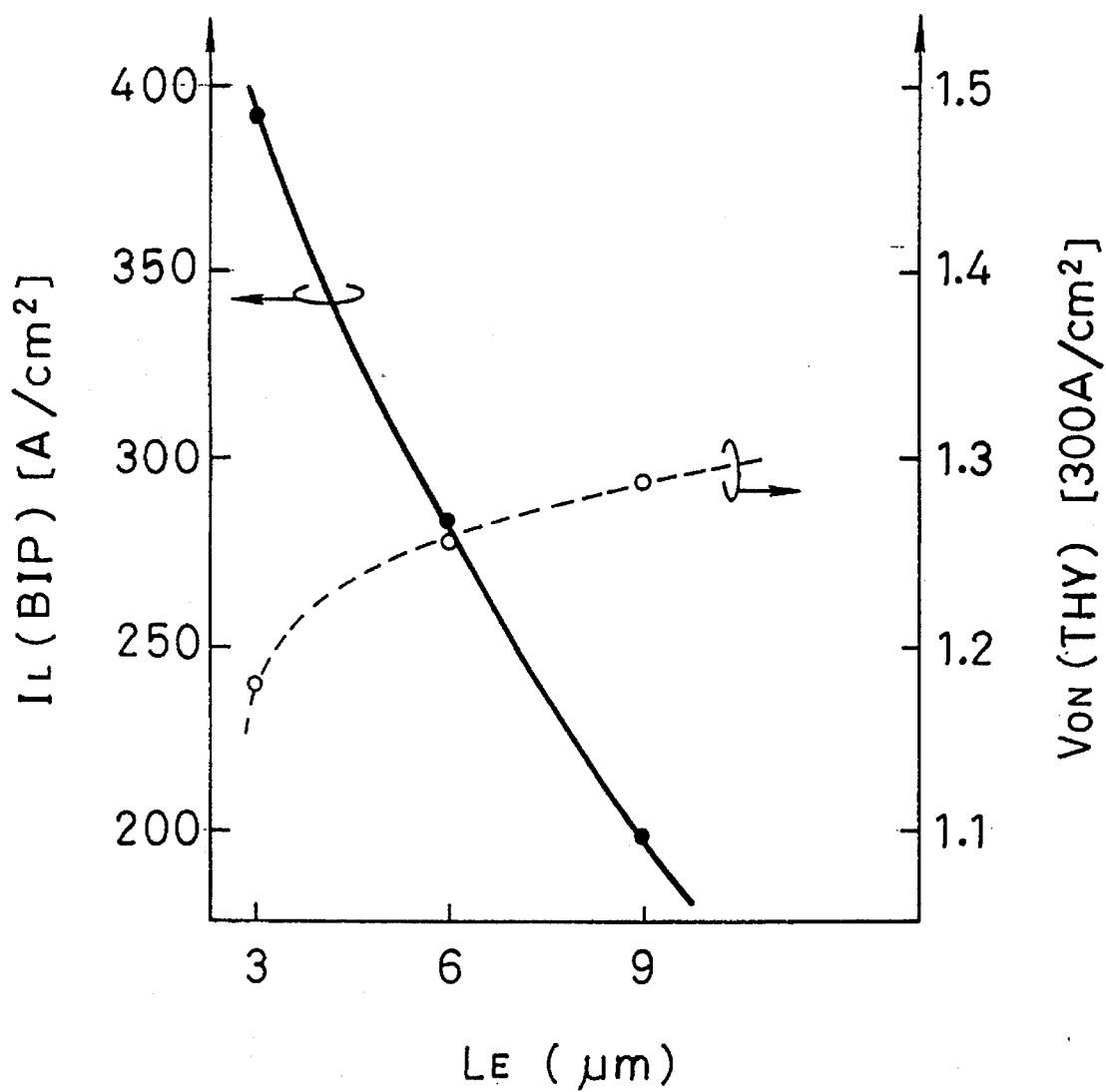
Figure 29:
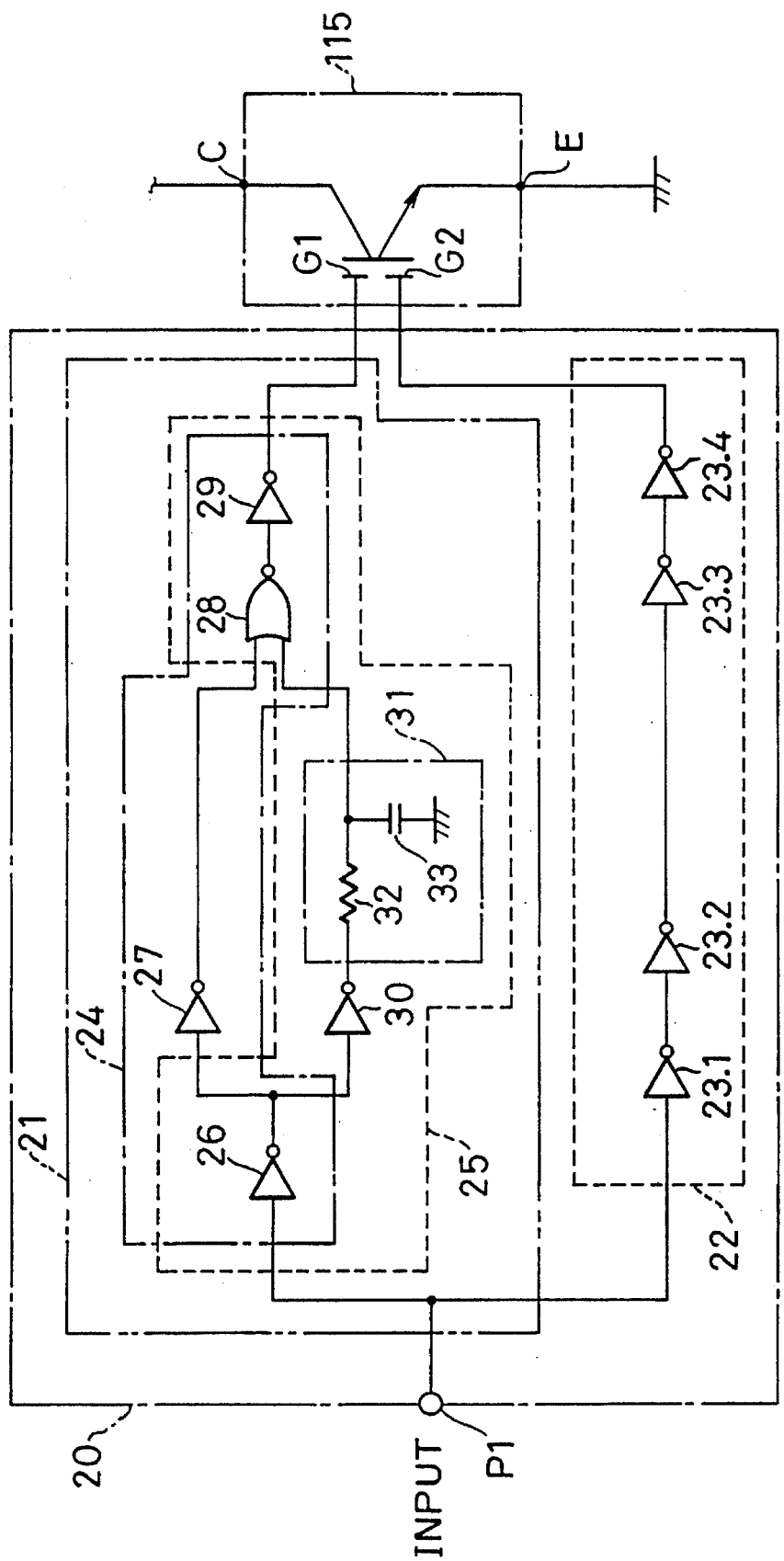
Figure 30:
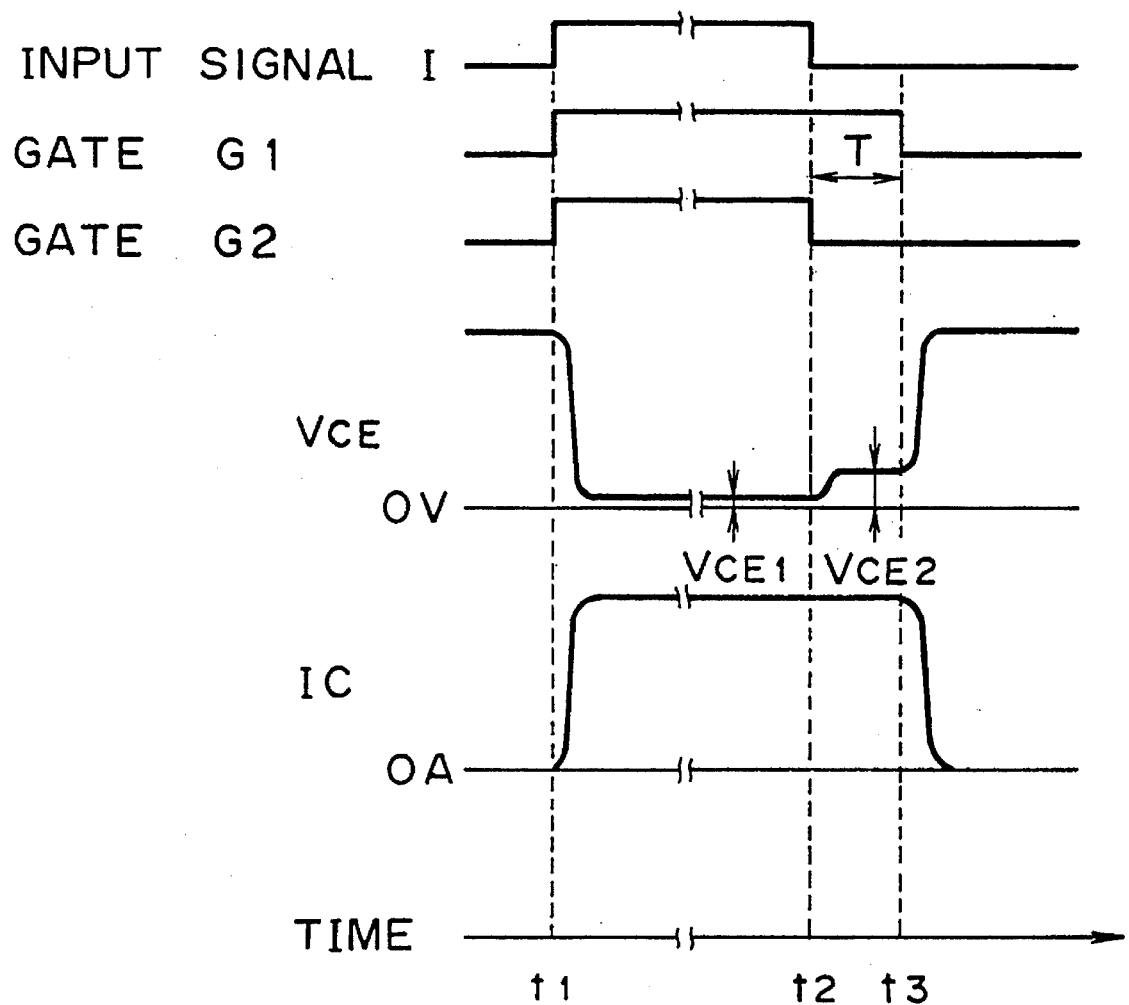
Figure 31:
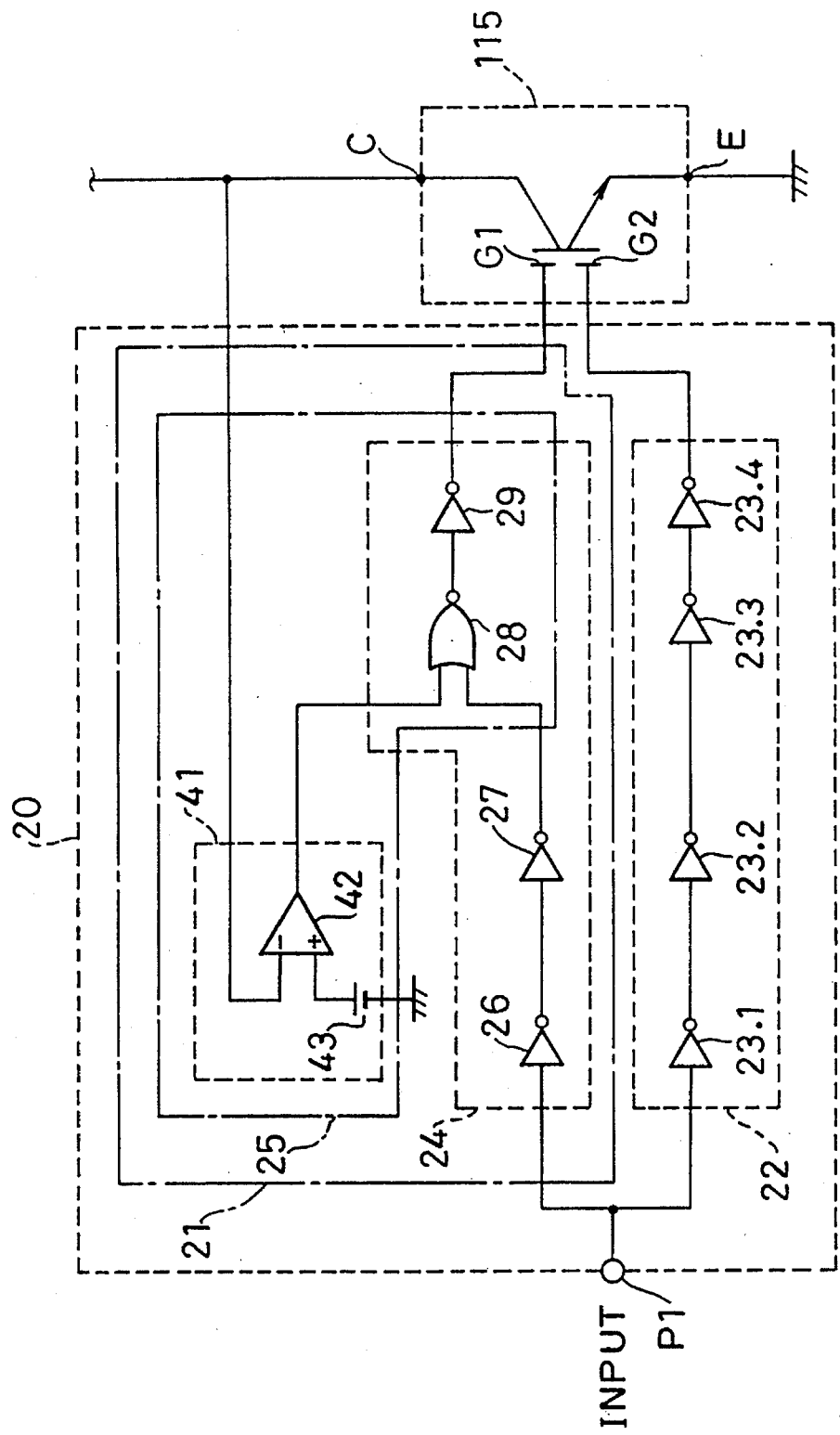
Figure 32:
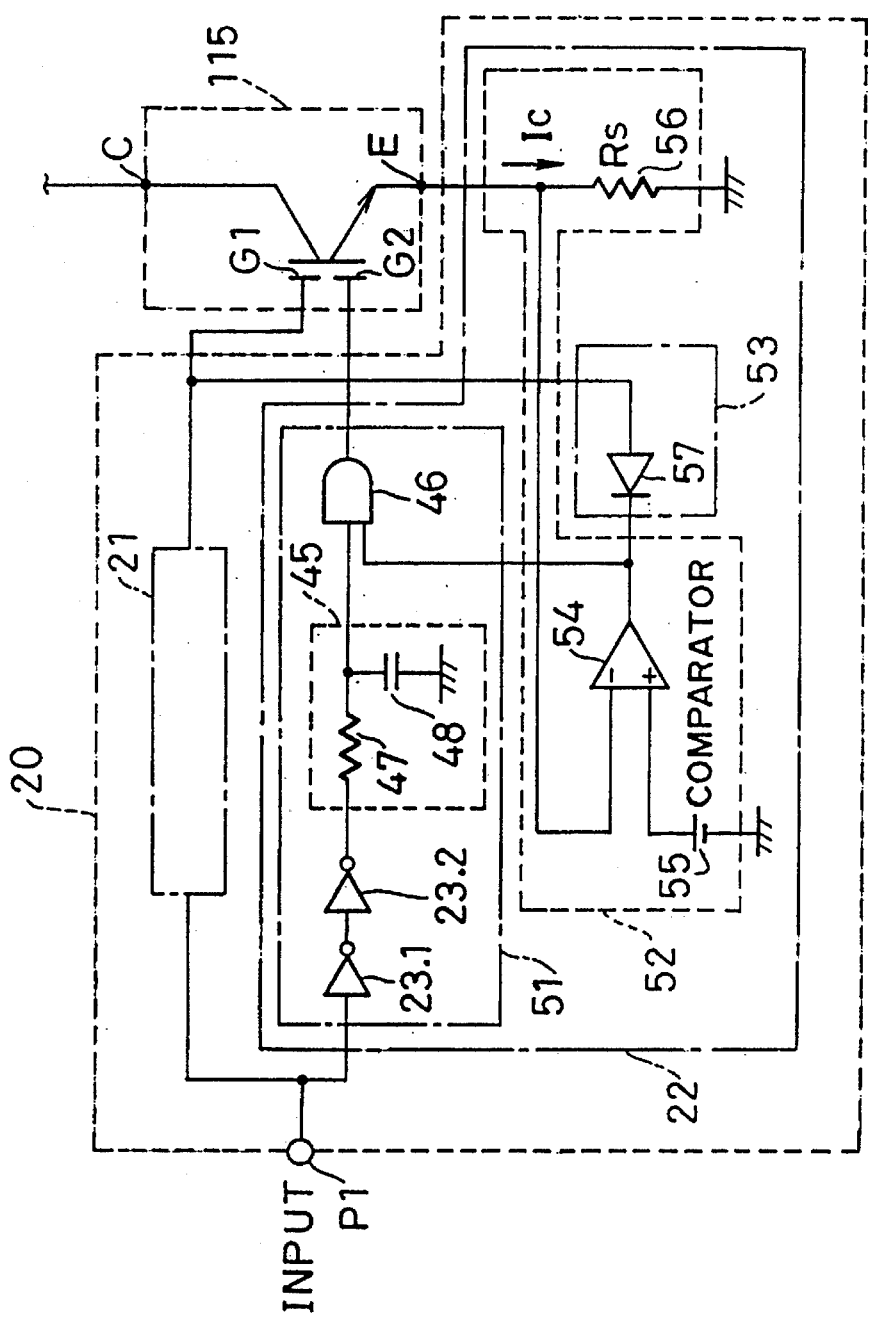
Figure 33:
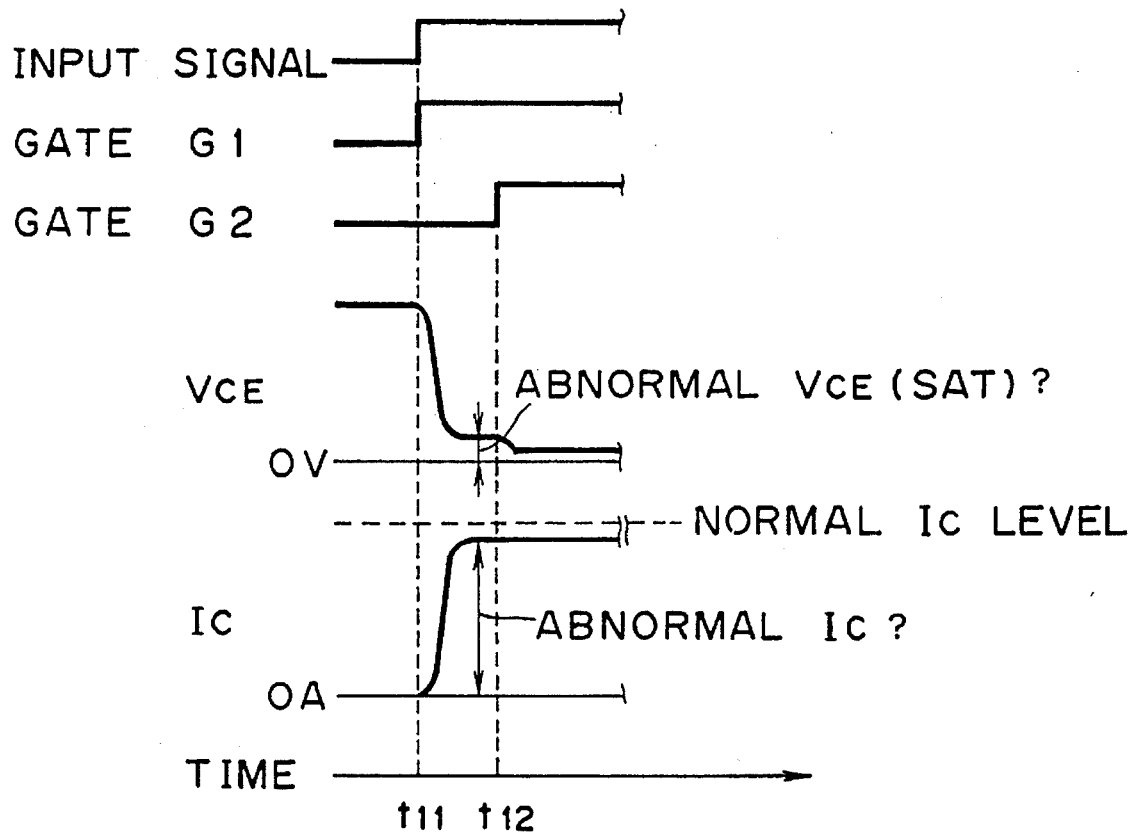
Figure 34:
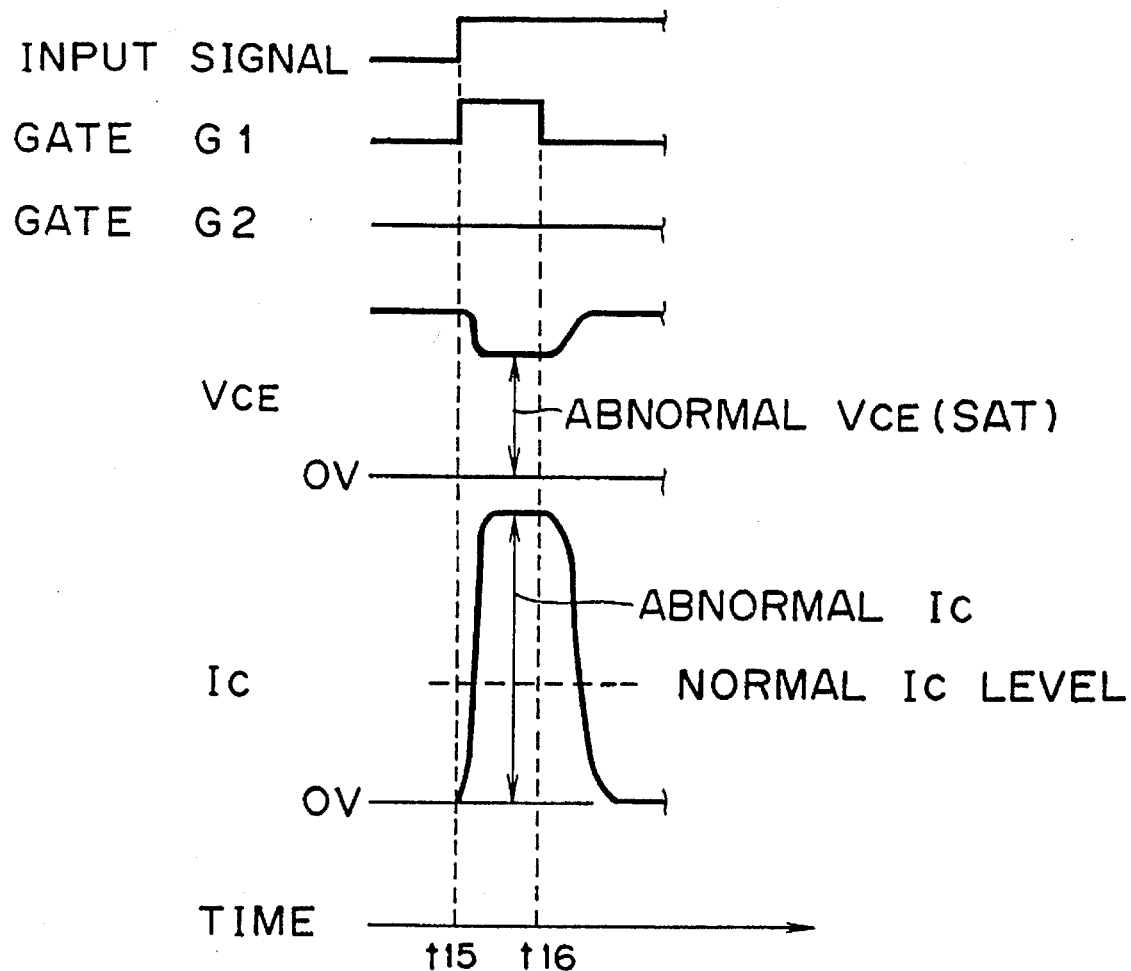
Figure 35:
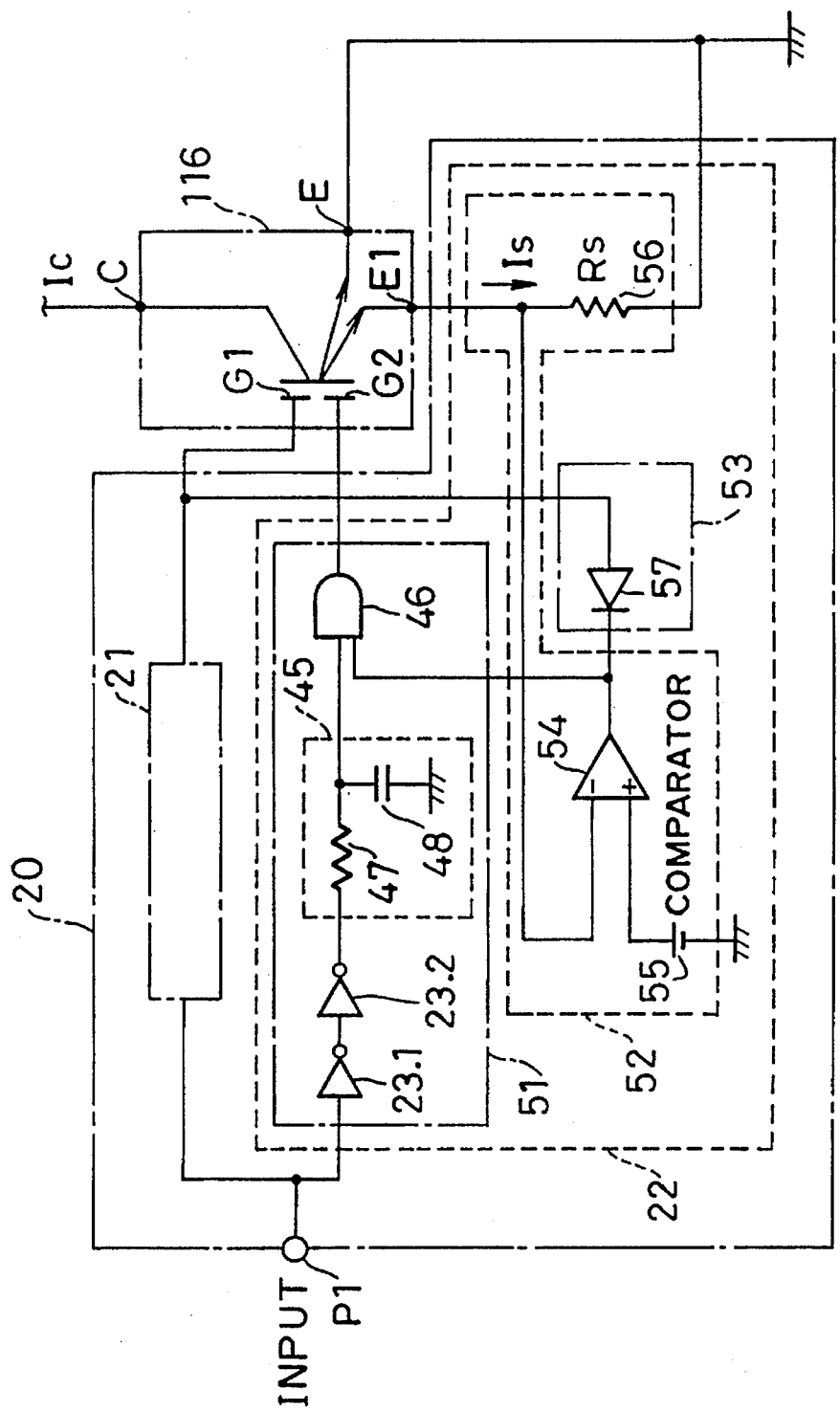
Figure 36:
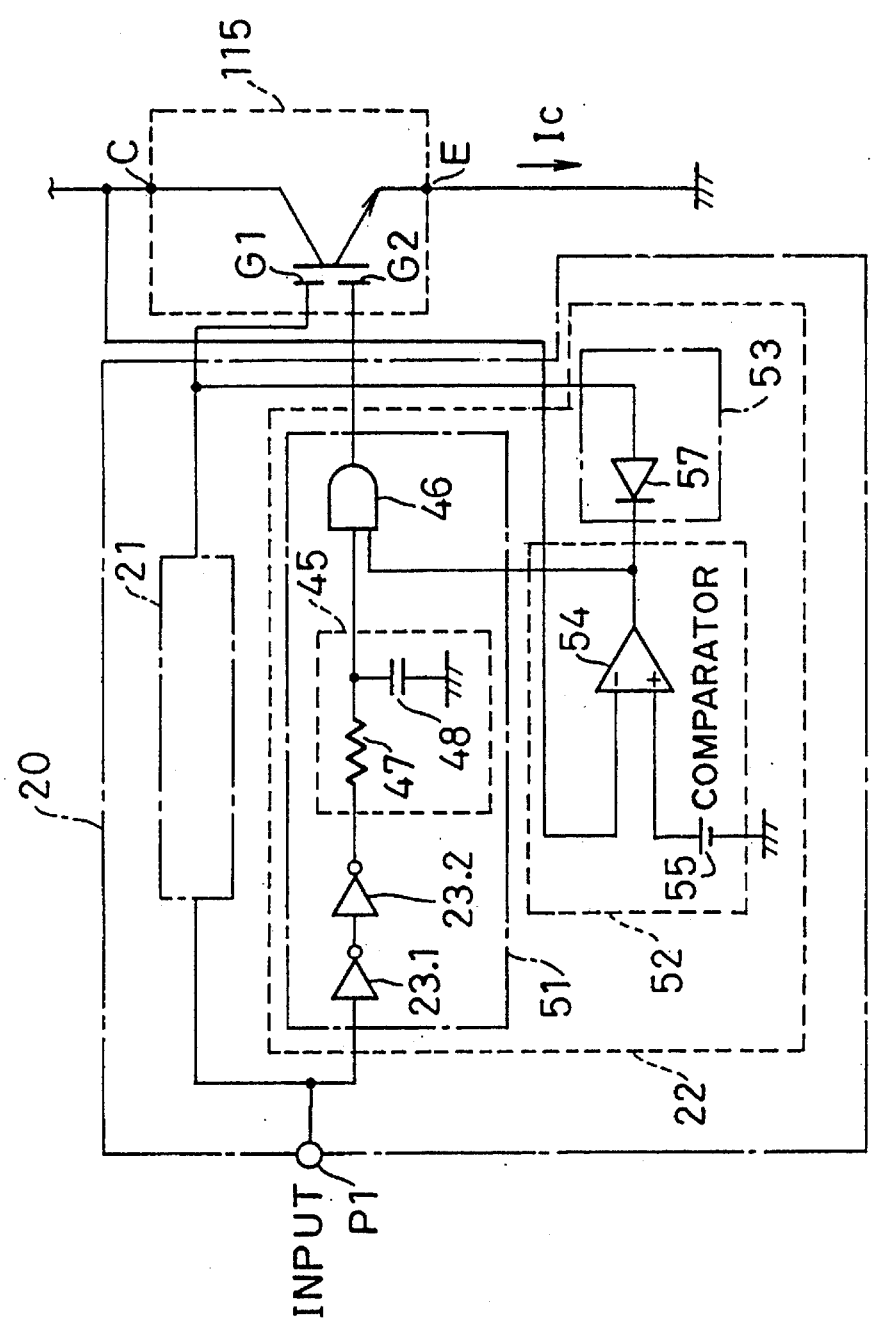
Figure 37:
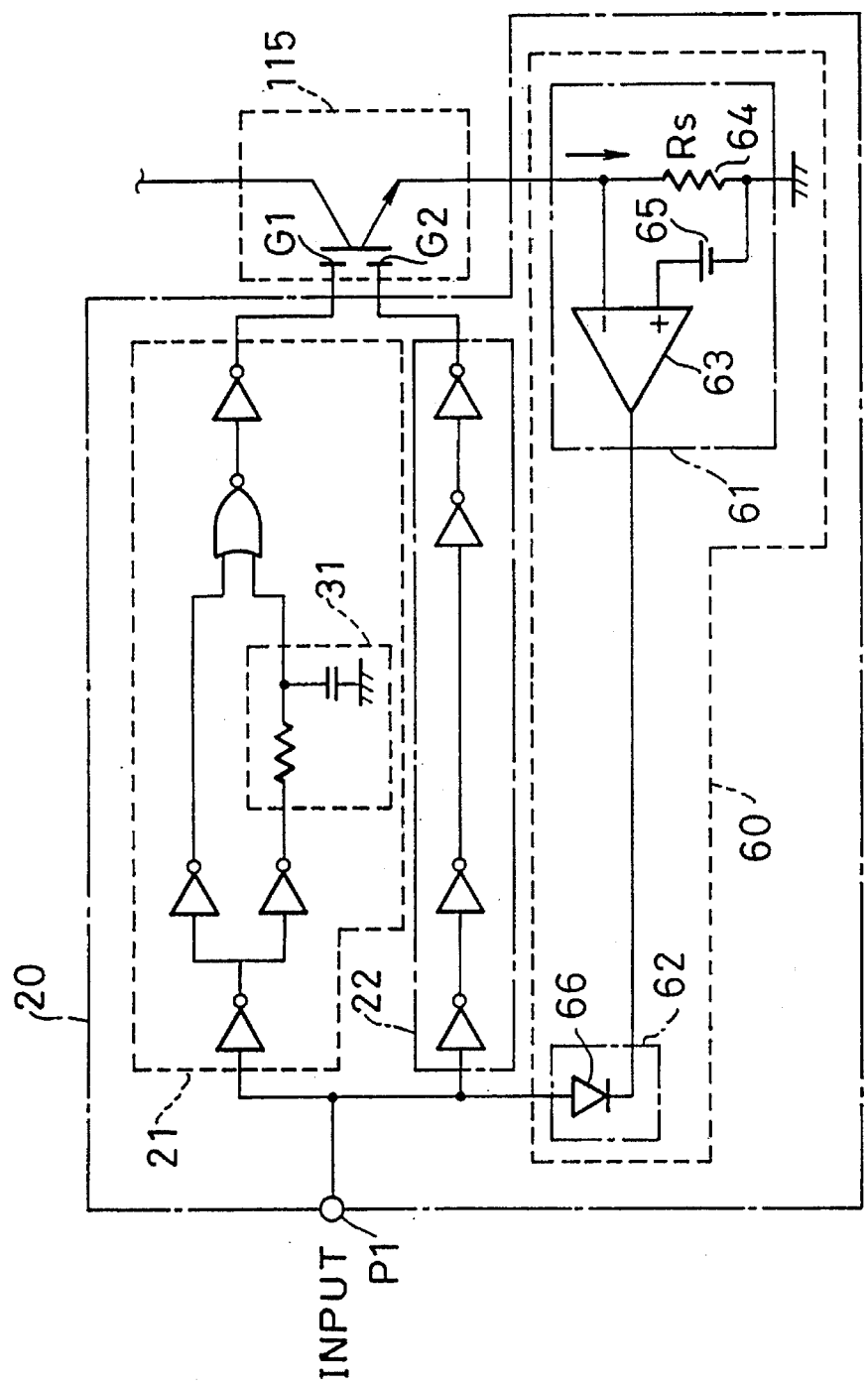
Figure 38:
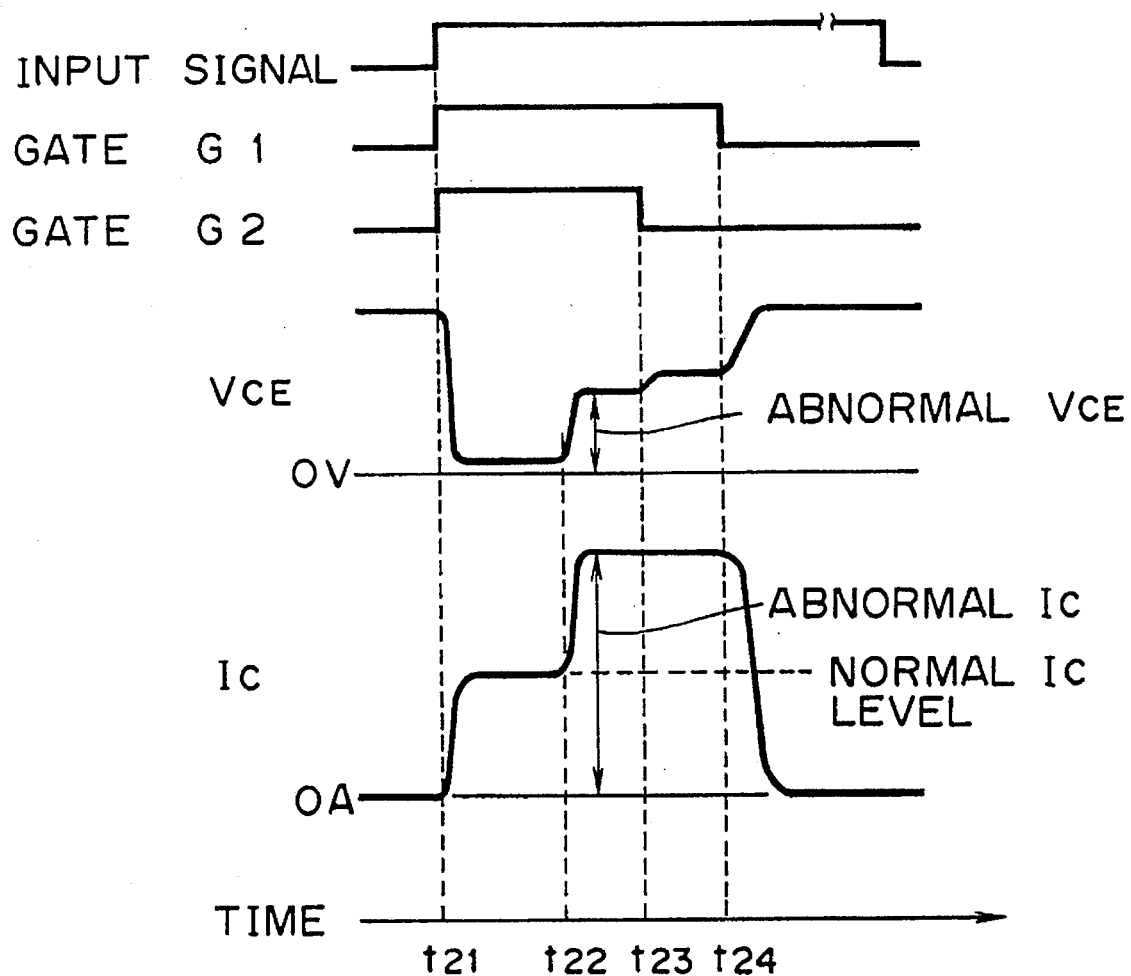
Figure 39:
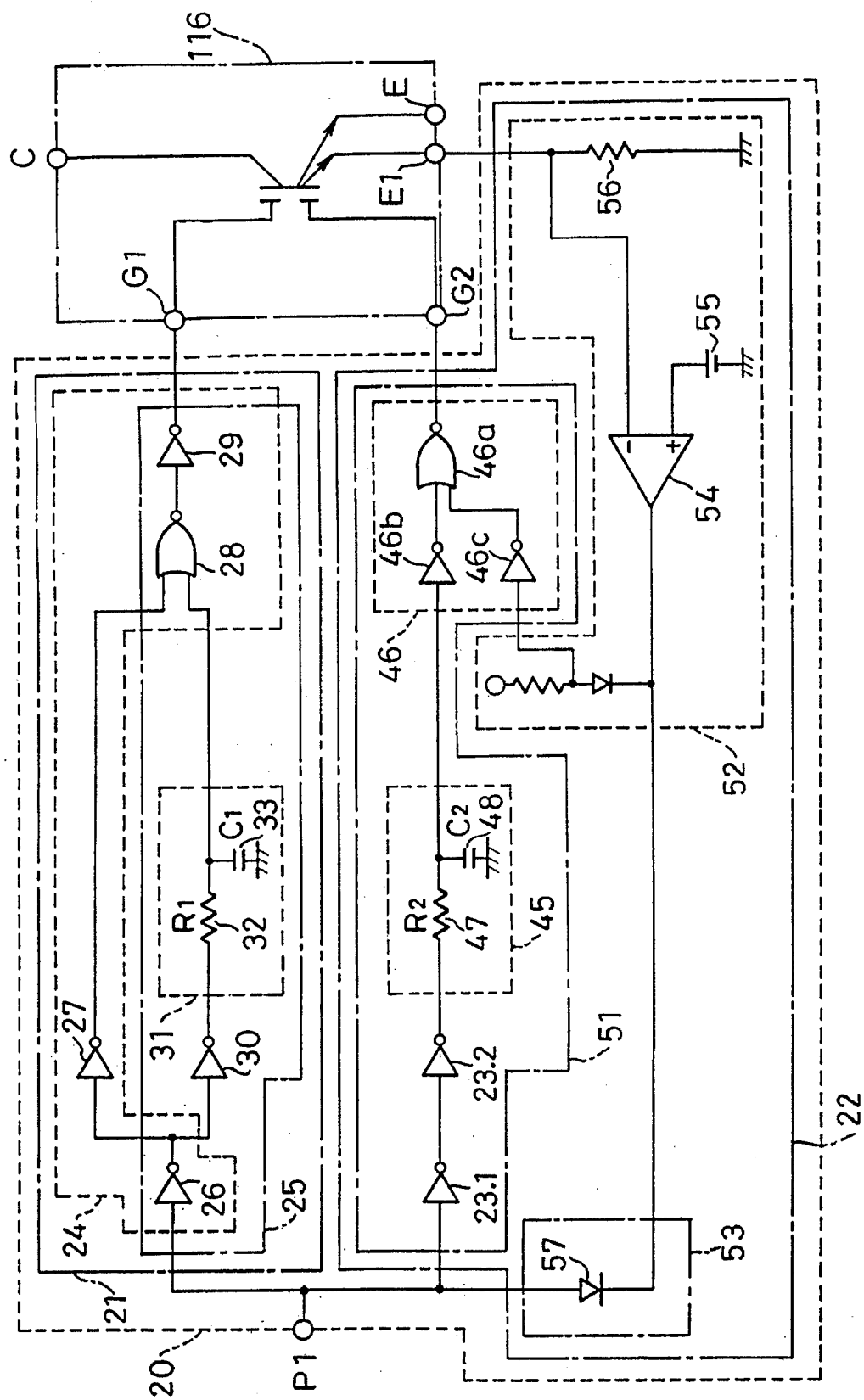
Figure 40:
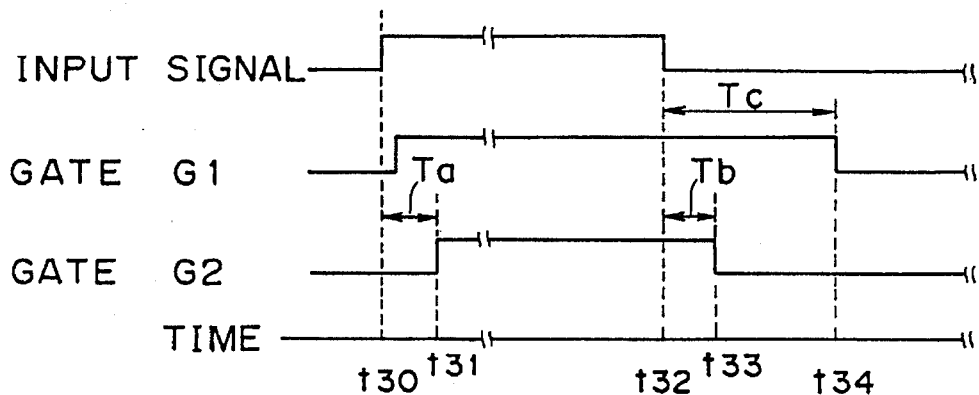
Figure 41:
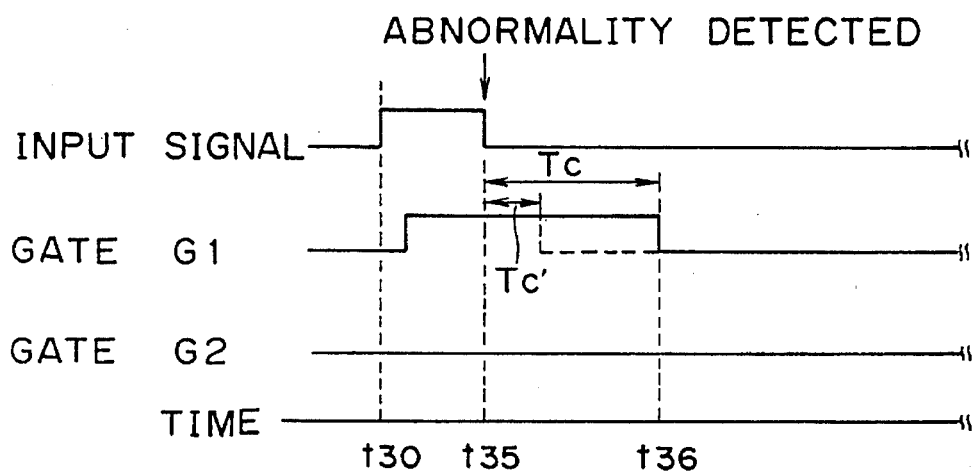
Figure 42:
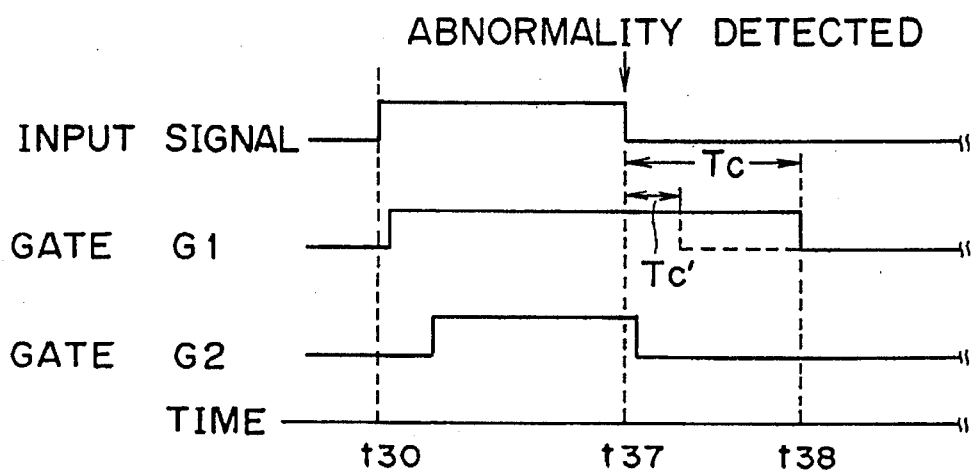
Figure 43:
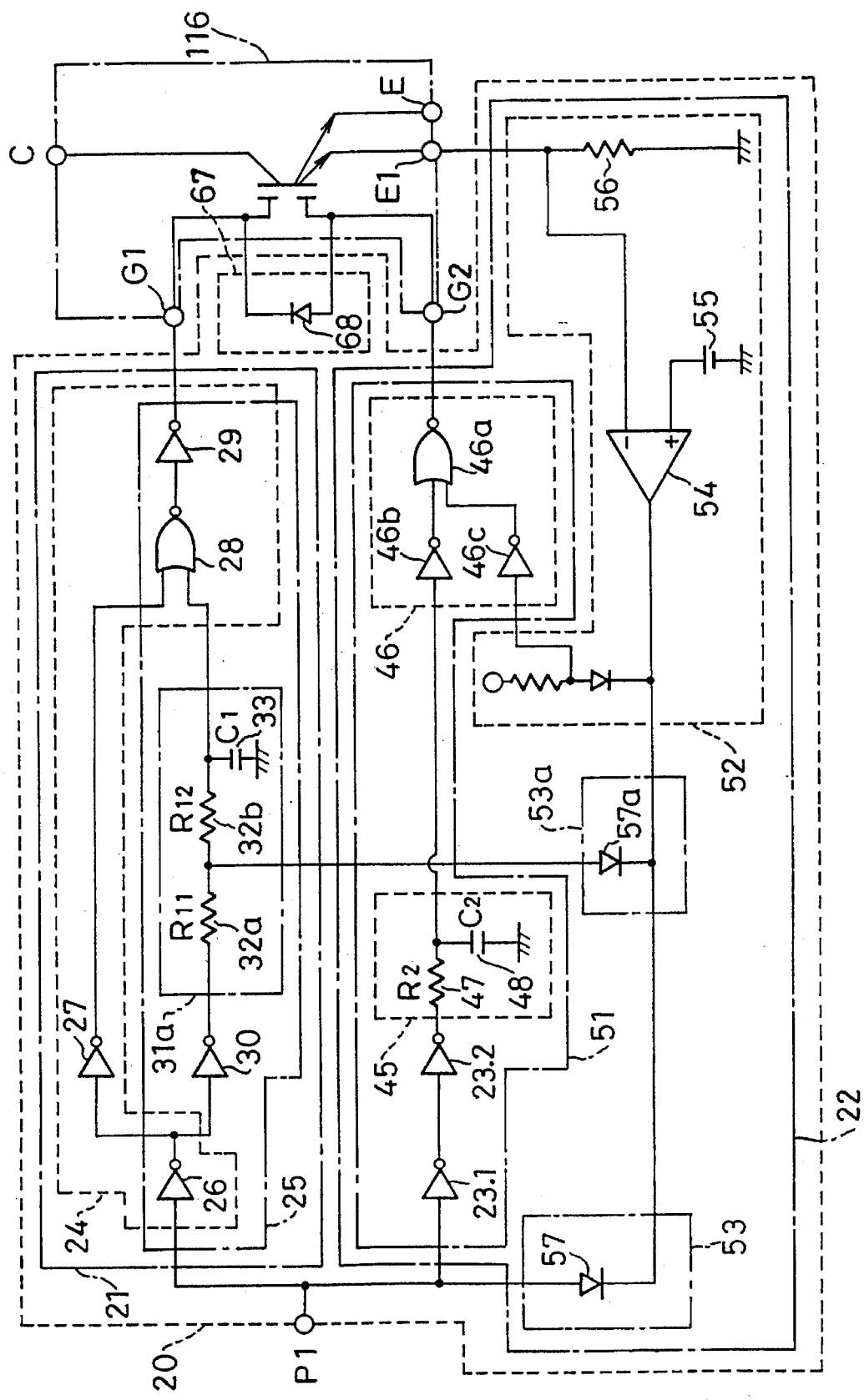
Figure 44:
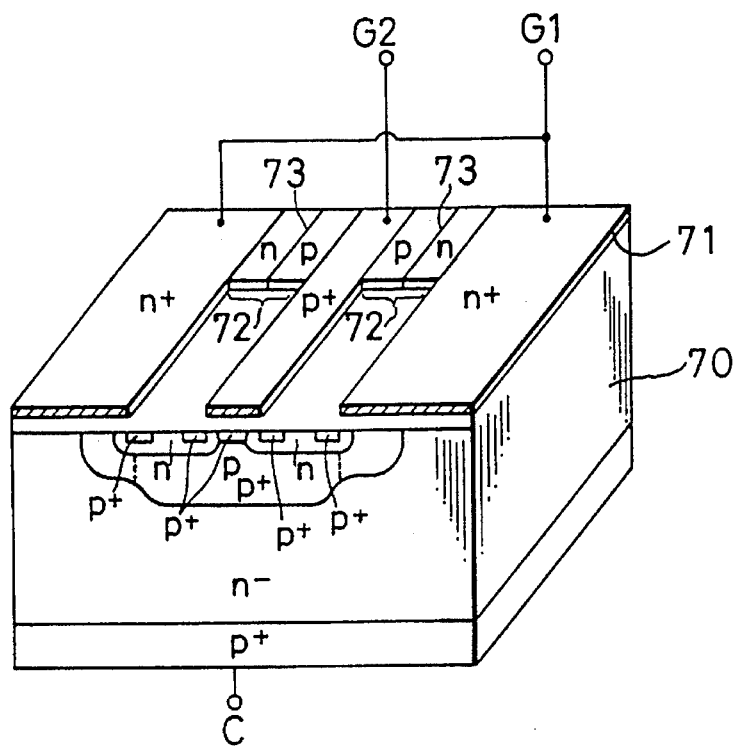
Figure 45:
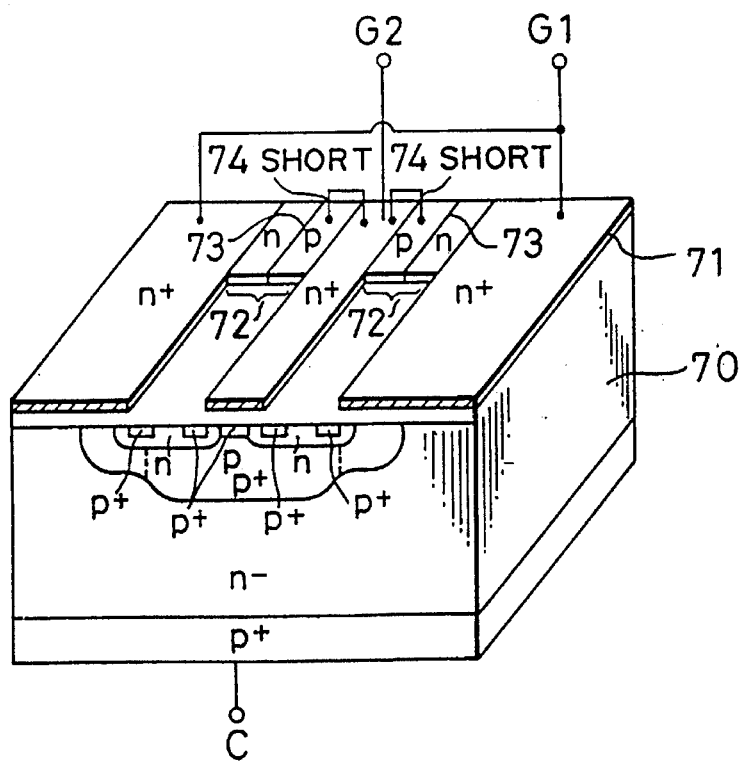
Figure 46:
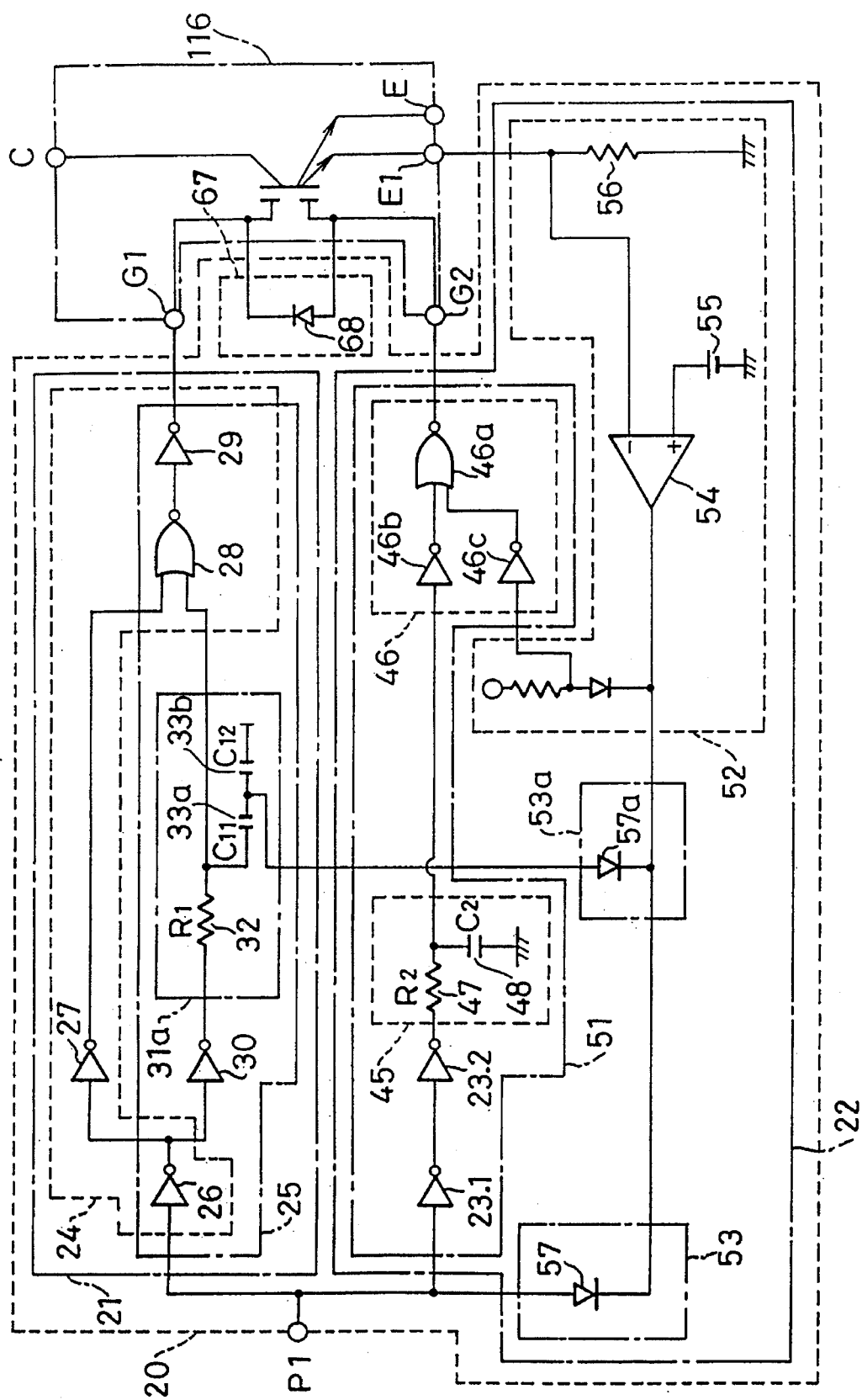

MCT;

FIG. 4 is a cross sectional view showing an embodiment of the structure of IGBT;

FIG. 5 is a waveform chart illustrating the turn-off waveform of the IGBT;

FIG. 6 is a cross sectional view showing the structure of a semiconductor device according to Embodiment I of the present invention;

FIG. 7 is a plan view showing the structure of the semiconductor device according to Embodiment 1;

FIG. 8 is a circuit diagram showing the equivalent circuit of the semiconductor device according to Embodiment 1;

FIG. 9 is a diagram for explaining the operating condition of the semiconductor device according to Embodiment 1;

FIG. 10A is a cross sectional view of the semiconductor device according to Embodiment 1, showing the passage of current flowing through the device in the thyristor state;

FIG. 10B is a cross sectional view of the same semiconductor device, showing the passage of current flowing through the device in the transistor state;

FIG. 11A is a graph illustrating the carrier density of the semiconductor device according to Embodiment 1 which is in the thyristor state;

FIG. 11B is a graph illustrating the carrier density of the same semiconductor device which is in the transistor state;

FIG. 12 is a graph illustrating the output characteristics of the semiconductor device according to Embodiment 1;

FIG. 13 is a graph illustrating the switching characteristics of the semiconductor device according to Embodiment 1;

FIG. 14 is a graph illustrating the relation between the dose of the p-base layer of the semiconductor device according to Embodiment 1 and the ON-state voltage drop in the thyristor state or the latch-up current in the transistor state;

FIG. 15 is a graph illustrating the relation between the dose of the n-emitter layer of the semiconductor device according to Embodiment 1 and the ON-state voltage drop in the thyristor state or the latch-up current in the transistor state;

FIG. 16 is a cross sectional view showing the structure of a semiconductor device according to Embodiment 2 of the present invention;

FIG. 17 is a graph illustrating the relation between the dose of the $p^+$-well formed through the surface diffusion technique and the latch-up current in the transistor state, observed on the semiconductor device according to Embodiment 2;

FIG. 18 is a graph illustrating the relation between the dose of the $P^+$-well formed through the surface diffusion technique and the ON-state voltage drop in the transistor state, observed on the semiconductor device according to Embodiment 2;

FIG. 19 is a graph illustrating the relation between the $P^+$-well formed as a buried layer and the ON-state voltage drop in the thyristor state or the latch-up current in the transistor state, observed on the semiconductor device according to Embodiment 2;

FIG. 20 is a cross sectional view showing the relative relation between the edge position X of the diffusion window of the $P^+$-well formed as a buried layer and the gate electrode, observed on the semiconductor device according to Embodiment 2;

FIG. 21 is a graph illustrating the relation between the edge position X of the diffusion window and the ON-state voltage drop in the thyristor state or the latch-up current in the transistor state observed on the semiconductor device according to Embodiment 2;

FIG. 22 is a cross sectional view showing the structure of the semiconductor device according to Embodiment 3 of the present invention;

FIG. 23 is a graph illustrating the relation between the surface concentration of the $n^+$-well layer and the ON-state voltage drop in the thyristor state or the latch-up current in the transistor state, observed on the semiconductor device according to Embodiment 3;

FIG. 24 is a graph illustrating the relation between the diffusion depth of the $n^+$-well and the ON-state voltage drop in the thyristor state or the latch-up current in the transistor state, observed on the semiconductor device according to Embodiment 3;

FIG. 25 is a cross sectional view illustrating the gate length $L_{g1}$ of the first gate electrode, the gate length $L_{g2}$ of the second gate electrode and the contact length LE of the emitter electrode, in the semiconductor device according to Embodiment 3;

FIG. 26 is a graph illustrating the relation between the gate length $L_{g1}$ and the latch-up current in the transistor state or the ON-state voltage drop in the transistor state, observed on the semiconductor device according to Embodiment 3;

FIG. 27 is a graph illustrating the relation between the gate length $L_{g2}$ and the latch-up current in the transistor state or the ON-state voltage drop in the thyristor state, observed on the semiconductor device according to Embodiment 3;

FIG. 28 is a graph illustrating the relation between the contact length $L_E$ of the emitter electrode and the latch-up current in the transistor state or the ON-state voltage drop in the thyristor state, observed on the semiconductor device according to Embodiment 3;

FIG. 29 is a circuit diagram showing the structure of a control device according to an embodiment 4 of the present invention;

FIG. 30 is a timing chart showing the operation of the control device shown in FIG. 29;

FIG. 31 is a circuit diagram showing the structure of a control device according to an embodiment 5 of the present invention;

FIG. 32 is a circuit diagram showing the structure of a control device according to an embodiment 6 of the present invention;

FIG. 33 is a timing chart showing the operation of the control device shown in FIG. 32 in a normal condition of the double gate semiconductor device;

FIG. 34 is a timing chart showing the operation of the control device shown in FIG. 32 in an abnormal condition of the double gate semiconductor device;

FIG. 35 is a circuit diagram showing a control device of a different structure according to the embodiment 6 of the present invention;

FIG. 36 is a circuit diagram showing a control device of a different structure according to the embodiment 6 of the present invention;

FIG. 37 is a circuit diagram showing the structure of a control device according to an embodiment 7 of the present invention;

FIG. 38 is a timing chart showing the operation of the control device shown in FIG. 37;

FIG. 39 is a circuit diagram showing the structure of a control device according to an embodiment 8 of the present invention;

FIG. 40 is a timing chart showing the operation of the control device shown in FIG. 39 in a normal condition of the double gate semiconductor device;

FIG. 41 is a timing chart showing the operation of the control device shown in FIG. 39 when an abnormality occurs at turning on the double gate semiconductor device;

FIG. 42 is a timing chart showing the operation of the control device shown in FIG. 39 when an abnormality occurs in the thyristor condition of the double gate semiconductor devices;

FIG. 43 is a circuit diagram showing the structure of a control device according to an embodiment 9 of the present invention;

FIG. 44 is a perspective illustration showing a condition of a diode formed on the surface of a double gate MOS power device of the control device shown in FIG. 43;

FIG. 45 is a perspective illustration showing a condition of a diode formed as in FIG. 44 where the diode and a gate electrode is connected by aluminum deposition wiring; and FIG. 46 is a circuit diagram showing another example of the structure of the control device according to the embodiment 9 of the present invention.

DETAILED DESCRIPTION OF PREFERRED EMBODIMENTS

Embodiment 1

FIG. 6 is a cross sectional view taking along the line A-A' of the plan view shown in FIG. 7 and shows the cell structure of a semiconductor device equipped with a double gate comprising first and second gates according to this embodiment 1. The semiconductor device according to embodiment 1 comprises a $p^+$-substrate, as a collector layer 2, provided thereon with a collector electrode 1 formed on the back face thereof and an $n^-$-base layer 3 which is formed on collector layer 2 through the epitaxial growth technique or the like. A p-base layer 4 as a well-like p or $p^+$-diffusion layer is formed on the surface of $n^-$-base layer 3. Further, emitter layers 5a and 5b are formed on the inner surface of this p-base layer 4 as two n-type wells. In addition, two $p^+$-emitter layers 6a and 6b are formed on the inner surfaces of these n-emitter layers 5a and 5b respectively. An emitter electrode 7 is connected to these two $p^+$-emitter layers 6a and 6b and to n-emitter layers 5a and 5b. Moreover, a first gate electrode 11 (common gate electrode) which constitutes a first MOSFET 13n and a third MOSFET 13p are formed in such a manner that it covers $p^+$-emitter layer 6a and that it extends over the surfaces of n-emitter layer 5a or 5b, p-base layer 4 and $n^-$-base layer 3, through a gate-oxide film 8. On the other hand, a second gate electrode 12 which constitutes a second MOSFET 14 is formed in such a manner that it covers $p^+$-emitter layer 6b and that it extends over the surface of n-emitter layer 5a or 5b and p-base layer 4, through a gate-oxide film 8. First and second gate electrodes 11 and 12 are separately and independently formed and each has such a structure that a gate-control voltage can independently be applied thereto. More specifically, as shown in, for instance, FIG. 7, first and second gate electrode 11 and 12 are formed in a threadlike shape.

Since the structures of the devices with respect to these two n-emitter layers 5a and 5b are identical to one another, the device will be explained below with reference to only n-emitter layer 5a. MOSFET's 13 comprising gate electrode 11 can be divided into an n-channel type first MOSFET 13n which comprises n-emitter layer 5a, p-base layer 4 and $n^-$-base layer 3 and a p-channel type third MOSFET 13p which comprises $p^+$-emitter layer 6a, n-emitter layer 5a and p-base layer 4. On the other hand, second MOSFET 14 comprising gate electrode 12 is a p-channel type MOSFET.

FIG. 8 shows the equivalent circuit of this device. In this device, n-emitter layer 5a, p-base layer 4 and $n^-$-base layer 3 form an npn transistor Qnpn. In addition, p-base layer 4, $n^-$-base layer 3 and $p^+$-collector layer 2 form a pnp transistor Qpnp. Thus, these transistors Qnpn and Qpnp form a thyristor 15. There are depicted two thyristors around a collector 1 and an emitter 7 positioned at the center of the equivalent circuit shown in FIG. 8, but they are separately shown only for convenience's sake and these thyristors are identical to one another.

In addition to these transistors Qnpn and Qpnp, first MOSFET 13m is designed to connect the collector of the transistor Qnpn and the base of the transistor Qpnp to an emitter electrode 7. Moreover, third MOSFET 13p is designed to connect the base of the transistor Qnpn to emitter electrode 7 through a $p^+$-emitter layer 6a. On the other hand, second MOSFET 14 is designed to connect the base of the transistor Qnpn to emitter electrode 7 through a $p^+$-emitter layer 6b.

In this device having the structure discussed above, if high voltages are applied to a gate electrode 11 and second gate electrode 12, first MOSFET 13n is in the ON state while second MOSFET 14 and third MOSFET 13p are still in the OFF state. More specifically, the surface of n-emitter layer 5a right under gate electrode 11 serves as an $n^+$-accumulation layer, the surface of p-base layer 4 serves as an n-inversion layer and emitter electrode 7 is connected to $n^-$-base layer 3 through n-emitter layer 5a, $n^+$-accumulation layer existing on the surface of the emitter layer and the n-inversion layer existing on the surface of p-base layer 4. Therefore, electrons are injected, through emitter electrode 7, into $n^-$-base layer 3 serving as a drift region and, in response thereto, holes present in $p^+$-collector layer 2 are likewise injected. This means that the pnp transistor Qpnp is in the ON state. moreover, the hole current of this transistor Qpnp serves as a base current of the transistor Qnpn which comprises n-emitter layer 5a, p-base layer 4 and $n^-$-base layer 3 and, therefore, the transistor Qnpn is in the ON state. In other words, thyristor 15 comprising $p^+$-collector layer 2, $n^-$-base layer 3, p-base layer 4 and n-emitter layer 5a is thus in the ON state, carriers are present in the device in a high concentration and accordingly, the device has a low resistance. As has been discussed above, if high voltages are applied to gate electrode 11 and gate electrode 12 of this device, only first MOSFET 13n is in the ON state, majority carriers (electrons) are injected into $n^-$-base layer 3 and correspondingly, a thyristor state can be obtained as in the case of the MCT discussed above. Therefore, this device serves as a power device having a low ON-state voltage drop. In this respect, first MOSFET 13n serves as a MOSFET for putting the thyristor in operation.

At this ON state of the thyristor if a negative potential is applied to gate electrode 12 of second MOSFET 14 while maintaining first gate electrode 11 at a high potential, second MOSFET 14 is in the ON state. In other words, the surface of n-emitter layer 5a just under gate electrode 12 is inverted into a p-Type one (layer) and a short circuit is formed between p-base layer 4, the surface of n-emitter layer 5a which is inverted into a p-type one (layer) and $p^+$-emitter layer 6b. For this reason, the hole current injected through $p^+$-collector layer 2 is discharged to emitter electrode 7 through p-base layer 4 and $p^+$-emitter layer 6b. Therefore, the transistor Qnpn comprising n-emitter layer 5a, p-base layer 4 and n-base layer 3 is in the OFF state. As a result, the thyristor operation is disappeared and a transistor state in which only the transistor Qpnp comprising p-base layer 4, $n^-$-base layer 3 and $p^+$-collector layer 2 is established. This state is identical to the operating state of an IGBT explained above and accordingly, this corresponds to the state in which the density of carriers present in the device is reduced. Thus, there can be reduced the time required for sweeping carriers during the OFF state observed when a negative potential, first MOSFET 13n is in the OFF state and third MOSFET and 13p is in the ON state. More specifically, the injection of majority of carriers (electrons) into $n^-$-base layer 3 is interrupted, second MOSFET 14 extracts majority of carriers (holes) from p-base layer 4. Simultaneously, p-base layer 4 is connected to $p^+$-emitter layer 6a through the inversion layer formed on the surface of n-emitter layer 5a and accordingly, majority carriers (holes) are extracted from p-base layer 4. Therefore, holes remaining in p-base layer 4 are rapidly extracted by emitter electrode 7 through the action of second MOSFET 14 and third MOSFET 13p and correspondingly the turnoff time can further be shortened. In this respect, third MOSFET 13p extracts holes near the periphery of p-base layer 4 while second MOSFET 14 extracts holes present at the center of p-base layer 4.

FIG. 9 shows gate-control voltages applied to first gate electrodes 11 and second gate electrode 12. As Shown in FIG. 9, if high voltages are first applied to gate electrodes 11 and 12, this device is in the ON state and the device which is in a thyristor state shows a low ON-state voltage drop on the order of about 1.5 V. On the other hand, the device is transferred to a transistor state when a negative potential is applied to gate electrode 12 while a high voltage is still applied to gate electrode 11. When, at this state, a negative potential is applied to gate electrode 11 while maintaining gate electrode 12 at a negative potential, this device is in the OFF state within a short turn-off time on the order of about 1.0μ sec. Moreover, the transfer of the thyristor state to the transistor state is completed within a time of not more than about 0.5μ sec. As has been explained above, this device is in the ON state at a low ON-state voltage drop like MCT and the device is in the OFF state within a short turn-off time like an IGBT. Thus, this device serves as a power device having a low switching loss even in the high frequency applications through the repeated alternating switching between the thyristor state and the transistor state as shown in FIG. 9.

The current flow and carrier distribution in the thyristor and transistor states will be explained below. FIGS. 10A and 10B are diagrams showing current flows in the thyristor state and the transistor state respectively. In the thyristor state (FIG. 10A), a hole current and an electron current are united and pass through, in order, p--base layer 4, $n^-$-base layer 3 and emitter electrode 7 to establish a thyristor mode. On the other hand, in the transistor state (FIG. 10B), a hole current passes through $p^-$-base layer 4 and discharged into emitter electrode 7 through MOSFET 14, while an electron current cases through $n^-$-base layer 3 and discharged into emitter electrode 7 through MOSFET 13n as in the case of an IGBT.

FIGS. 11A and 11B are diagrams showing carrier densities in the thyristor and transistor states respectively. These figures show results obtained by simulating hole density 121 and electron density 122 over a region extending from the surface of the semiconductor device according to this embodiment, on which the emitter electrode is formed, to the back face thereof on which the collector electrode is formed. In these figures, the carrier density of holes or electrons is plotted as ordinate and the distance form the surface of the semiconductor device as abscissa. FIG. 11A shows the carrier density of the device which is in the thyristor state and the densities of both carriers distributing on the region extending form the surface of the device to p-base layer 4 and $n^-$-base layer 3 are high levels on the order $10^{16}$ to $10^{17}/CM^3$. Incidentally, $p^+$-collector layer 2 which is the back face of the semiconductor device has a high density 121 of holes as major carriers and a low electron density 122, which in the transistor state as shown in FIG. 11B, the carrier density is reduced to about $10^{14}/CM^3$ in the vicinity of the boundary between p-base layer 4 and n--base layer 3. The thyristor state is transferred to the transistor state in this way and accordingly, the carrier density within the device is reduced. This allows the shortening of the turn-off time. Thus, the turn-off time of this device can be shortened as in the case of an IGBT.

FIG. 12 shows the results obtained by simulating the ON-state voltage drop in this device. If the ON-state voltage drop Yon is assumed to be the collector - emitter voltage VCE at which the collector current Ic reaches 200 A/cm². Von in the thyristor state is about 1.0 V while that in the transistor state is about 1.8 V. Thus, this device makes it possible to control the ON-state voltage drop to a low level by realizing a thyristor state when the device is put in operation.

FIG. 13 shows gate voltages of gates 11 and 12 concerning the ON-operation and OFF-operation of this device and variations in the collector current Ic and the collector - emitter voltage VCE of this device. The operation of this device in each state is herein omitted since it has been discussed above in detail, but when a high potential is applied to gates 11 and 12, this device undergoes a thyristor operation at a fast speed corresponding to a turn-off time on the order of 0.3μ sec and establishes a low ON-state voltage drop. When a negative voltage is then applied to gate 12, the device is transferred from the thyristor state to the transistor state and this transfer is completed within a time not more than about 0.5μ sec. Thereafter, turn-off can be performed within a short fall time on the order of 0.3μ sec.

As has been explained above, the device according to this embodiment is a completely novel device which can realize a thyristor state corresponding to an MCT and a transistor state corresponding to an IGBT through the use of two independent gate electrodes 11 and 12. As techniques for imparting high quality to devices such as MCT and IGBT, there have been proposed: a method for the speeding up of these devices and for reducing the electric power required for driving the same through the use of MOS independent gate devices; a method for reducing the ON-state voltage drop while making use of a thyristor structure; and a method for imparting high quality to these devices through combinations of a variety of device structures. However, there has not yet been developed any device which can substantially reduce the ON-state voltage drop and can simultaneously improve the trade off of the switching time significantly. On the contrary, the device of the present invention has been developed on the basis of the new concept such that one device is transferred to two different states each favorable for the ON or OFF state thereof. Thus, the present invention can provide a high quality power device having a low ON-state voltage drop comparable to an MCT and a short switching time comparable to an IGBT.

With respect to these elements having the foregoing structure, it is very important to optimize the impurity doping distribution in both p-base layer 4 and n-emitter layers 5a and 5b (5). More specifically, when first MOSFET 13n is in the ON state, in the thyristor state, the amount of electrons injected from n-emitter layer 5 into p-base layer 4 is greatly affected by the amount of impurity present in p-base layer 4 and n-emitter layer 5. In other words, an increase in the amount of impurity in n-emitter layer 5 accompanies an exponential increase in the amount of the injected electrons, while an increase in the amount of impurity present in p-base layer 4 substantially limits the amount of electrons injected into p-base layer 4. For this reason, the ON-state voltage drop of the thyristor can be reduced by increasing the amount of impurity present in n-emitter layer 5 and simultaneously decreasing the amount of impurity in p-base layer 4. On the other hand, the hole current flows through the lower part of n-emitter layer 5 in the transistor state as shown in FIG. 10B. Therefore, if the impurity concentration in p-base layer 4 is low, a latch-up phenomenon is caused. In the latch-up phenomenon, the bipolar transistor Qnpn comprising n-emitter layer 5, p-base layer 4 and n-base layer 3 is in the ON state due to a voltage drop which results from a parasitic resistance of p-base layer 4 and the transistor state is transferred to a thyristor state. Therefore, the latch-up phenomenon observed during the transistor state can be suppressed by increasing the impurity concentration in p-base layer 4. For this reason, the impurity concentrations in p-base layer 4 and n-emitter layer 5 must be optimized so that the ON-state voltage drop in the thyristor state is maintained at a low level and simultaneously the latch-up phenomenon during the transistor state can be eliminated.

The effect of the impurity-distribution in p-base layer 4 on characteristics of the element was evaluated by device-simulation using a semiconductor substrate composed of a p-type collector layer 2 having a resistivity of $0.01\Omega\cdot cm$; a $n^+$-type buffer layer formed on the p-type collector layer 2 and having a resistivity of $0.1\Omega\cdot cm$ and a thickness of 20 μm; and an n-type layer 4 formed by the epitaxial growth method on the $n^+$-buffer layer and having a resistivity of $40\Omega\cdot cm$ and a thickness of 60 μm. FIG. 14 is a graph illustrating the relation between the dose of p-base layer 4 and the ON-state voltage drop in the thyristor state or the latch-up current (the controllable current observed until the latch-up phenomenon take place) in the transistor state, observed when an n-emitter layer 5 having a surface concentration of $1\times10^{17}$ cm$^{-3}$ and a diffusion depth of 1 μm is formed. In this case, the diffusion depth of p-base layer 4 is 8 μm. As seen from this figure, if the dose of p-base layer 4 is lowered, the value of the ON-state voltage drop $V_{ON}$ is reduced, but the latch-up current $I_L$ is likewise reduced and, therefore, the latch-up phenomenon is liable to take place. Since the use of the device as a power device requires a latch-up current $I_L$ of at least about 300 Acm$^{-2}$, the lower limit of the dose for p-base layer 4 is $2\times10^{13}$ cm$^{-2}$. If the dose is not less than the lower limit, a sufficient latch-up current can be ensured and a device having a high current capacity can be obtained. On the other hand, if the dose is too high, the ON-state voltage drop $V_{ON}$ in the thyristor state increases. If the ON-state voltage drop of the device of this Embodiment is assumed to be 1.5 V while taking into consideration the fact that the ON-state voltage drop of an IGBT is about 1.7 V, the upper limit of the dose for p-base layer 4 is $1\times10^{14}$ cm$^{-2}$. In addition, if the dose of p-base layer 4 is equal to $1\times10^{14}$ cm$^{-2}$, the threshold voltage of first MOSFET 13n exceeds 10 V and this leads to an increase of the gate-control voltage. Thus, a device having a high current capacity (sufficient resistance to latch up) and a low ON-state voltage drop can be realized by limiting the dose of p-base layer 4 to not less than $2\times10^{13}$ cm$^{-2}$ and not more than $1\times10^{14}$ cm$^{-2}$.

FIG. 15 is a graph illustrating the relationship between the dose of n-emitter layer 5 and the ON-state voltage drop in the thyristor state or the latch-up current (the controllable current observed until the latch-up phenomenon takes place) in the transistor state, observed when a p-base layer 4 having a dose of $1.25\times10^{13}$ cm$^{-2}$ is formed. As seen from this figure, if the dose of n-emitter layer 5 is small, the ON-state voltage drop $V_{ON}$ becomes high, while if it is too high, the latch-up current $I_L$ is reduced. When the ON-state voltage drop is set at 1.5 V, the dose of n-emitter layer must be not less than $1.25\times10^{13}$ cm$^{-2}$ as compared with that of p-base layer, while if latch-up current $I_L$ is set at 300 Acm$^{-2}$, the dose of n-emitter layer must be not more than $1\times10^{14}$ cm$^{-2}$. Preferably, the dose of the n-emitter layer is equal to or greater than the p-base layer, but not more than $1\times10^{14}$ cm$^{-2}$. If the dose thereof is too high, the threshold voltage of second MOSFET 14 and third MOSFET 13p exceed 10 V and this leads to an increase of the gate-control voltage. Thus, the dose of n-emitter layer 5 is not less than that of p-base layer 4 and not more than $1\times10^{14}$ cm$^{-2}$.

Embodiment 2

FIG. 16 shows the structure of a semiconductor device equipped with a double gate comprising first and second gates according to the second embodiment of the present invention. The structure and operation of the semiconductor device according to this embodiment are approximately identical to those of the semiconductor device according to the first embodiment and, therefore, parts common thereto are represented by the same reference numerals and the explanation thereof is herein omitted. The semiconductor device according to the second embodiment likewise comprise a $p^+$-substrate as a collector layer 2 on the back face of which a collector electrode 1 is formed, an $n^-$-base layer 3 formed on the collector layer and a p-base layer 4 formed on the surface of base layer 3. An $n^+$-buffer layer may be placed between collector layer 2 and base layer 3. In the device of this embodiment, base layer 4 comprises a relatively deep $p^+$-type well 4a positioned at the central portion and a $p^+$-type peripheral layer (channel portion) 4b which is thinner than the $p^+$-type well and formed around the $p^+$-type well. As in embodiment 1, n-emitter layers 5a and 5b, p-emitter layers 6a and 6b are formed on the inner surface of this p-base layer 4. Further, a first gate electrode 11 constitutes first and third MOSFET's 13n and 13p, and a second gate electrode 12 constitutes a second MOSFET 14. In the device of this embodiment, a counter-doping layer 9 which is doped with an $n^+$-type dopant to reduce the channel length is formed on the surface of $n^-$-base layer 3 which constitutes first MOSFET 13n. A high-concentration doping layer 10 which is doped with a $p^+$-type dopant is formed on the surface of p-base layer 4 behind gate electrode 12 constituting second MOS 14.

In the device of this embodiment having such a structure, if a voltage is applied to a gate electrode 11 of MOSFETs 13 and gate electrode 12 of second MOSFET 14, an emitter electrode 7 is electrically connected to $n^-$-base layer 3 through n-emitter layer 5a, an $n^+$-accumulation layer formed on the emitter layer, an n-inversion layer formed on the surface of p-base layer 4 and counter-doping layer 9. Thus, the channel length of an n-type channel formed during the ON state can be reduced by the action of counter doping layer 9 when a thyristor 15 (FIG. 7) is in the ON state. More specifically, the turn-off and turn-off characteristics of the device of this embodiment can be improved because of the enhanced operation speed of first MOSFET 13n.

Moreover, if a negative voltage is applied to gate electrode 12 of second MOSFET 14 starting from this ON state, the surface of n-emitter layer 5a just under gate electrode 12 is inverted to p-type one (layer) and a short circuit is formed between p-base layer 4, p$^+$-high concentration doping layer 10, the surface of n-emitter layer 5a which is inverted to p-type one (layer) and p$^+$-emitter layer 6a. As a result, the thyristor operation disappears and the device is transferred to its transistor state, like the operating condition of an IGBT, in which only the transistor Qpnp operates. The transistor comprises p-base layer 4, n$^-$-base layer 3 and p$^+$-collector layer 2. Since the device of this embodiment comprises -high concentration doping layer 10, a large hole current can be obtained at an instance when the thyristor state is transferred to the transistor state. Thus, the time required for transferring the thyristor state to the transistor state can be shortened.

Incidentally, p$^+$-type well 4a is formed for the following reason. The incorporation of $^{p+}$-type well 4a into this device makes it possible to increase the level of the latch-up current during transistor operation and to increase the controllable current. In this respect, if the dose is too high, the ON-state voltage drop of the thyristor is increased. Therefore, the dose must be optimized. The dose of p$^+$-type well 4a will hereinafter be closely examined in cases wherein it is formed through surface-diffusion or it is formed as a buried layer.

First, it is closely examined in the case wherein the p$^+$-type well is formed through surface diffusion. FIG. 17 is a graph illustrating the relation between the dose of the p$^+$-type well formed through surface-diffusion and the latch-up current (controllable current observed until the latch up phenomenon is caused) in the transistor state, observed when forming a p-type peripheral layer (channel portion) having a diffusion depth of 6 μm. In this relation, the diffusion depth $X_j$ of p$^+$-type well is used as a parameter and an asterisk appearing in the figure represents a value observed when a p$^+$-type well is not formed. As seen from this figure, the latch-up current increases along with an increase of the dose irrespective of the values of the diffusion depth $X_j$. The latch-up current $I_L$ observed when the p$^+$-type well is not formed is about 300 Acm$^{-2}$ and thus a sufficient resistance to latch up can be obtained at a dose of not less than 1×10$^{13}$ cm$^{-2}$. On the other hand, FIG. 18 is a graph illustrating the relation between the dose of the p$^+$-type well formed through the surface diffusion and the ON-state voltage drop in the transistor state, observed when a p-type peripheral layer (channel portion) having a diffusion depth of 611 m. When $X_j$ is 8 μm, the ON-state voltage drop increases along with an increase of the dose, but the rate of change thereof is negligibly small. Therefore, the upper limit of the dose may be determined on the basis of the productivity such as ion-implantation time and the practical upper limit thereof is desirably 5×10$^{15}$ cm$^{-2}$. Accordingly, the dose of p$^+$-type well is desirably not less than 1×10$^{13}$ cm$^{-2}$ and not more than 5×10$^{15}$ cm$^{-2}$.

Next a p$^+$-type well 4a formed as a buried layer will be closely examined. FIG. 19 is a graph illustrating the relation between the dose of the p$^+$-type well formed as a buried layer and the ON-state voltage drop in the thyristor state or the latch-up current (controllable current observed until the latch-up phenomenon takes place) in the transistor state, observed when p$^+$-type well 4a is formed as buried layer. As seen from this figure, the latch-up current $I_L$ increases along with an increase in the dose. When the dose is 1×10$^{12}$ cm$^{-2}$ the latch-up current $I_L$ is about 350 Acm$^{-2}$ which can provide sufficient resistance to latch up. The ON-state voltage drop $V_{ON}$ likewise increases as the dose is increased and the ON-state voltage drop $V_{ON}$ is about 1.5 V at a dose of 3×10$^{14}$ cm$^{-2}$. Thus, the dose required for forming p$^+$-type well 4a as a buried layer is desirably not less than 1×10$^{12}$ cm$^{-2}$ and not more than 3×10$^{14}$ cm$^{-2}$.

The optimum position of the diffusion window when p$^+$-type well 4a is formed as buried layer can be determined in the following manner. As shown in FIG. 20, a distance from the central point of second gate electrode 12 to the central point of first gate electrode 11 which is taken as the origin is assumed to be 25 μm and the edge position of the diffusion window is denoted by X. FIG. 21 is a graph illustrating the relationship between the edge position X of the diffusion window and the ON-state voltage drop in the thyristor state or the latch-up current (controllable current observed until the latch-up phenomenon takes place) in the transistor state. The nearer the edge position X of the diffusion window to gate electrode 11, the higher the latch-up current $I_L$ and correspondingly the higher the ON-state voltage drop $V_{ON}$. When the ON-state voltage drop $V_{ON}$ is assumed to be 1.5 V, X is equal to 16 μm and the edge position of the diffusion window is positioned near the inner edge of p$^+$-emitter layer 6a. Thus, it is necessary to position the edge of the diffusion window at a point near the inner edge of p$^+$-emitter layer 6a and on the side of gate electrode 12 in order to obtain a large controllable current while maintaining the ON-state voltage drop to a level of not more than 1.5 V.

Embodiment 3

FIG. 22 is a cross sectional view showing the structure of the semiconductor device according to Embodiment 3 of the present invention which is provided with a double gate comprising first and second gates. The structure and operation of the semiconductor device of this embodiment are approximately identical to those of the semiconductor device according to the second embodiment, and, therefore, parts common thereto are represented by the same reference numerals and the explanation thereof is herein omitted. A p-base layer 4 is formed on the surface of an n-base layer 3. Base layer 4 comprises a deep p$^+$-type well layer 4a formed by the diffusion method or formed as a buried layer and a p-type peripheral layer (channel portion) 4b which is shallower than p$^+$-type well layer 4a and formed around the center of the $^{p+}$-type well and n-emitter layers 5a and 5b and p$^+$-emitter layers 6a and 6b are formed on the inner surface of p-base layer 4 as observed in the second embodiment. Further a first gate electrode 11 constitutes first and third MOSFET's 13n and 13p and a second gate electrode 12 constitutes a second MOSFET 14. In this embodiment, n$^-$ emitter layers 5a and 5b each comprises a deep n$^+$-type well 5aa or 5ba and an n-type peripheral layer 5ab or 5bb which is shallower than the n$^+$-type well layer and formed around the center of the n$^+$-type well. The incorporation of an n-emitter layer having such a structure into the device can provide a high latch-up current and a low ON-state voltage drop as will be discussed below.

As in the first and second embodiments, n-emitter layers 5a and 5b form channel regions for second MOSFET 14 and third MOSFET 13p respectively and, therefore, it is necessary to lower the concentrations of n-emitter layers 5a and 5b to some extent in order to reduce the threshold voltage of MOSFET's and to simultaneously obtain a high latch up current, while it is necessary to increase the concentrations of n-emitter layer 5a and 5b to some extent in order to reduce the ON-state voltage drop during the thyristor operation. In the first embodiment, the concentrations of n-emitter layers 5a and 5b are set at optimum values in order to simultaneously satisfy these two requirements. According to this embodiment, however, these two requirements can always be satisfied by the use of deep $n^+$-type well layers 5aa and 5ba and shallow n-type peripheral layers 5ab and 5bb. More specifically, the presence of deep $n^+$-type well layers 5aa and 5ba permits the reduction of the ON-state voltage drop during the thyristor operation and the presence of shallow n-type peripheral layers 5ab and 5bb allows the lowering of the surface concentrations. Therefore, a high latch-up current can be obtained. Moreover, the presence of $n^+$-type well layers 5aa and 5ba is also effective for the achievement of a good ohmic contact with an emitter electrode 7.

FIG. 23 is a graph illustrating the relation between the surface concentration of the $n^+$-type well layer and the ON-state voltage drop in the thyristor state or the latch-up current (controllable current observed until the latch-up phenomenon is caused) in the transistor state, observed when an $n^+$-type well layer has a diffusion depth of 1.5 μm. As seen from this figure, the surface concentration of the $n^+$-type well layer must be not less than $5\times10^{17}$ cm$^{-3}$ in order to maintain a high latch-up current $I_L$ and to reduce the ON-state voltage drop $V_{ON}$ (not more than 1.5 V) It is difficult for the present semiconductor processing techniques to achieve a concentration of not less than $5\times10^{20}$ cm$^{-3}$ and such a high concentration is not needed. Therefore, the surface concentration of $n^+$-type well layer is desirably not less than $5\times10^{17}$ cm$^{-3}$ and not more than $5\times10^{20}$ cm$^{-3}$.

FIG. 24 is a graph illustrating the relation between the diffusion depth of the $n^+$-type well layer and the ON-state voltage drop in the thyristor state or the latch-up current (controllable current observed until the latch-up phenomenon is caused) in the transistor state, observed when the surface concentration of the $n^+$-type well layer is set at $1\times10^{17}$ cm$^{-3}$ and the diffusion depth of the n-type peripheral layer ms set at 0.6 μm. As seen from this figure, as the diffusion depth of the $n^+$-type well layer approaches that of the n-type peripheral layer (channel portion), the ON-state voltage drop $V_{ON}$ correspondingly increases. Moreover, if the diffusion depth of the $n^+$-type well layer is not less than 1.5 μm, latch up current $I_L$ approximately linearly decreases. The diffusion depth of the $n^+$-type well layer must be not less than the diffusion depth of the n-type peripheral layer (channel portion) and not more than 1.9 μm in order to obtain a latch-up current of at least about 300 Acm$^{-2}$.

Then, as shown in FIG. 25, the gate length $L_{g1}$ of first gate electrode 11, the gate length $L_{g2}$ Of second gate electrode 12 and the contact length $L_E$ Of emitter electrode 7 are determined. FIG. 26 is a graph illustrating the relation between the gate length $L_{g1}$ and the latch-up current in the transistor state or the ON-state voltage drop in the transistor state, observed when the gate length $L_{g2}$ is 4 μm. As seen from this figure, when $L_{g1}/2$ is 10 μm, the ON-state voltage drop $V_{ON}$ in the transistor state is about 7 V and, therefore, the ON-state voltage drop is too high when the gate length is less than that value and cannot be practically acceptable. On the other hand, if the gate length $L_{g1}$ is further increased, the ON-state voltage drop is reduced and the latch-up current is also reduced. $L_{g1}/2$ must be controlled to a level of not more than 15 μM to ensure a latch-up current $I_L$ Of about 300 Acm$_{-2}$. Thus, the gate length of first gate electrode 11 is desirably not less than 20 μM and not more than 30 μm. Incidentally, if the gate length is not more than 8 μm, the transistor cannot be in the On state.

FIG. 27 is a graph illustrating the relation between the gate length $L_{g2}$ and the latch-up current in the transistor state or the ON-state voltage drop in the thyristor state, observed when the gate length $L_{g1}$ is 15 μm. In this case, p-base layer 4b has a surface concentration of $3\times10^{17}$ cm$^{-3}$ and a diffusion depth of 8 μm and n-emitter layer 5ab has a surface concentration of $5\times10^{17}$ cm$^{-3}$ and a diffusion depth of 1 μm. Moreover, a counter-doping layer is formed as in the case of Embodiment 2. This figure clearly indicates that if Lg2/2 is not more than 4 μm, the latch-up current $I_L$ is not less than 300 Acm$^{-2}$. Moreover, if $L_{g2}$ is reduced, the ON-state voltage drop is likewise reduced and thus the lower limit of the gate length does not come into question. However, the fine processing on the order of submicron size is unfavorable in view of cost or the like and thus the lower limit is desirably 1 μm. Accordingly, the gate length $L_{g2}$ Of second gate electrode 12 is desirably not less than 1 μm and not more than 8 μm.

FIG. 28 is a graph illustrating the relationship between the contact length $L_E$ Of emitter electrode 7 and the latch-up current in the transistor state or the ON-state voltage drop in the thyristor state, wherein p-base layer 4b has a surface concentration of $2.7\times10^{16}$cm$^{-3}$ and a diffusion depth of 6 μm, n-emitter layer 5ab has a surface concentration of $1.0\times10^{17}$cm$^{-3}$ and a diffusion depth of 1.0 μm and $n^+$-type well layer 5a has a surface concentration of $1.0\times10^{19}$cm$^{-3}$ and a diffusion depth of 1.5 μm. This figure clearly indicates that the latch up current $I_L$ is reduced as the contact length $L_E$ increases. Since the latch up current $I_L$ is about 300 Acm$^{-2}$ when $L_E$ is 6 μm, the upper limit thereof is desirably 6 μm. The lower limit thereof is not critical, but the fine processing on the order of submicron size is unfavorable in view of cost or the like and thus the lower limit is desirably 1 μm. Accordingly, the contact length $L_E$ Of emitter electrode 7 is desirably not less than 1 μm and not more than 6 μm.

In this embodiment 2 and the foregoing embodiment 1, the devices have been explained on the basis of vertical devices in which the emitter electrode and the collector electrode are positioned on the surface and back face of the device respectively, but the device of the present invention may of course be horizontal type one in which these emitter and collector electrodes are positioned on the same face of the device. In addition, it is also possible to use a substrate of the conductive type opposite to that of the semiconductor substrate used in the foregoing embodiments. Furthermore, the structures of the base layers and the emitter layers are not restricted to those adopted in the foregoing embodiments and a variety of other structures may be adopted. The first and second MOSFET's may of course have a variety of structures other than those explained above.

As has been explained above in detail, the semiconductor device according to the present invention makes it possible to achieve a low ON-state voltage drop like an MCT during the ON state and to obtain a short switching time like an IGBT during the OFF state through the use of first and second MISFET's. Therefore, the trade off of the switching time and ON-state voltage drop can substantially be improved unlike the conventional power semiconductor devices such as MCT, IGBT and GTO. For instance, the device permits the achievement of a turn-off time of not more than 14 sec, a fall time of not more than 0.3μ sec and an ON-state voltage drop on the order of 1.0 V/300 A/cm$^2$. Therefore, the present invention makes it possible to substantially improve the quality of power devices used in devices and/or circuits through which medium and high electric currents can pass and which have medium and high withstand voltages. Moreover, the device of the present invention can operate at a frequency up to about 100 kHz and thus permits the substantial reduction of losses in high frequency applications. As has been discussed above, the reduction of losses in various kinds of devices and miniaturization thereof which have recently been required from the viewpoint of, in particular, electric power-saving, can be accomplished by making use of the device according to the present invention.

Embodiment 4

Figure 1:
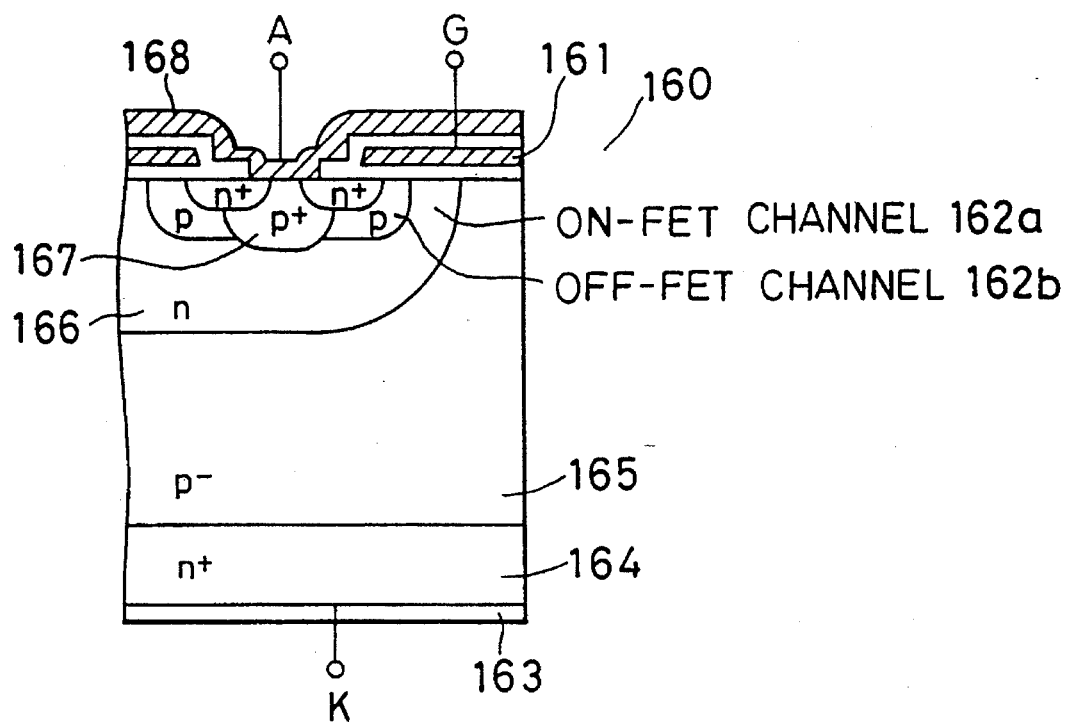
FIG. 1 is a cross sectional view showing an embodiment of the structure of MCT.
Figure 2:
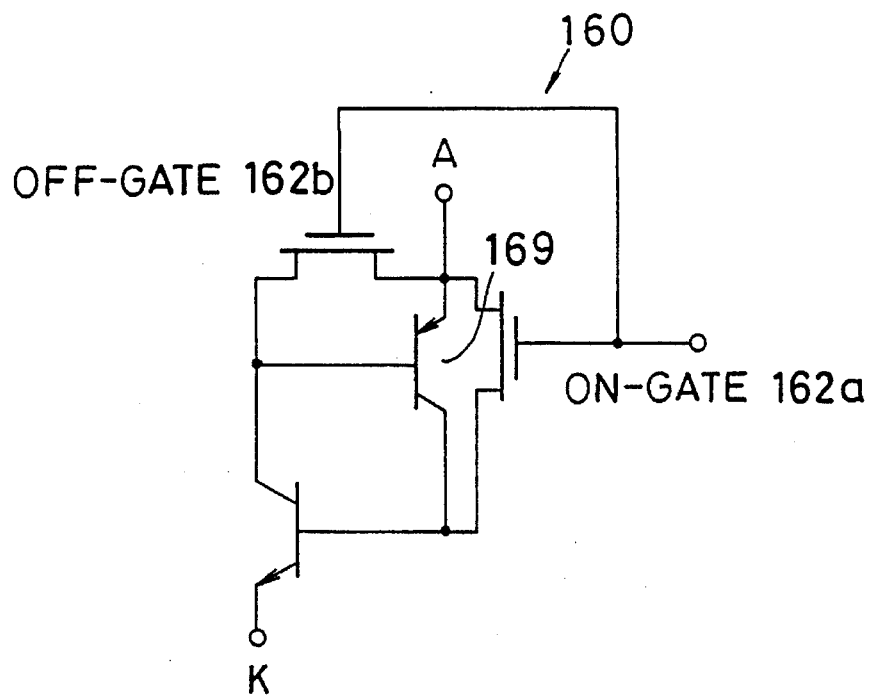
FIG. 2 is a circuit diagram showing the equivalent circuit of the MCT.
Figure 3:
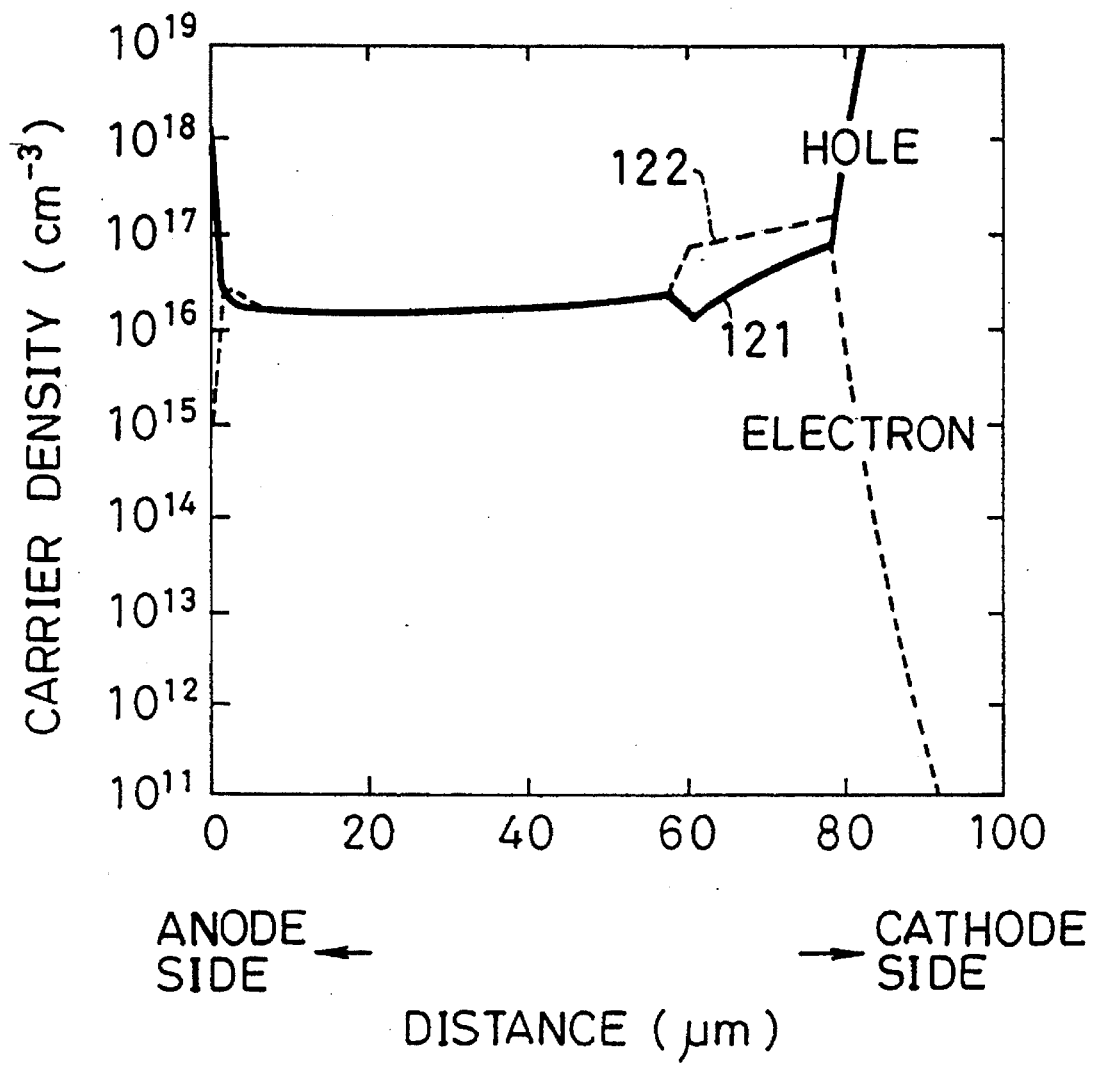

FIG. 29 shows the structure of a control device according to an embodiment 4 of the present invention. A control device 20 of the present embodiment is a control device for driving a double gate semiconductor device 115 having a first gate G1 and a second gate G2, the structure and function of the double gate semiconductor device are as described previously with reference to FIG. 3 and FIG. 4, and description thereof is omitted here. The device 20 comprises a first gate control circuit 21 for applying a control signal inputted to an input terminal P1 to the gate G1, and a second gate control circuit 22 for applying a control signal inputted to the same input terminal P1 to the gate G2. First, in the second gate control circuit 22, four inverters 23.1–23.4 are connected in series, and an input signal is inverted, shaped, and then applied to the gate G2 of the double gate semiconductor device 115. Therefore, an intermediate potential time where the gate potential is unstable is reduced, thereby preventing a mis-operation.

On the other hand, the first gate control circuit 21 comprises two paths, that is, an ON path 24 and an OFF delay path 25. The ON path 24 comprises an inverter 26 used in combination with the OFF delay path 25, an inverter 27 connected in series with the inverter 26, a NOR gate 28 inputted with a signal from the inverter 27 and a signal from a delay circuit 31 of the OFF delay path 25, and an inverter 29 used in combination with the OFF delay path 25. The OFF delay path 25 comprises the inverter 26, an inverter 30 connected in series with the inverter 26, the delay circuit 31 including a resistor 32 and a capacitor 33, the NOR gate 28, and the inverter 29. Therefore, when a high-level turn-on signal is inputted to the input terminal P1, the turn-on signal, after delaying by the inverters 26, 27, and 28, and the NOR gate 28, is applied to the gate G1. On the other hand, when a low-level turn-off signal is inputted, in addition to the above delay, the turn-off signal, after charging the delay circuit 31, is applied to the gate G1. Therefore, the first gate control circuit 21 is a control circuit in which only the turn-off signal is delayed by the time of the timer circuit 31 and applied to the gate G1. The inverters 26 and 30 also have a function for shaping the waveform of the input signal to suppress errors in delay time of the timer circuit 31.

FIG. 30 shows the operation for controlling the double gate semiconductor device 115 using the control circuit 20. First, when an input signal I varies from a low level to a high level at a time t1, the signal is applied to the gate G1 and the gate G2. Therefore, the double gate semiconductor device 115 becomes a thyristor condition where it is conductive under a low-on resistance, and an operating voltage Vce between an emitter E and a collector C decreases to Vce1. On the other hand, a passing current Ic passing through the emitter E and the collector C increases. Then, when the input signal I varies from a high level to a low level at a time t2, the gate G2 is applied with the low-level signal, as is, and the gate G1 is continuously applied with a high-level signal by the delay circuit 31 of the first gate control circuit 21. Therefore, the double gate semiconductor device 115 transfers from the thyristor condition to a transistor condition which is the same condition as IGBT. At this moment, the turn-on resistor increases due to the transition from the thyristor condition to the transistor condition, and the operating voltage vce increases from Vce1 to Vce2.

Then, since a low-level signal is applied to the gate G1 at a time t3 which is later by a delay time T than the time t2 due to the delay circuit 31, the double gate semiconductor device 115 is turned off. Therefore, the operating voltage Vce increases, and the passing current Ic decreases.

Thus, by providing the delay circuit 31 capable of delaying the signal for a predetermined time according to the present embodiment in the first gate control circuit 21, it is possible to control the double gate semiconductor device 115 by the single input signal I. Furthermore, by adjusting the delay time T, it is possible to apply a turn-off signal to the gate G1 after the completion of the transition from the thyristor condition to the transistor condition, thereby positively turning off the double gate semiconductor device.

Embodiment 5

FIG. 31 shows the structure of the control device according to an embodiment 5. The control device 20 in the present embodiment, as in the embodiment 1, is a control device for driving the double gate semiconductor device 115 having the first gate G1 and the second gate G2, similar components are indicated by similar symbols and description thereof is omitted. The control device 20 of the present embodiment, as in the embodiment 4, comprises the first gate control circuit 21 for applying a control signal inputted to the input terminal P1 to the gate G1, and the second gate control circuit 22 for applying a control signal inputted to the same input terminal P1 to the gate G2. A point to be noted in the control device 20 in the present embodiment is that in the first gate control circuit 21, a comparator circuit 41 is provided in place of the delay circuit.

First, in the second gate control circuit 22, as in the embodiment 4, four inverters 23.1–23.4 are connected in series, and an input signal is inverted, shaped, and then applied to the gate G2 of the double gate semiconductor device 115. Similarly, the first gate control circuit 21 comprises the ON path 24 and the OFF delay path 25. The ON path 24 comprises inverters 26 and 27, the NOR gate 28 inputted with a signal from the inverter 27 and a signal from the comparator circuit 41 of the OFF delay path 25, and an inverter 29 commonly used with the turn-off delay circuit 25.

On the other hand, the OFF delay path 25 of the present device is provided with the comparator circuit 41 applied with the operating voltage Vce appearing as a collector voltage of the double gate semiconductor device 115, and its output is inputted to the NOR gate 28. The comparator circuit 41 comprises a comparator 42 applied with the operating voltage Vce to an inverted input, and a reference power supply 43 for generating a reference voltage applied to a non-inverted input of the comparator 42. Therefore, referring to the timing chart shown in FIG. 30, a turn-off signal is applied to the gate G2 at the time t2, when the double gate semiconductor device 115 transfers to the transistor condition, and the operating voltage Vce increases to Vce2. Since a reference voltage V0 inputted to the comparator 42 is set to a value lower than Vce2, when the operating voltage Vce exceeds the reference voltage V0, the output of the comparator 42 is inverted. As a result, signals from the ON path 24 and the OFF path 25 coincide in the NOR gate 28, and a turn-off signal is supplied from the first gate control circuit 21 to the gate G1. This stops operation of the double gate semiconductor device 115.

As described above, in the control device of the present embodiment, after the transition from the thyristor condition to the transistor condition is confirmed using the comparator circuit 41, a turn-off signal is applied to the gate G1. Therefore, as in the embodiment 4, the double gate semiconductor device 115 can be controlled by a single input signal, and the double gate semiconductor device 115 can be positively turned off.

Embodiment 6

FIG. 32 shows the structure of the control device according to an embodiment 6. The control device 20 of the present embodiment, as in the embodiment 4, is a control device for driving the double gate semiconductor device 115 having the first gate G1 and the second gate G2, similar components are indicated by similar symbols and description thereof is omitted. The control device 20 of the present embodiment is provided with the first gate control circuit 21 of the same structure as in the embodiment 4 or embodiment 5. And, the control device 20 of the present embodiment is provided with the second gate control circuit 22 which is capable of delaying a turn-on signal to the gate G2.

That is, the second gate control circuit 22 of this device comprises a delay circuit 51 for delaying the input signal I inputted from the input terminal P1, a determination circuit 52 capable of detecting and determining the passing current Ic of the double gate semiconductor device 115, and a turn-off signal transmission circuit 53 capable of converting a turn-on signal applied to the gate G1 to a turn-off signal according to the determination result of the determination circuit 52. Furthermore, the determination result of the determination circuit 52 is reflected to the delay circuit 51 so that a turn-on signal from the delay circuit 51 is applied to the gate G2 according to the determination result of the determination circuit 52.

First, the delay circuit 51 for delaying the input signal I from the timing applied to the gate G1 comprises two inverters 23.1 and 23.2 connected in series, a delay circuit 45 for delaying signals from the inverters 23.1 and 23.2 for a predetermined time, and an AND gate 46 inputted with a signal from the delay circuit 45 and a signal from the determination circuit 52. Therefore, the turn-on signal inputted to the input terminal P1 is first applied to the gate G1 by the first gate control circuit 21, and delayed and applied to the gate G2. Therefore, by the control device 20 of the present embodiment, first the double gate semiconductor device 115 is started from the transistor condition.

The determination circuit 52 for inputting the determination result to the delay circuit 51 comprises a detection resistor 56 through which the passing current Ic of the double gate semiconductor device 115 passes, a comparator 54 supplied to its inverted input with a voltage drop in the detection resistor 56, and a reference power supply 55 for generating a reference voltage V1 supplied to a non-inverted input of the comparator 54. Therefore, when a turn-on signal is supplied to the gate G1 and the double gate semiconductor device 115 is in the transistor condition, the current Ic flows through the detection resistor 56, and a voltage drop proportional to the current Ic is compared with the reference voltage VI by the comparator 54. Therefore, when a high passing current Ic exceeding a predetermined value flows under the transistor condition, a signal from the comparator 54 is inverted, and it can be determined whether or not the double gate semiconductor device 115 is started under an overcurrent condition. When it is an overcurrent condition, the turn-on signal delayed by the delay circuit 45 can be canceled by inputting the output from the comparator 54 of the determination circuit 52 to the AND gate 46 of the delay circuit 51.

The output of the determination circuit 52 is connected to the output of the first gate control circuit 21 through the turn-off signal transmission circuit 53. The turn-off signal transmission circuit 53 comprises a diode 57 of which a current flow from the output side of the first gate control circuit 21 to the determination circuit 52 side is the forward direction. When an overcurrent is detected by the determination circuit 52 and the output of the comparator 54 is inverted, the turn-on signal applied from the first gate control circuit 21 to the gate G1 is inverted, and the turn-off signal is supplied to the gate G1.

Therefore, when an overcurrent condition is detected by the determination circuit 52, the turn-on signal to the gate G2 is canceled by the delay circuit 51, whereas, a turn-off signal is supplied to the gate G1. Therefore, the double gate semiconductor device 115 is turned off.

The operation of the control device 20 of the present embodiment will be described with reference to the timing charts shown in FIG. 33 and FIG. 34. FIG. 32 shows a normal start operation. First, when an input signal goes from a low level to a high level at a time t11, a high-level signal is supplied, as is, to the gate G1 by the first gate control circuit 21. On the other hand, a low-level signal is continued to be supplied to the gate G2 by the delay circuit 51 of the second gate control circuit 22. Therefore, the double gate semiconductor device 115 is not in the thyristor condition, but is conductive in the transistor condition. As a result, the conductive current Ic flows through the detection resistor 56, and a voltage drop in the detection resistor 56 is determined by the comparator 54. When the conductive current Ic is smaller than the normal Ic level, the output of the comparator 54 is not inverted, and at the time t2 after a predetermined time, a high-level turn-on signal is supplied from the delay circuit 51 to the gate G2. The double gate semiconductor device 115 transfers to the thyristor condition with a low-on resistance.

On the other hand, as shown in FIG. 34, when the device starts at a time 15 under the transistor condition, and when the conductive current Ic exceeds the normal Ic level, the output of the comparator 54 is inverted. Therefore, the turn-on signal is canceled in the second gate control circuit 22. Further, a turn-off signal is supplied by the turn-off signal transmission circuit 53 to the gate G1 at a time t16, and the double gate semiconductor device 115 is turned off. Thus, with the control device of the present embodiment, the double gate semiconductor device 115 is started in the transistor condition by the gate G1. Therefore, when an abnormality is detected by the determination circuit 52, the double gate semiconductor device 115 can be immediately turned off by supplying a turn-off signal to the gate G1. In the prior art control device, the double gate semiconductor device 115 is started in the thyristor condition, and even if an abnormality occurs, it is necessary to stop operation of the device after transition to the transistor condition, and the device may be unrestorably damaged during the transition. However, with the present control device, when an abnormality is detected, the device can be immediately stopped, thereby minimizing possible damages.

In the control device 20 shown in FIG. 32, the passing current Ic is determined using the detection resistor 56 connected to the emitter E side of the double gate semiconductor device 115. However, alternatively, it is of course possible to use a sense MOS 16 provided with a sense terminal E1 as shown in FIG. 35 to detect an overcurrent from a sense current Is flowing through the sense terminal E1. This is because the sensor current Is has a relation to the passing current Ic as Is=Ic/(sense ratio), and it is possible to determine the passing current Ic. Furthermore, since it is possible to suppress a detection current flowing through the detection resistor 56 to a low value, a power generated for the detection can be suppressed.

Furthermore, as shown in FIG. 36, since the operating voltage Vce increases when an abnormal Ic flows, an overcurrent condition can also be determined by supplying the operating voltage Vce to the inverted input of the comparator 54. Especially, in cases such as a low short-circuit, an arm short-circuit, and the like, Vce is almost the power supply rectification voltage, and it is sufficient to detect an overcurrent. Also with the present embodiment, a power required for the detection an be suppressed.

Embodiment 7

FIG. 37 shows the structure of the control device according to an embodiment 7. The control device 20 of the present embodiment as in the above embodiments, is a control device for driving the double gate semiconductor device 115 having the first gate G1 and the second gate G2, similar components are indicated by similar symbols and description thereof is omitted. The control device 20 of the present embodiment is provided with the first gate control circuit 21 having the delay circuit 31 capable of delaying only a turn-off signal as in the embodiment 4, and the second gate control circuit 22 having no delay circuit. Since the circuit arrangement of these components is the same as described in the embodiment 4, description thereof is omitted. A point to be noted in the present control device 20 is that an abnormality detection circuit 60 is provided in addition to the first gate control circuit 21 and the second gate control circuit 22. The abnormality detection circuit 60 comprises a determination circuit 61 capable of determining the passing current Ic of the double gate semiconductor device 115, and a turn-off signal output circuit 62 capable of supplying a turn-off signal to the first gate control circuit 21 and the second gate control circuit 22 according to the determination result of the determination circuit 61. Therefore, when an overcurrent flows during the operation of the double gate semiconductor device 115, the overcurrent is determined by the determination circuit 61, when it is determined to be a current value exceeding a specified value, a turn-off signal can be supplied from the turn-off signal output circuit 62 to the first and second gate control circuits 21 and 22 to turn off the double gate semiconductor device 115.

In such a determination circuit 61 of the abnormality detection circuit 60, as nearly the same as described in the embodiment 5, the passing current Ic is detected as a voltage drop by a detection resistor 64 connected to the emitter side of the double gate semiconductor device 115. The voltage drop value is supplied to the inverted input of the comparator 63, and a reference voltage V2 from a reference power supply 65 is supplied to the non-inverted input of the comparator 63. Furthermore, the turn-off signal output circuit 62 comprises a diode 66 of which a current flow from the input terminal P1 to the determination circuit 61 is the forward direction. Therefore, when the passing current Ic is over a reference value, and the voltage drop in the detection resistor 64 exceeds the reference voltage V2, the output of the comparator 63 is inverted, and a low-level turn-off signal is supplied to the first and second gate control circuits 21 and 22 through the diode 62. Therefore, the double gate semiconductor device 115 transfers from the thyristor condition to the transistor condition, and further to be turned off.

The operation of the present device will be described with reference to the timing chart shown in FIG. 38. First, the input signal I goes to a high level at a time t21, turn-on signals are individually supplied from the first and second gate control circuits 21 and 22 to the gate G1 and G2, and the double gate semiconductor device 115 is started in the thyristor condition. After that, when a load short-circuit, an arm short-circuit, or the like occurs at a time t22, and the passing current Ic exceeds a normal level, an overcurrent condition is determined by the determination circuit 61. As a result, a turn-off signal is outputted from the turn-off signal output circuit 62 at a time t23, and inputted to the first gate control circuit 21 and the second gate control circuit 22. Therefore, the turn-off signal is applied, as is, from the second gate control circuit 22 to the gate G2, and the double gate semiconductor device 115 transfers from the thyristor condition to the transistor condition at the time t23. And, the turn-off signal is supplied from the first gate control circuit 21 to the gate G1 at a time t24 after a predetermined delay time, and the double gate semiconductor device 115 is turned off.

As described above, the control device 20 of the present embodiment is provided with the abnormality detection circuit 60, and is thus possible to detect an abnormality such as an overcurrent even in the normal operation under the thyristor condition. When an abnormality is detected, a turn-off signal is automatically outputted, and the double gate semiconductor device 115 can be stopped from the thyristor condition via the transistor condition. In the prior art control device, when such a double gate semiconductor device 115 is controlled, when an abnormality is detected by an external device, it is necessary to supply first a signal to turn off the gate G2, and then a signal to turn off the gate G1. Therefore, there has been a problem in that the double gate semiconductor device 115 may be damaged during the time from the detection of the abnormality to the outputting the two signals. However, with the present device, an abnormal condition can be immediately detected by always determining the passing current, and a turn-off signal can be outputted within the control device. And, the double gate semiconductor device 115 can be positively turned off by the first gate control circuit 21 using the delay circuit, thereby preventing the occurrence of possible damages.

The control device of the present embodiment uses the same circuit as in the embodiment 4 as the first gate control circuit, alternatively, however, it is also possible to use a control circuit which is confirmed the transition to the transistor condition of the semiconductor device as in the embodiment 5, and then output a turn-off signal to the gate G1. Furthermore, as a determination circuit for detecting an overcurrent, the present embodiment uses a detection resistor disposed at the downstream of the emitter E, however, as described in the embodiment 6, it is of course possible to detect the sense current in a double gate semiconductor device provided with the sense terminal E1.

Furthermore, as described in the embodiment 6, an abnormal condition can be determined from the operating voltage Vce.

Embodiment 8

FIG. 39 shows the structure of the control device according to an embodiment 8 of the present invention. The control device 20 of the present embodiment, as in the above embodiment 6, is a control device for driving a double gate semiconductor device 16 with a sense MOS provided with the first gate G1, the second gate G2, and the sense terminal E1, nearly the same as the control device shown in FIG. 35. The control device 20 of the present embodiment is provided with the first gate control circuit 21 of the same structure as the embodiment 4 described with reference to FIG. 29. Furthermore, it has the second gate control circuit 22 capable of delaying a turn-on signal to the gate G2 as in the embodiment 6. Also similarly, the second gate control circuit 22 comprises the delay circuit 51 for delaying the input signal I inputted from the input terminal P1, the determination circuit 52 capable of detecting and determining the passing current Ic of the double gate semiconductor device 116, and the turn-off signal transmission circuit 53 for converting the turn-on signal applied to the gate G1 to the turn-off signal according to the determination result of the determination circuit 52. Therefore, similar components are indicated by similar symbols, and description thereof is omitted. A point to be noted in the present embodiment is that a turn-off signal from the turn-off signal transmission circuit 53 is not applied directly to the gate G1, but turns off an input signal from the first gate control circuit 21. Therefore, the operation of the double gate semiconductor device 116 with sense MOS can be assured even if a condition to transmit a turn-off signal is established momentarily due to a mis-operation or the like in the determination circuit 52. In the present embodiment, the AND gate 46 comprises two inverters 46b and 46c, and the NOR gate 46a, but the operation is the same as the above embodiments.

The operation of the control device 20 of the present embodiment will be described with reference to the timing charts shown in FIG. 38 to FIG. 42. The control device is provided with the delay circuit 31 in the first gate control circuit 21 to turn off the double gate semiconductor device 116 after the transition from the thyristor condition to the transistor condition. A delay time (off-delay time) Td1 of the delay circuit 31 depends upon the product of a resistor 32 and a capacitor 33 forming the delay circuit 31, that is, upon a time constant R1-C1. On the other hand, the second gate control circuit 22 is provided with the delay circuit 45 so that the device can transfer to the thyristor operation after the operation is confirmed in the transistor operation at turning on. A delay time (on-delay time) Td2 of the delay circuit 45 depends upon the product of a resistor 47 and a capacitor 48 forming the delay circuit 45, that is, upon a time constant R2-C2. Since, not only the turn-off signal but also the turn-on signal is applied to the double gate semiconductor device 116 past the second gate control circuit 22, the on-delay time Td2 is also the off-delay time of the second gate control circuit 22. Therefore, to turn off the double gate semiconductor device 116 after positive transition from the thyristor operation to the transistor operation using the first gate control circuit 21, it is necessary to satisfy R1·C1>R2·C2. For this purpose, the delay circuits 31 and 45 of the control device 20 are designed so that the values of the resistors 32 and 47 and the capacitors 33 and 48 satisfy this relation.

FIG. 40 shows signals applied to the gate GI and the gate G2 in the normal ON/OFF operation. When a turn-on signal is inputted at a time t30, after an operation delay time of the ON path 24 of the first gate control circuit 21, the signal at the gate G1 goes to a high level, and the double gate semiconductor device 116 goes to the transistor condition. And, at a time t31 after a turn-on delay time Ta of the second gate control circuit 22, the device transfers to the thyristor operation. On the other hand, when a turn-off signal is inputted at a time t32, the device transfers to the transistor operation at a time t33 after a turn-off delay time Tb of the second gate control circuit 22, and the double gate semiconductor device 16 is turned off at a time t34 after a turn-off delay time Tc of the first gate control circuit 21 from the time t32. The above-described turn-on or turn-off delay time Td2 is the times Ta and Tb, and the turn-off delay time Td1 is the time Tc. Therefore, since the time Tc is longer than the time Tb if the relation R1·C1> R2·C2 is satisfied, after necessary transition to the transistor operation, the gate G1 is turned off, and the double gate semiconductor device 116 can be turned off.

FIG. 41 shows the operation when an abnormality is detected during the transistor operation at turning on. When a turn-on signal is inputted at the time t30, after an operation delay time as in FIG. 40, a high-level signal is applied to the gate GI, and the double gate semiconductor device is turned on in the transistor condition. When an abnormality is detected at a time t35 before the turn-on signal is applied to the gate G2, the device is turned off at a time t36 after the turn-off delay time Tc. FIG. 42 shows a case where an abnormality is detected during the thyristor operation of the double gate semiconductor device 116. The turn-on signal is inputted at the time t30, the gate G1 and the gate G2 go to a high level, when an abnormality is detected at a time t37 after the transition to the thyristor condition, the gate G2 goes to a low level after an operation delay of the determination circuit 52 including an abnormality detection comparator and the like, and the device goes to the transistor condition. And, also the gate G1 goes to a low level at a time t38 after the turn-off delay time Tc from the time t37, and the double gate semiconductor device 116 is turned off.

As described above, since the control device of the present embodiment goes off necessarily after the transition to the transistor condition even in an abnormal operation, it is possible to positively turn off the double gate semiconductor device. Furthermore, since the turning off is achieved under the condition where the gate G1 is at a high level and the gate G2 is at a low level, there is no danger of the generation of latching up.

Embodiment 9

FIG. 43 shows the structure of the control device according to an embodiment 9 of the present invention. The control device 20 of the present embodiment, as in the embodiment 5, is a control device for driving the double gate semiconductor device 116 with a sense MOS provided with the first gate G1, the second gate G2, and the sense terminal E1, and is provided with the first gate control circuit 21 and the second gate control circuit 22. Therefore, similar components are indicated by similar symbols, and description thereof is omitted. A point to be noted in the present embodiment is that in the first gate control circuit 21, a delay circuit 31a is used as a circuit for setting the turn-off delay time, and the delay circuit 31a comprises two resistors 32a and 32b connected in series, and the capacitor 33. Also, the second gate control circuit 22 is provided with a turn-off signal transmission circuit 53a as a turn-off signal transmission circuit for abnormal condition use for supplying a turn-off signal to the delay circuit 31a, in addition to the turn-off signal transmission circuit 53 for supplying a turn-off signal to the input of the first gate control circuit 21. The turn-off signal transmission circuit 53a for abnormality use, as the turn-off signal transmission circuit 53, comprises a diode 57a, and the anode side of the diode 57a is connected to the upstream of the resistor 32b forming the delay circuit 31a, that is, the connection point of the resistors 32a and 32b.

Furthermore, a rectification circuit 67 for connecting the gate G1 and the gate G2 of the double gate semiconductor device 16 is used, and the rectification circuit 67 also comprises a diode 68 with the anode side being the gate G2 side.

The control device 20 of the present embodiment is a control device intended to reduce the turn-off delay time Tc of the control device shown in the embodiment 8. Specifically, in the control device of the embodiment 5 described with reference to FIG. 39, the turn-off delay time Tc for applying a low-level signal to the gate G1 is set to a sufficiently large value compared to the time Tb or Td2 for applying a low-level signal to the gate G1, whereby the transition from the thyristor condition to the transistor condition is positively achieved, and then the double gate semiconductor device is turned off. Therefore, it is a device that can assure the positive ON/OFF driving. On the other hand, even when an abnormality is detected, the device can be turned off only after the turn-off delay time Tc, which may be long for the double gate semiconductor device to be driven.

In this case, if the cause of the abnormality is an overcurrent generated due to an arm short-circuit during bridging operation, the double gate semiconductor device 116 evolves heat during the turn-off delay time Tc and increases in temperature, which may exceed the heat resistance limit leading to a breakdown.

Thus, in the control device 20 of the present embodiment, to allow a reduction in the turn-off delay time in an abnormal condition, the delay circuit 31a capable of varying the time constant which determines the delay time is used. In the delay circuit 31a of the present device, the time constant in a normal condition, that is, the time constant when a turn-off signal is inputted from the input terminal P1 is (R11+R12)·C1. Therefore, the delay time Tc is determined by (R11+R12)·C1.

On the other hand, in an abnormal condition where an overcurrent flows, the abnormality is detected in the determination circuit 52, and the output of the comparator 54 goes to a low potential. And, a low-potential turn-off signal is supplied by the turn-off signal transmission circuits 53 and 53a to the input of the first gate control circuit 21 and the upstream of the resistor 32b of the delay circuit 31a. Therefore, in the delay circuit 31a, the capacitor 33 is discharged only through the resistor 32b. Therefore, after a delay time Tc1 determined by the time constant R12·C1, a turn-off signal is supplied to the NOR gate 28. Thus, in the present control device, the delay time in an abnormal condition can be reduced to R12/(R11+R12), and temperature increase in the abnormal condition is suppressed to prevent the double gate semiconductor device 16 from breakdown. In the normal condition, a delay time Tc is applied which has a sufficient allowance for the transition from the thyristor operation to the transistor operation.

Furthermore, in the control device 20 of the present embodiment, the rectification circuit 67 to connect the gate G1 and the gate G2 is provided. As described in FIG. 40 to FIG. 42, it is necessary that the gate G1 goes to a high potential prior to the gate G2, and the gate G2 goes to a low potential prior to the gate G1. On the contrary, if the gate G2 goes to a higher potential than the gate G1, the double gate semiconductor device 116 will be in a latch-up condition to become uncontrollable. Therefore, the mode where the gate G2 is at a high potential and the gate G1 is at a low potential is an inhibited mode. However, it is considered that the gate G2 may go to a high potential by chance due to generation of a spark voltage or the like. Furthermore, until the double gate semiconductor device 116 is combined with the control device, or if any one of the gate G1 and the gate G2 is in an open condition even after being combined, such an inhibited mode may be achieved due to static charges or the like. Therefore, it is desirable that the inhibited mode will never be generated, and the control device of the present embodiment uses the rectification circuit 60 to prevent generation of the inhibited mode.

The rectification circuit 67 used in the control device 20 of the present embodiment comprises a diode 68. Even when a condition occurs where the potential of the gate G2 is higher than the potential of the gate G1 due to an external disturbance, clamping is established by a forward voltage of the diode 68, and generation of the above inhibited mode is prevented. Since the latch-up condition is not generated unless the potential of the gate G2 is to the extent, for example at least 3 V, that the gate can sufficiently operate as a gate, it is sufficient to use the diode 68 having a forward voltage falling in this range. As the rectification circuit 67, it is possible to use an element of a totem pole type, or an open collector type by a pull-up resistor. Although being not shown, when the gate G1 or the gate G2 is connected through a gate resistor to prevent oscillation, the rectification circuit 67 may be disposed at the upstream of the gate resistor or, of course, at the downstream.

FIG. 44 shows an example in which the diode 68 is formed at the double gate semiconductor device side. The double gate semiconductor device shown in FIG. 20 is a double gate MOS power device 70, and polysilicon-based gate electrodes G1 and G2 are formed on a surface 71 of the device. All components are shown except the emitter electrode. The gate electrode G1 is adjusted to an $n^+$ type by introducing a dopant such as phosphorus, and the gate electrode G2 is adjusted to a $p^+$ type by introducing a dopant such as boron. A polysilicon layer 72 is formed on an area between the gate electrodes G1 and G2 except for an area of the emitter electrode (not shown), and a pn junction 73 is formed by introducing a dopant. Therefore, the diode 68 can be formed by the polysilicon layer 72, and it is possible to provide the rectification circuit 67. The individual gate electrodes and the emitter electrode (not shown) are insulated by silicon oxide films. It is of course possible to form a pn junction by directly connecting the high-concentration polysilicon layers forming the gate electrodes G1 and G2, but since the diode formed tends to have a low dielectric resistance and to be difficult to maintain reliability, in the present control device, a pn junction is separately formed using the polysilicon layer 72.

FIG. 45 shows an example in which a diode is formed on the surface 71 of the double gate MOS power device 70 as in FIG. 20. In the double gate MOS power device 70 shown in FIG. 21, both the gate electrodes G1 and G2 are formed of the $n^+$ type, and it is superior to the double gate MOS power device shown in FIG. 44 in view of a reduction of the polysilicon resistance. However, it cannot be connected directly to the diode 61 formed between the gate electrodes G1 and G2 also using the polysilicon layer 72. Then, in the double gate MOS power device, a window is formed in an insulating layer (not shown) on the polysilicon layer, and the $n^+$ type gate electrode G2 and a $p^-$ type portion of the diode 68 are connected with an aluminum deposition wiring 74.

As shown above, the control device 20 of the present embodiment reduces the turn-off delay time in an abnormal condition to prevent the double gate semiconductor device from being damaged, generation of an inhibited mode is suppressed in all cases by introducing the rectification circuit, thereby achieving the safe and positive driving of the double gate semiconductor device.

The present embodiment is described for an example where a resistor for determining the time constant of the delay circuit 31*a* is divided. Alternatively, however, as shown in FIG. 46, it is also possible to divide the capacitance and vary the time constant by using two capacitors 33*a* and 33*b* connected in series.

The embodiments 8 and 9 are described for the double gate semiconductor device having a sense MOS, however, it is of course possible to determine a main current flowing between the collector - emitter of the double gate semiconductor device.

As described above, in the control device for the double gate semiconductor device according to the present invention, first a turn-off signal to the double gate semiconductor device is delayed by the first gate control means capable of delaying a turn-off signal and applied to the first gate electrode, thereby stopping and controlling the double gate semiconductor device by a single control signal. Furthermore, using the second gate control means capable of delaying a turn-on signal, it is possible to immediately turn off the double gate semiconductor device even when an abnormality occurs at turning on, thereby preventing generation of unrestorable damages. Furthermore, when the passing current of the double gate semiconductor device is monitored by the passing current determination means and a turn-off signal is outputted according to the value of the passing current, the double gate semiconductor device can be protected earlier than other protective circuits.

Thus, the control device according to the present invention makes it possible to incorporate the advantageous double gate semiconductor device that can be turned on with a low turn-on resistance as with MCT and turned off in a short time as with IGBT in power converter apparatus and the like as prior art IGBT. And, it is a control device that can prevent the double gate semiconductor device from being damaged. Therefore, with the present control device, it is possible to widely apply double gate semiconductor devices which are power devices with reduced switching loss also in high-frequency applications.

By forming the timer delay means of the first gate control means using the first and second time constant determination units, it is possible to vary the turn-off delay time in abnormal and normal operation conditions. Therefore, in the abnormal operation condition, the turn-off delay time can be reduced to prevent the double gate semiconductor device from exceeding the heat resistance limit and leading to breakdown, thereby achieving a reliable control device.

Furthermore, by providing the rectification means, the generation of an inhibited mode where the potential of the second gate electrode is higher than the first gate electrode can be prevented in all cases, thereby preventing an uncontrollable malfunction and improving the reliability. In particular, using the polysilicon-based diode, rectification means can be provided in the double gate semiconductor device itself. This prevents the generation of dangers such as latch-up due to unforeseeable causes such as static charges even when the double gate semiconductor device is handled alone, and the control device can be formed compact.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A semiconductor device having a thyristor structure which comprises a first conductive type collector region, a second conductive type base region, a first conductive type base region, a second conductive type emitter region, the first conductive type regions having a first type of majority carriers and the second conductive type regions having a second type of majority carriers, the device comprising:

a first MISFET which can inject the second type of majority carriers into said second conductive type base region;

a second MISFET which can be turned-on or turned-off independent of said first MISFET and capable of extracting the first type of majority carriers from said first conductive type base region;

a third MISFET having a first gate electrode which is also a gate electrode of said first MISFET and capable of extracting the first type of majority carriers from said first conductive type base region;

wherein a first conductive type emitter region and the second conductive type emitter region are formed within said first conductive type base region so that an emitter voltage can simultaneously be applied to said first and second conductive type emitter regions;

wherein said first conductive type emitter region is formed within said second conductive type emitter region;

wherein a second gate electrode of said second MISFET is formed on a surface of said first conductive type emitter region, said second conductive type emitter region and said first conductive type base region through a first gate insulating film;

wherein said first gate electrode of said first and third MISFET is formed on a surface of said first conductive type emitter region, said second conductive type emitter region, said first conductive type base region and said second conductive type base region through a second gate insulating film; and wherein said first conductive type base region is doped at a dose of not less than $2 \times 10^{13}$ cm$^{-2}$ and not more than $1 \times 10^{14}$ cm$^{-2}$ and said second conductive type emitter region is doped at a dose of equal to or more than that for said first conductive type base region and not more than $1 \times 10^{14}$ cm$^{-2}$.

2. A semiconductor device having a thyristor structure which comprises a first conductive type collector region, a second conductive type base region, a first conductive type base region, a second conductive type emitter region, the first conductive type regions having a first type of majority carriers and the second conductive type regions having a second type of majority carriers, the device comprising:

a first MISFET which can inject the second type of majority carriers into said second conductive type base region;

a second MISFET which can be turned-on or turned-off independent of said first MISFET and capable of extracting the first type of majority carriers from said first conductive type base region;

a third MISFET having a first gate electrode which is also a gate electrode of said first MISFET and capable of extracting the first type of majority carriers from said first conductive type base region;

wherein a first conductive type emitter region and the second conductive type emitter region are formed within said first conductive type base region so that an emitter voltage can simultaneously be applied to said first and second conductive type emitter regions;

wherein said first conductive type emitter region is formed within said second conductive type emitter region;

wherein a second gate electrode of said second MISFET is formed on a surface of said first conductive type emitter region, said second conductive type emitter region and said first conductive type base region through a first gate insulating film;

wherein said first gate electrode common to said first and third MISFET is formed on a surface of said first conductive type emitter region, said second conductive type emitter region, said first conductive type base region and said second conductive type base region through a second gate insulating film; and wherein said first conductive type base region comprises a first conductive type well having a relatively high dose of impurity of the first conductive type and a first conductive type peripheral portion shallower than said first conductive type well.

3. The semiconductor device as claimed in claim 2, wherein said first conductive type well of high dose of impurity of the first conductive type formed by surface-diffusion has a dose of not less than $1\times10^{13}\text{cm}^{-2}$ and not more than $5\times10^{15}\text{cm}^{-2}$.

4. The semiconductor device as claimed in claim 2, wherein said first conductive type well of high dose of impurity of the first conductive type formed as a buried layer has a dose of not less than $1\times10^{12}\text{cm}^{-2}$ and not more than $3\times10^{14}\text{cm}^{-2}$.

5. The semiconductor device as claimed in claim 4, wherein an edge of a diffusion window of said first conductive type well of a high dose of impurity of the first conductive type is positioned within a region near said inner edge of said first conductive type emitter region and on said side of said second electrode of said second MISFET.

6. A semiconductor device having a thyristor structure which comprises a first conductive type collector region, a second conductive type base region, a first conductive type base region, a second conductive type emitter region, the first conductive type regions having a first type of majority carriers and the second conductive type regions having a second type of majority carriers, the device comprising:

a first MISFET which can inject the second type of majority carriers into said second conductive type base region;

a second MISFET which can be turned-on or turned-off independent of said first MISFET and capable of extracting the first type of majority carriers from said first conductive type base region;

a third MISFET having a first gate electrode which is also a gate electrode of said first MISFET and capable of extracting the first type of majority carriers from said first conductive type base region;

wherein a first conductive type emitter region and the second conductive type emitter region are formed within said first conductive type base region so that an emitter voltage can simultaneously be applied to said first and second conductive type emitter regions;

wherein said first conductive type emitter region is formed within said second conductive type emitter region;

wherein a second gate electrode of said second MISFET is formed on a surface of said first conductive type emitter region, said second conductive type emitter region and said first conductive type base region through a first gate insulating film;

wherein said first gate electrode common to said first and third MISFET is formed on a surface of said first conductive type emitter region, said second conductive type emitter region, said first conductive type base region and said second conductive type base region through a second gate insulating film; and wherein said second conductive type emitter region comprises a second conductive type well having a relatively high dose of impurity of the second conductive type and a second conductive type peripheral portion shallower than said second conductive type well.

7. The semiconductor device as claimed in claim 6, wherein a surface concentration of said second conductive type well having a high dose of impurity of the second conductive type is not less than $5\times10^{17}\text{cm}^{-3}$ and not more than $5\times10^{20}\text{cm}^{-3}$.

8. The semiconductor device as claimed in claim 6, wherein a diffusion depth of said second conductive type well of high dose of impurity of the second conductive type is not less than a diffusion depth of said second conductive type peripheral portion and not more than 1.9 μm.

9. The semiconductor device as claimed in claim 6, wherein a gate length of said first gate electrode is not less than 20 μm and not more than 30 μm.

10. The semiconductor device as claimed in claim 6, wherein a gate length of said second gate electrode is not less than 1 μm and not more than 8 μm.

11. The semiconductor device as claimed in claim 6, wherein a contact length of an emitter electrode which is conductively in contact with said first conductive type emitter region and said second conductive type emitter region, is not less than 1 μm and not more than 6 μm.

12. A semiconductor device having a thyristor structure which comprises a first conductive type collector region, a second conductive type base region, a first conductive type base region, a second conductive type emitter region, the first conductive type regions having a first type of majority carriers and the second conductive type regions having a second type of majority carriers, the device comprising:

a first MISFET which can inject the second type of majority carriers into said second conductive type base region;

a second MISFET which can be turned-on or turned-off independent of said first MISFET and capable of extracting the first type of majority carriers from said first conductive type base region;

a third MISFET having a first gate electrode which is also a gate electrode of said first MISFET and capable of extracting the first type of majority carriers from said first conductive type base region;

wherein a first conductive type emitter region and the second conductive type emitter region are formed within said first conductive type base region so that an emitter voltage can simultaneously be applied to said first and second conductive type emitter regions;

wherein said first conductive type emitter region is formed within said second conductive type emitter region;

wherein a second gate electrode of said second MISFET is formed on a surface of said first conductive type emitter region, said second conductive type emitter region and said first conductive type base region through a first gate insulating film;

wherein said first gate electrode common to said first and third MISFET is formed on a surface of said first conductive type emitter region, said second conductive type emitter region, said first conductive type base region and said second conductive type base region through a second gate insulating film; and wherein a shallow second conductive type counter doping region having an impurity concentration higher than that of the second conductive type base region is formed on a surface of said first conductive type base region of said first MISFET.

13. A semiconductor device having a thyristor structure which comprises a first conductive type collector region, a second conductive type base region, a first conductive type base region, a second conductive type emitter region, the first conductive type regions having a first type of majority carriers and the second conductive type regions having a second type of majority carriers, the device comprising:

a first MISFET which can inject the second type of majority carriers into said second conductive type base region;

a second MISFET which can be turned-on or turned-off independent of said first MISFET and capable of extracting the first type of majority carriers from said first conductive type base region;

a third MISFET having a first gate electrode which is also a gate electrode of said first MISFET and capable of extracting the first type of majority carriers from said first conductive type base region;

wherein a first conductive type emitter region and the second conductive type emitter region are formed within said first conductive type base region so that an emitter voltage can simultaneously be applied to said first and second conductive type emitter regions;

wherein said first conductive type emitter region is formed within said second conductive type emitter region;

wherein a second gate electrode of said second MISFET is formed on a surface of said first conductive type emitter region, said second conductive type emitter region and said first conductive type base region through a first gate insulating film;

wherein said first gate electrode common to said first and third MISFET is formed on a surface of said first conductive type emitter region, said second conductive type emitter region, said first conductive type base region and said second conductive type base region through a second gate insulating film; and wherein a first conductive type doping region of a relatively high dose of impurity of the first conductive type having an impurity concentration higher than that of the first conductive type base region is formed on a surface of said first conductive type base region of said device between said first conductive type base region and said second gate electrode of said second MISFET.

* * * * *

UNITED STATES PATENT AND TRADEMARK OFFICE
CERTIFICATE OF CORRECTION

PATENT NO. : 5,459,339
DATED : October 17, 1995
INVENTOR(S) : Ken'ya SAKURAI et al.

It is certified that error appears in the above-indentified patent and that said Letters Patent is hereby corrected as shown below:

> Title page, item [54] and Col. 1,
> Please change the title name to:
> "SEMICONDUCTOR POWER DEVICE"

Signed and Sealed this

Seventh Day of May, 1996

Attest:

BRUCE LEHMAN

Attesting Officer

Commissioner of Patents and Trademarks